(12) United States Patent
Umezaki

(10) Patent No.: US 8,405,650 B2
(45) Date of Patent: Mar. 26, 2013

(54) LIGHT EMITTING DEVICE AND METHOD FOR DRIVING THEREOF

(75) Inventor: Atsushi Umezaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/165,208

(22) Filed: Jun. 21, 2011

(65) Prior Publication Data

US 2011/0310084 A1    Dec. 22, 2011

Related U.S. Application Data

(63) Continuation of application No. 11/911,999, filed as application No. PCT/JP2006/309061 on Apr. 21, 2006, now Pat. No. 7,965,283.

(30) Foreign Application Priority Data

Apr. 26, 2005 (JP) ................................. 2005-127390

(51) Int. Cl.
*G06F 3/038* (2006.01)

(52) U.S. Cl. ............ 345/213; 345/55; 345/82; 345/204; 345/211

(58) Field of Classification Search ............ 345/55–100, 345/204–205, 211–213
See application file for complete search history.

(56) References Cited

U.S. PATENT DOCUMENTS

| | | | |
|---|---|---|---|
| 5,883,609 A | 3/1999 | Asada et al. | |
| 6,856,308 B2 | 2/2005 | Akimoto et al. | |
| 7,031,422 B2 * | 4/2006 | Kawasaki et al. | ............... 377/68 |
| 7,038,651 B2 | 5/2006 | Nitta et al. | |
| 7,239,297 B2 | 7/2007 | Tajima et al. | |
| 7,675,488 B2 * | 3/2010 | Chen | ............................... 345/76 |
| 7,808,495 B2 | 10/2010 | Tsutsui | |
| 2001/0052887 A1 | 12/2001 | Tsutsui et al. | |
| 2002/0000970 A1 | 1/2002 | Akimoto et al. | |
| 2002/0036610 A1 | 3/2002 | Ito et al. | |
| 2002/0047827 A1 * | 4/2002 | Koyama et al. | ............... 345/100 |
| 2002/0075249 A1 * | 6/2002 | Kubota et al. | ................. 345/204 |

(Continued)

FOREIGN PATENT DOCUMENTS

| | | |
|---|---|---|
| JP | 6-186925 | 7/1994 |
| JP | 8-122748 | 5/1996 |

(Continued)

OTHER PUBLICATIONS

International Search Report re application No. PCT/JP2006/309061, dated Jun. 6, 2006.

(Continued)

*Primary Examiner* — Christopher E Leiby
(74) *Attorney, Agent, or Firm* — Husch Blackwell LLP

(57) ABSTRACT

An object of the present invention is to provide a display device consuming lower amounts of power. The display device determines whether or not video signals corresponding to all of pixels in one row of a plurality of pixels are equal to one another. In a case where the video signals corresponding to at least two pixels among the video signals corresponding to all of the pixels in one row of the plurality of pixels, are different from each other, video signals input to an image signal input line are sequentially output to a plurality of source signal lines in synchronization with a sampling pulse output from a shift register. On the other hand, when the video signals corresponding to all of the pixels in one row of the plurality of pixels are equal to one another, input of a start pulse to the source driver is stopped, and the video signals input to the image signal input line are simultaneously output to the plurality of source signal line.

24 Claims, 41 Drawing Sheets

U.S. PATENT DOCUMENTS

| | | |
|---|---|---|
| 2003/0090449 A1 | 5/2003 | Arimoto et al. |
| 2003/0174153 A1 | 9/2003 | Koyama |
| 2005/0225526 A1 | 10/2005 | Chiu et al. |

FOREIGN PATENT DOCUMENTS

| | | |
|---|---|---|
| JP | 8-248388 | 9/1996 |
| JP | 2002-169499 | 6/2002 |
| JP | 2003-44017 | 2/2003 |
| JP | 2003-162263 | 6/2003 |

OTHER PUBLICATIONS

Written Opinion re application No. PCT/JP2006/309061, dated Jun. 6, 2006.

\* cited by examiner

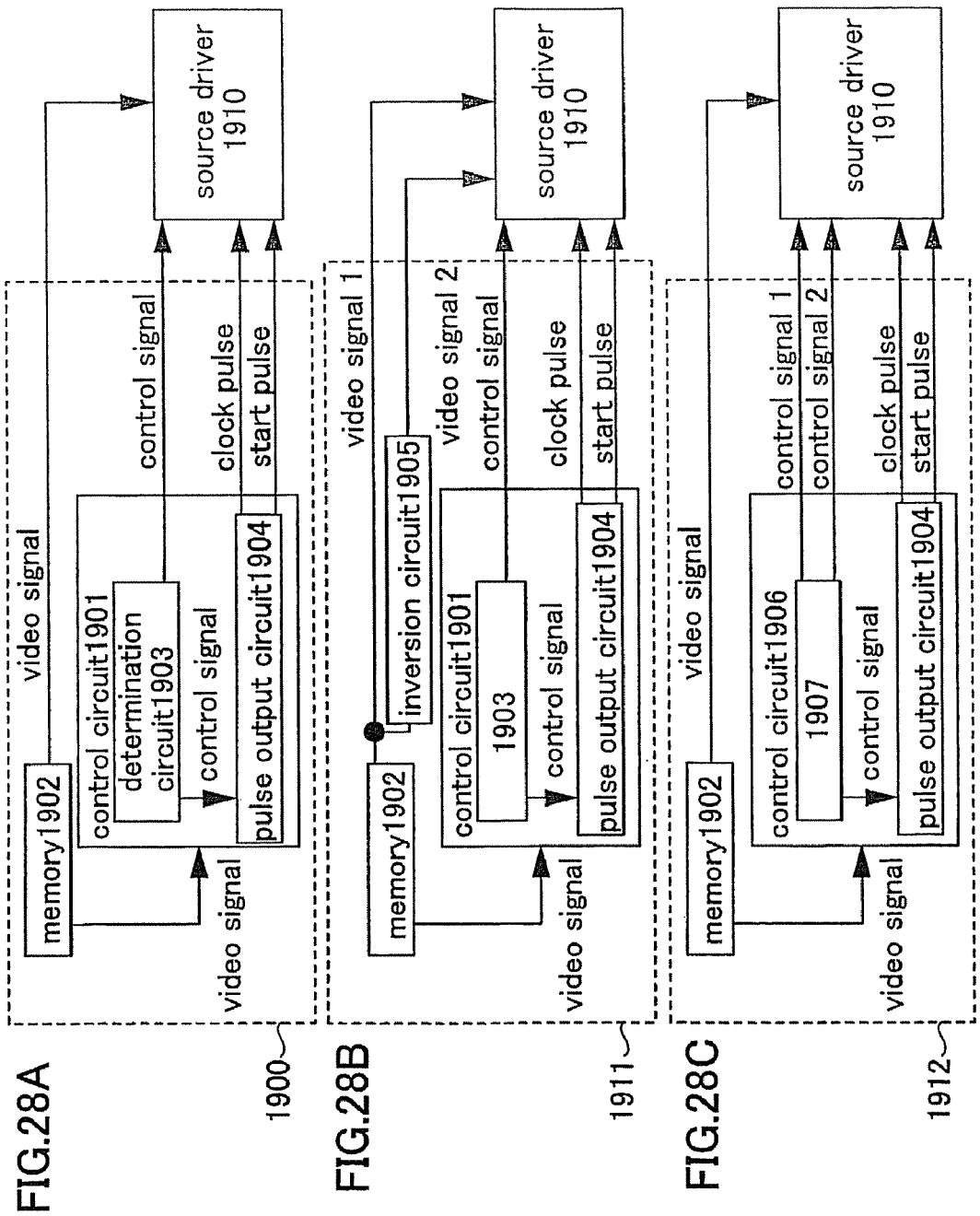

LIGHT EMITTING DEVICE AND METHOD FOR DRIVING THEREOF

This application is a continuation of U.S. application Ser. No. 11/911,999 filed Oct. 19, 2007 now U. S. Pat. No. 7,965,283 which is the US national stage of PCT/JP2006/309061 filed Apr. 21, 2006.

TECHNICAL FIELD

The present invention relates to a display device including a plurality of pixels, which are arranged in a matrix form, and displaying an image by inputting video signals (also, referred to as image signals or picture signals) in each of the plurality of pixels, and a method for driving the display device. In particular, the present invention relates to a display device having a driver (hereinafter, referred to as a source driver), which samples input video signals by using a signal output from a shift register and outputs the signals to a plurality of source signal lines corresponding to pixels in each column, and a method for driving the display device.

BACKGROUND ART

An attempt of reducing power consumption of a source driver and a display device has been attempted. For example, a display device in which when video signals input to each of a plurality of pixels are not changed during a Plurality of frame periods, i.e., when a still picture is displayed, power consumption is reduced by stopping operation of a shift register included in a source driver; and a method for driving thereof have been proposed (see patent document 1).

As the other example, a display device, in which power consumption is reduced by stopping operation of a shift register included in a source driver in a case where a video signal input during a period of selecting one certain row of a plurality of pixels is equal to a video signal input during a period of selecting a previous row, and a method for driving the display device have been proposed (see patent document 2).

[Patent Document 1]: Japanese Patent Application Laid-Open No. 2002-169499
[Patent Document 2]: Japanese patent Application Laid-Open No. 2003-44017

In a conventional source driver, even when video signals input to all pixels in one row of a plurality of pixels are equal to one another, the video signals corresponding to all of the pixels in one row have been sampled.

DISCLOSURE OF INVENTION

It is an object of the present invention to provide a display device whose power consumption can be further reduced in a case where video signals input to all of pixels in one row of a plurality of pixels are equal to one another, and a method for driving the display device.

In a display device including a plurality of pixels arranged in a matrix form, a plurality of source signal lines, which inputs video signals to the plurality of pixels, and a source driver, which outputs signals to each of the plurality of source signal lines, driving methods described below are used.
(First Driving Method)

In a display device having a source driver which includes a shift register and an image signal input line to which a video signal is input, the following driving method is used.

It is determined whether or not all of video signals corresponding to pixels in one row of a plurality of pixels are equal to one another. When video signals corresponding to at least two pixels are different from each other in the video signals corresponding to the pixels in one row of the plurality of pixels, video signals input to the image signal input line are sequentially output to a plurality of source signal lines in synchronization with sampling pulses output from the shift register. The sampling pulses indicate pulses, which are sequentially output from a plurality of output terminals of the shift register. On the other hand, in a case where the video signals corresponding to all of the pixels in one row of the plurality of pixels are equal to one another, input of a start pulse to the source driver (the shift register included in the source driver) is stopped, and the video signals input to the image signal input line are simultaneously output to all of the plurality of source signal lines.

Note that, when the video signals corresponding to all of the pixels in one row of the plurality of pixels are equal to one another, input of a clock pulse may be stopped instead of stopping the input of a start pulse in the source driver (the shift register included in the source driver). Alternatively, both of input of a start pulse and input of a clock pulse may be stopped.

Note that the video signals may be either digital video signals or analog video signals. When using digital video signals as the video signals, it is possible to be combined with a time-division gray scale driving method. The time-division gray scale method is a gray scale method in which a plurality of sub-frame periods corresponding to each bit of digital video signals are set in one frame period, and it is selected whether each of the plurality of pixels is displayed at first luminance or second luminance, which is darker than the first luminance, by signals of each bit of the digital video signals, during each of the plurality of sub-frame periods. For example, when display at the first luminance is set to be "white" display and display at the second luminance is set to be "black" display, gray scales can be expressed by controlling a period of the "white" display during one frame period in each pixel.
(Second Driving Method)

A source driver may includes a shift register, a plurality of image signal input lines to which digital video signals are input, a plurality of first latch circuits, a plurality of second latch circuits to which signals output from the plurality of first latch circuits are input when a latch pulse is input, and a plurality of D/A converter circuits to which signals output from the plurality of second latch circuits are input. The plurality of D/A converter circuits are circuits which convert input digital signals into analog signals and output the converted analog signals. A latch pulse is a signal for determining timing of transferring information stored in the plurality of first latch circuits to the plurality of second latch circuits. The source driver can convert input digital video signals into corresponding analog video signals and simultaneously output the analog video signals to the plurality of source signal lines. A display device having the source driver uses the following driving method.

It is determined whether or not digital video signals corresponding to all of pixels in one row of a plurality of pixels are equal to one another. When digital video signals corresponding to at least two pixels are different from each other in the digital video signals corresponding to the pixels in one row of the plurality of pixels, digital video signals input to the plurality of image signal input lines are sequentially output to the plurality of first latch circuits in synchronization with sampling pulses output from the shift register. On the other hand, in a case where the digital video signals corresponding to all of the pixels in one row of the plurality of pixels are equal to one another, input of a start pulse to the source driver (the shift register included in the source driver) is stopped, and the digital video signals input to the plurality of image signal input lines are simultaneously output to all of the plurality of first latch circuits.

Note that, when the digital video signals corresponding to all of the pixels in one row of the plurality of pixels are equal to one another, input of a clock pulse may be stopped instead of stopping input of a start pulse to the source driver (the shift register included in the source driver). Alternatively, both of input of a start pulse and input of a clock pulse may be stopped.

Note that, in the second driving method, one image signal input line can be used instead of the plurality of image signal input lines, and the second driving method can be combined with the time-division gray scale method. In this case, the above mentioned D/A converter circuits are not necessarily required.

Specifically, in the second driving method, one image signal input line is used instead of the plurality of image signal input lines, and digital video signals are input by one bit to the one image signal input line during one sub-frame period. The digital video signals input to the image signal input line are stored in the plurality of first latch circuits. Signals output from the plurality of first latch circuits are simultaneously input to the plurality of second latch circuits upon inputting a latch pulse. When the D/A converter circuits are not provided, the digital video signals output from the plurality of second latch circuits are output to the plurality of source signal lines. Thus, the plurality of second latch circuits output digital video signals for one bit to the plurality of source signal lines during each sub-frame period. Here, it is determined whether or not the digital video signals corresponding to all of pixels in one row of the plurality of pixels are equal to one another. In a case where digital video signals corresponding to at least two pixels are different from each other in the digital video signals corresponding to the pixels in one row of the plurality of pixels, the digital video signals input to the image signal input line are sequentially output to the plurality of first latch circuits in synchronization with sampling pulses output from the shift register. On the other hand, in a case where the digital video signals corresponding to all of the pixels in one row of the plurality of pixels are equal to one another, input of a start pulse to the source driver (the shift register included in the source driver) is stopped, and the digital video signals input to the image signal input line are simultaneously output to all of the plurality of first latch circuits. Accordingly, the second driving method can be combined with the time-division gray scale method.

(Third Driving Method)

In the first driving method, it is selected whether or not the video signals input to the image signal input line are sequentially output to the plurality of source signal lines in synchronization with a signal output from the shift register. Also, in the second driving method, it is determined whether or not the digital video signals input to the plurality of image signal input lines are sequentially output to the plurality of first latch circuits in synchronization with a signal output from the shift register. However, the present invention is not limited to the first and second driving methods.

An output signal line, which is different from an image signal input line, may be provided, and it may be selected whether a signal output from a source driver is output to a plurality of source signal lines or predetermined signals input to the output signal line are simultaneously output to all of the plurality of source signal lines, in accordance with a determination whether or not video signals corresponding to all of pixels in one row of a plurality of pixels are equal to one another. That is, it is determined whether or not the video signals corresponding to all of the pixels in one row of the plurality of pixels are equal to one another. In a case where video signals corresponding to at least two pixels are different from each other in the video signals corresponding to the pixels in one row of the plurality of pixels, the video signals input to the image signal input line are sampled and output to the plurality of source signal lines in synchronization with sampling pulses output from the shift register included in the source driver. On the other hand, when the video signals corresponding to all of the pixels in one row of the plurality of pixels are equal to one another, input of a start pulse to the source driver (the shift register included in the source driver) is stopped, and predetermined signals input to the output signal line are simultaneously output to all of the plurality of source signal lines.

Note that, in the case where the video signals corresponding to all of the pixels in one row of the plurality of pixels are equal to one another, input of a clock pulse may be stopped instead of stopping the input of a start pulse to the source driver (the shift register included in the source driver). Alternatively, both of input of a start pulse and input of a clock pulse may be stopped.

Note that, the video signals may be either digital video signals or analog video signals. When using digital video signals as the video signals, the third driving method can be combined with a time-division gray scale driving method.

Further, each of the first to third driving methods may be combined with a driving method (also, referred to as a source line inversion drive) in which a polarity of a signal input to adjacent source signal lines of the plurality of source signal lines is inverted. The source line inversion drive is effective to a display device using an element, which is deteriorated by being continuously input with video signals having the same polarity, as a display medium. For example, the source line inversion drive is effective to a display device having a liquid crystal element as a display medium.

In a case of performing the source line inversion drive, it is thought that a certain video signal and a video signal, which is generated by inverting a polarity of the certain video signal, exhibit the same luminance when being input to a pixel, and it is considered that these video signals are equal to each other.

In the first driving method, prior to outputting the video signals input to the image signal output line to the plurality of source signal lines, voltage magnitude of the video signals may be converted or the amount of current of the signals may be increased.

In the second driving method, prior to outputting the signals output from the D/A converter circuits to the plurality of source signal lines, voltage magnitude of the signals may be converted or the amount of current of the signals may be increased. Further, in a case where the second driving method is combined with the time-division gray scale method, prior to outputting the signals output for the plurality of second latch circuits to the plurality of source signal lines, voltage magnitude of the signals may be converted or the amount of current of the signals may be increased.

In the third driving method, prior to outputting the signals output from the source driver to the plurality of source signal lines, voltage magnitude of the signals may be changed or the amount of current of the signals may be increased.

The driving methods of a display device of the present invention are described above. Next, structures of a display device displaying images by using the above described driving methods will be described below.

(First Circuit Structure)

A structure of a display device employing the first driving method will be described.

The display device includes a plurality of pixels arranged in a matrix form, a plurality of source signal lines inputting video signals to the plurality of pixels, a source driver outputting signals to each of the plurality of source signal lines, and a control circuit outputting a control signal and controlling input of a start pulse in the source driver.

The source driver includes a shift register, an image signal input line to which video signals are input, a plurality of first switches, a second switch, a plurality of third switches, and a power source terminal kept at predetermined potential. Each of the plurality of third switches has a control terminal, and is turned on or off in accordance with a signal input to the control terminal. The control terminal of each of the plurality of third switches is connected to an output terminal of the shift register through a single first switch of the plurality of first switches, and is also connected to the power source terminal through the second switch. Each of the plurality of third switches is provided to correspond to a single source signal line of the plurality of source signal lines. Thus, the image signal input line is connected to one of the plurality of source signal lines through one of the plurality of third switches. The plurality of first switches and the second switch are turned on or off by a control signal input to the source driver. When the plurality of first switches are turned on, the second switch is turned off, and when the plurality of first switches are turned off, the second switch is turned on.

The control circuit includes a determination circuit which determines whether or not video signals corresponding to all of pixels in one row of the plurality of pixels are equal to one another. In a case where the video signals corresponding to all of the pixels in one row of the plurality of pixels are equal to one another, the control circuit stops input of a start pulse to the source driver (the shift register included in the source driver), and outputs a control signal by which the second switch is turned on.

Note that in a case where the video signals corresponding to all of the pixels in one row of the plurality of pixels are equal to one another, the control circuit may stop input of a clock pulse instead of stopping input of a start pulse to the source driver (the shift register included in the source driver). Alternatively, the control circuit may stop both of input of a start pulse and input of a clock pulse.

Note that, the video signals may be either digital video signals or analog video signals. In a case where the video signals are analog video signals, each of the plurality of third switches can be an analog switch. As the analog switch, for example, a transmission gate (also, referred to as a transfer gate) having a structure, in which an n-channel transistor and a p-channel transistor are connected in parallel, can be used. Note that turning on or turning off of the plurality of first switches must be controlled in accordance with a control signal regardless of whether or not sampling pulses are output from the shift register, i.e., regardless of whether a signal output from the shift register is high potential or low potential. Accordingly, it is preferable that CMOS switching elements be used as the first switches. For example, transmission gates each having a structure in which an n-channel transistor and a p-channel transistor are connected in parallel, are preferably used as the first switches.

(Second Circuit Structure)

A circuit structure of a display device in a case of combining the above described first driving method and a driving method, in which a polarity of a signal input to adjacent source signal lines of a plurality of source signal lines is inverted, will be described.

Two image signal input lines are provided in the first circuit structure. The two image signal input lines are referred to as a first image signal input line and a second image signal input line. When the source line inversion drive is performed, a polarity of a video signal to be input is inverted between the first image signal input line and the second image signal input line. Each of source signal lines in odd-numbered columns is connected to the first image signal input line through a single third switch of the plurality of third switches whereas each of source signal lines in even-numbered columns is connected to the second image signal input line.

Structures other than the structures of the image signal input lines and connection methods of the image signal input lines, the plurality of third switches, and the plurality of source signal lines are the same as the first circuit structure, and will not be further described.

(Third Circuit Structure)

In the above described first driving method, a circuit structure of a display device, which is different from the second circuit structure, in a case of combining the above described first driving method and a driving method, in which a polarity of a signal input to adjacent source signal lines of a plurality of source signal lines is inverted, will be described.

Two control signals are used in the first circuit structure. The two control signals are referred to as a first control signal and a second control signal. At least two second switches are provided in the first circuit structure. A power source terminal is connected to a control terminal of each of the plurality of third switches corresponding to source signal lines in odd-numbered columns of the plurality of source signal lines through one of the two second switches. The power source terminal is connected to the control terminal of each of the third switches corresponding the source signal lines in even-numbered columns of the plurality of source signal lines through the other of the two second switches. The first control signal is input to one of the two second switches so that the second switch is turned on or off. The second control signal is input to the other of the two second switches so that the second switch is turned on or off. Further, in the plurality of first switches, the first control signal is input to the first switches corresponding to the source signal lines in the odd-numbered columns of the plurality of source signal lines whereas the second control signal is input to the first switches corresponding to the source signal lines in the even-numbered columns of the plurality of source signal lines.

When one of the first switch and the second switch corresponding to the same source signal line among the plurality of source signal lines is turned on, the other is turned off. Further, in a case of performing the source line inversion drive, when the first switches corresponding to the source signal lines in the odd-numbered columns among the plurality of source signal lines are turned on, the first switches corresponding to the source signal lines in the even-numbered columns among the plurality of source signal lines are turned off. When the first switches corresponding to the source signal lines in the odd-numbered columns among the plurality of source signal lines are turned off, the first switches corresponding to the source signal lines in the even-numbered columns among the plurality of source signal lines are turned on.

The structures other than the control signals, the structure of the second switches, the connection method of the second switches, the plurality of third switches, and the power source terminal, the method of inputting the control signals to the plurality of first switches and the second switches, and the relation of turning on and turning off of the plurality of first switches and the second switches, are the same as the first circuit structure, and will not be further described.

(Fourth Circuit Structure)

A structure of a display device employing the above described second driving method, will be described.

The display device includes a plurality of pixels arranged in a matrix form, a plurality of source signal lines inputting video signals to the plurality of pixels, a source driver outputting signals to each of the plurality of source signal lines, and a control circuit outputting a control signal and controlling input of a start pulse to the source driver.

The source driver includes a shift register, a plurality of image signal input lines input with video signals, a plurality of first switches, a second switch, a power source terminal maintained at predetermined potential, a plurality of first latch circuits, a plurality of second latch circuits, and a plurality of D/A converter circuits. An input terminal of each of the plurality of first latch circuits is selectively connected to each of the plurality of image signal input lines in accordance with a signal input to a control terminal. The control terminal of each of the plurality of first latch circuits is connected to an output terminal of the shift register through a single first switch of the plurality of first switches, and are also connected to the power source terminal through the second switch. When inputting a latch pulse to an output terminal of a single first latch circuit of the plurality of first latch circuits, the output terminal of the single first latch circuit of the plurality of first latch circuits is connected to an input terminal of a singe second latch circuit of the plurality of second latch circuits. An output terminal of a single second latch circuit of the plurality of second latch circuits is connected to an input terminal of a single D/A converter circuit of the plurality of D/A converter circuits. An output terminal of a single D/A converter circuit of the plurality of D/A converter circuits is connected to a single source signal line of the plurality of different source signal lines. By a control signal input to the source driver, the plurality of first switches and the second switch are selectively turned on or turned off. When the plurality of first switches are turned on, the second switch is turned off, whereas when the plurality of first switches are turned off, the second switch is turned on.

The control circuit includes a determination circuit which determines whether or not digital video signals corresponding to all of pixels in one row of the plurality of pixels are equal to one another. In a case where the digital video signals corresponding to all of the pixels in one row of the plurality of pixels are equal to one another, the control circuit stops input of a start pulse to the source driver (the shift register included in the source driver), and outputs a control signal by which the second switch is turned on.

Note that, in a case where the digital video signals corresponding to all of the pixels in one row of the plurality of pixels are equal to one another, the control circuit may stop input of a clock pulse instead of stopping input of a start pulse to the source driver (the shift register included in the source driver). Alternatively, both of input of a start pulse and input of a clock pulse may be stopped.

Note that turning on or turning off of the plurality of first switches must be controlled in accordance with a control signal regardless of whether or not sampling pulses are output from the shift register, i.e., regardless of whether a signal output from the shift register is high potential or low potential. Accordingly, it is preferable that CMOS switching elements be used as the first switches. For example, transmission gates each having a structure in which an n-channel transistor and a p-channel transistor are connected in parallel, are preferably used as the first switches.

(Fifth Circuit Structure)

A circuit structure of a display device in a case of combining the second driving method and a driving method in which a polarity of a signal input to adjacent source signal lines of a plurality of source signal lines is inverted, will be described.

Two sets of a plurality of image signal input lines are used instead of the plurality of image signal input lines of the fourth circuit structure. The two sets of the image signal input lines are referred to as a plurality of first image signal input lines and a plurality of second image signal input lines. When the source line inversion drive is performed, polarities of input digital video signals are inverted between the plurality of first image signal input lines and the plurality of second image signal input lines. Input terminals of the plurality of first latch circuits corresponding to source signal lines in odd-numbered columns of the plurality of source signal lines are connected to the plurality of first image signal input lines, and input terminals of the plurality of first latch circuits corresponding to source signal lines in even-numbered columns of the plurality of source signal lines are connected to the plurality of second image signal input lines.

Structures other than structures of the plurality of image signal input lines and a connection method between the plurality of image signal input lines and the plurality of first latch circuits are the same as the fourth circuit structure, and will not be further described.

(Sixth Circuit Structure)

A circuit structure of a display device, which is different from the fifth circuit structure, in a case of combining the second driving method and a driving method in which a polarity of a signal in adjacent source signal lines of a plurality of source signal lines, will be described.

Two control signals are used in the fourth circuit structure. The two control signals are referred to as a first control signal and a second control signal. Further, at least two second switches are provided in the fourth circuit structure. The power source terminal is connected to the control terminals of the first latch circuits corresponding to the source signal lines in the odd-numbered columns of the plurality of source signal lines through one of the two second switches. The power source terminal is connected to the control terminals of the first latch circuits corresponding to the source signal lines in the even-numbered columns of the plurality of source signal lines through the other of the two second switches. The first control signal is input to one of the two second switches so that the second switch is turned on or off. The second control signal is input to the other of the two second switches so that the second switch is turned on or off. Further, in the plurality of first switches, the first control signal is input to the first switches corresponding to the source signal lines in the odd-numbered columns of the plurality of source signal lines, whereas the second control signal is input to the first switches corresponding to the source signal lines in the even-numbered columns of the plurality of source signal lines.

When one of the first switch and the second switch corresponding to the same source signal line of the plurality of source signal lines is turned on, the other is turned off. Further, in a case of performing the source line inversion drive, when the first switches corresponding to the source signal lines in the odd-numbered columns of the plurality of source signal lines are turned on, the first switches corresponding to the source signal lines in the even-numbered columns of the plurality of source signal lines are turned off. When the first switches corresponding to the source signal lines in the odd-numbered columns of the plurality of source signal lines are turned off, the first switches corresponding to the source signal lines in the even-numbered columns of the plurality of source signal lines are turned on.

The structures other than the control signals, the structures of the second switches, the connection method of the second switches, the control terminals of the plurality of first latch circuits, and the power source terminal, the method of inputting the control signals to the plurality of first switches and the second switches, and the relation of turning on and turning off of the plurality of first switches and the second switches, are the same as the fourth circuit structure, and will not be further described.

(Seventh Circuit Structure)

A structure of a display device employing the above described third driving method will be described.

The display device includes a plurality of pixels arranged in a matrix form, a plurality of source signal lines inputting video signals to the plurality of pixels, a source driver outputting video signals to each of the plurality of source signal lines, a control circuit, a plurality of first switches, a second switch, and an output signal line to which a predetermined signal is input. The control circuit outputs a control signal and controls whether or not a start pulse is input to the source driver.

Each of the plurality of source signal lines is connected to an output terminal of the source driver through a single first switch of the plurality of first switches, and is also connected to the output signal line through the second switch. The plurality of first switches and the second switch are selectively turned on or off by the control signal. When the plurality of first switches are turned on, the second switch is turned off, whereas when the plurality of first switches are turned off, the second switch is turned on.

The control circuit includes a determination circuit which determines whether or not video signals corresponding to all of pixels in one row of the plurality of pixels are equal to one another. In a case where the video signals corresponding to all of pixels in one row of the plurality of pixels are equal to one another, the control circuit stops input of a start pulse to the source driver (the shift register included in the source driver), and outputs a control signal by which the second switch is turned on.

Note that, in a case where the video signals corresponding to all of pixels in one row of the plurality of pixels are equal to one another, the control circuit may stop input of a clock pulse instead of stopping input of a start pulse in the source driver (the shift register included in the source driver). Alternatively, both of input of a start pulse and input of a clock pulse may be stopped.

Note that turning on or turning off of the plurality of first switches must be controlled in accordance with the control signal regardless of whether or not a signal is output from the source driver, i.e., regardless of potential of the signal output from the source driver. Accordingly, it is preferable that CMOS switching elements be used as the first switches. For example, transmission gates each having a structure in which an n-channel transistor and a p-channel transistor are connected in parallel, are preferably, used as the first switches.

Turning on or turning off of the second switch must be controlled in accordance with the control signal regardless of potential of the output signal line. Therefore, as the second switch, a CMOS switching element is preferably used. For example, a transmission gate having a structure in which an n-channel transistor and a p-channel transistor are connected in parallel, is preferably used as the second switch.

(Eighth Circuit Structure)

A structure of a display device in a case of combining the third driving method and a driving method in which a polarity of a signal input to adjacent source signal lines of a plurality of source signal lines is inverted, will be described.

Two output signal lines are provided in the seventh circuit structure. The two output signal lines are referred to as a first output signal line and a second output signal line. Polarities of predetermined signals input to the first output signal line and the second output signal line are inverted therebetween. Each of the source signal lines in odd-numbered columns is connected to the first output signal line through a single second switch of the plurality of second switches, and each of the source signal lines in even-numbered columns is connected to the second output signal line.

Structures other than the structure of the output signal lines and the connection method of the output signal lines, the plurality of second switches, and the plurality of source signal lines, are the same as the seventh circuit structure, and will not be further described.

(Ninth Circuit Structure)

A structure of a display device, which is different from the eighth circuit structure, in a case of combining the third driving method and a driving method in which a polarity of a signal input to adjacent source signal lines of a plurality of source signal lines is inverted, will be described.

Two control signals are used in the seventh circuit structure. The two control signals are referred to as a first control signal and a second control signal. In the plurality of first switches, the first control signal is input to the first switches corresponding to the source signal lines in odd-numbered columns of the plurality of source signal lines. The second control signal is input to the first switches corresponding to the source signal lines in even-numbered columns of the plurality of source signal lines.

When one of the first switch and the second switch corresponding to the same source signal line of the plurality of source signal lines is turned on, the other is turned off Further, in a case of performing the source line inversion drive, when the first switches corresponding to the source signal lines in the odd-numbered columns of the plurality of source signal lines are turned on, the first switches corresponding to the source signal lines in the even-numbered columns of the plurality of source signal lines are turned off. When the first switches corresponding to the source signal lines in the odd-numbered columns of the plurality of source signal lines are turned off, the first switches corresponding to the source signal lines in the even-numbered columns of the plurality of source signal lines are turned on.

Structures other than the control signals, the method of inputting the control signals to the plurality of first switches and the second switch, and the relation between turning on and turning off of the plurality of first switches and the second switch are the same as the seventh circuit structure, and will not be further described here.

In each of the first to third circuit structures, prior to inputting the video signals input to the image signal output line to the plurality of source signal lines, a circuit converting voltage magnitude of signals (a level shifter circuit) or a circuit whose current gain is more than 1 in a case where current gain is 1 (a buffer circuit) may be provided. Alternatively, both of the level shifter circuit and the buffer circuit may be provided.

In the fourth to sixth circuit structures, prior to outputting the signals output from the D/A converter circuits in the plurality of source signal lines, a level shifter circuit or a buffer circuit may be provided. Alternatively, both of the level shifter circuit and the buffer circuit may be provided.

In the seventh to ninth circuit structures, prior to outputting the signals output from the source driver to the plurality of source signal lines, a level shifter circuit or a buffer circuit may be provided. Alternatively, both of the level shifter circuit and the buffer circuit may be provided.

In the first to ninth circuit structures, each of the plurality of pixels may have a liquid crystal element as a display medium. Further, each of the plurality of pixels may have a light emitting element as a display medium. For example, each of the plurality of pixels may have an electroluminescence (EL) element or a light emitting diode. As a display medium of each of the plurality of pixels, a display medium whose contrast is changed by an electromagnetic action, can be freely applied. In addition, each of the plurality of pixels may have a switching element.

The display device may be an EL display, a liquid crystal display (a transmissive liquid crystal display, a semi-transmissive liquid crystal display, a reflective liquid crystal display, etc.), or the like. Further, the display device may be a plasma display (PDP), a field emission display (FED), a surface-conduction electron-emitter display (SED), an electronic paper using electronic ink, and the like.

Note that, as switches (switching elements), switches having various modes can be used. For example, an electrical switch, a mechanical switch, and the like can be given as the switches (switching elements). That is, various switches can be used as the switches (switching elements) so long as they can control flow of current. For example, the switches (switching elements) may be a transistor, a diode (such as an PN diode, an PIN diode, a Schottky diode, and a transistor with a diode connection), or the like. Alternatively, a logic circuit combining the above mentioned switches may be used. Therefore, in a case of using a transistor as a switch (switching element), the switch simply operates as a switch, and therefore, a polarity of the transistor (a conductivity type) is not particularly limited. Note that, in a case where potential of a source of a transistor operated as a switch is operated to be closer to a lower potential side in power source potential, an n-channel transistor is desirably used. On the other hand, in a case where potential of a source of the transistor is operated to be closer to a higher potential side in power source potential, a p-channel transistor is desirably used. This is because such a transistor is easily operated as a switch since an absolute value of voltage between a gate and a source can be made large. Note that, a CMOS switch may be used by using both of an n-channel transistor and a p-channel transistor. In a case of a CMOS switch, the switch can be properly operated in the both cases where potential input to the switch is high and low with respect to output potential.

Note that, the phrase "be connected" includes a case of being electrically connected and a case of being directly connected. Therefore, in addition to a predetermined connection relation for exhibiting an advantageous effect of the present invention, other element which can make electrical connection (for example, a switch, a transistor, a capacitor element, an inductor, a resistance element, a diode, and the like) may be disposed between an element and another element of the predetermined connection relation.

Further, transistors having various modes can be used. For example, a thin film transistor (TFT) using an amorphous semiconductor film typified by amorphous silicon and polycrystalline silicon, an MOS transistor formed using a semiconductor substrate or an SOI substrate, and the like can be used. In addition, a junction transistor, a bipolar transistor, a transistor using compound semiconductor such as ZnO and a-InGaZnO, a transistor using organic semiconductor or carbon nanotube, and the like can be applied. Note that an amorphous semiconductor film may contain hydrogen or halogen. Further, various types of substrates over which transistors are provided may be used. Therefore, for example, a transistor can be provided over a single crystalline substrate, an SOI substrate, a glass substrate, a quartz substrate, a resin substrate, a paper substrate, a cellophane substrate, a stone substrate, and the like. Further, a transistor may be formed over a substrate, and thereafter, the transistor may be transferred to the other substrate and disposed thereover.

Further, a transistor having any structure can be used. For example, a transistor having a multi-gate structure which is equivalent to a structure in which two or more transistors are connected in series may be used. By employing the multi-gate structure, off current can be reduced, withstand pressure of a transistor can be improved to improve reliability, or changes in current between a drain and a source with respect to changes in voltage between the drain and source when being operated in a saturation region can be reduced. Further, a transistor may have a structure in which gate electrodes are provided over and under a channel, a structure in which a gate electrode is provided over a channel, or a structure in which a gate electrode is provided under a channel. In addition, a transistor may have a staggered structure or an inversely staggered structure. In a transistor having a structure in which gate electrodes are provided over and under a channel, since an area of the channel is increased, the amount of current can be increased or a depletion layer is easily formed so that an S value can be reduced. Further, in a transistor, a source electrode or a drain electrode may be overlapped with a channel (or a part of the channel). By using the structure in which a source electrode or a drain electrode is overlapped with a channel (or a part of the channel), it is possible to prevent instability of transistor operation due to accumulation of charges in a part of the channel. Furthermore, an LDD (lightly doped drain) region may be provided in a transistor. Providing the LDD region makes it possible to improve reliability by improving pressure resistance of the transistor and reduce variations in current between a drain and a source with respect to changes in voltage between the drain and the source when being operated in a saturation region.

Note that each of the plurality of pixels corresponds to one color element. Accordingly, in a case of a color display device including R (red), G (green), and B (blue) elements, a minimum unit of an image includes three pixels of a R pixel, a G pixel, and a B pixel. Further, color elements are not limited to R, and B, and for example, four pixels of R, B, and W (white), R, and B added with yellow, cyan, and magenta, or the like can be used as a minimum unit of an image.

Moreover, the case where a plurality of pixels are arranged in the matrix form includes a case where a plurality of pixels are arranged in stripes, a case where a plurality of pixels are arranged in a delta form, and a case where a plurality of pixels are arranged in a Bayer form, when performing color display with a plurality of color elements.

When signals corresponding to all of pixels in one row of a plurality of pixels are equal to one another, predetermined signals are input to the pixels in the one row so that operation of a shift register in a source driver can be stopped. Thus, power consumption of the source driver can be reduced.

In particular, in the third driving method, and the seventh to ninth circuit structures, overall operation of the source driver can be stopped in addition to the operation of the shift register in the source driver, and therefore, power consumption of the source driver can be largely reduced. For example, in a case where the source driver has a D/A converter circuit, a latch circuit, and the like, operation of these circuits can also be stopped.

As set forth above, power consumption of a display device can be significantly reduced.

BRIEF DESCRIPTION OF DRAWINGS

FIGS. 28A to 28C are diagrams showing Embodiment Modes 1, 2, and 3.

BEST MODE FOR CARRYING OUT THE INVENTION

Embodiment Modes

The embodiment modes of the present invention will be described below. It is easily understood by those who skilled in the art that the embodiment modes and details herein disclosed can be modified in various ways without departing from the purpose and the scope of the invention. The present invention should not be interpreted as being limited to the description of the embodiment modes to be given below.

Embodiment Mode 1

Embodiment Mode 1 is an embodiment mode corresponding to the first driving method and the first circuit structure.

Figure 1:
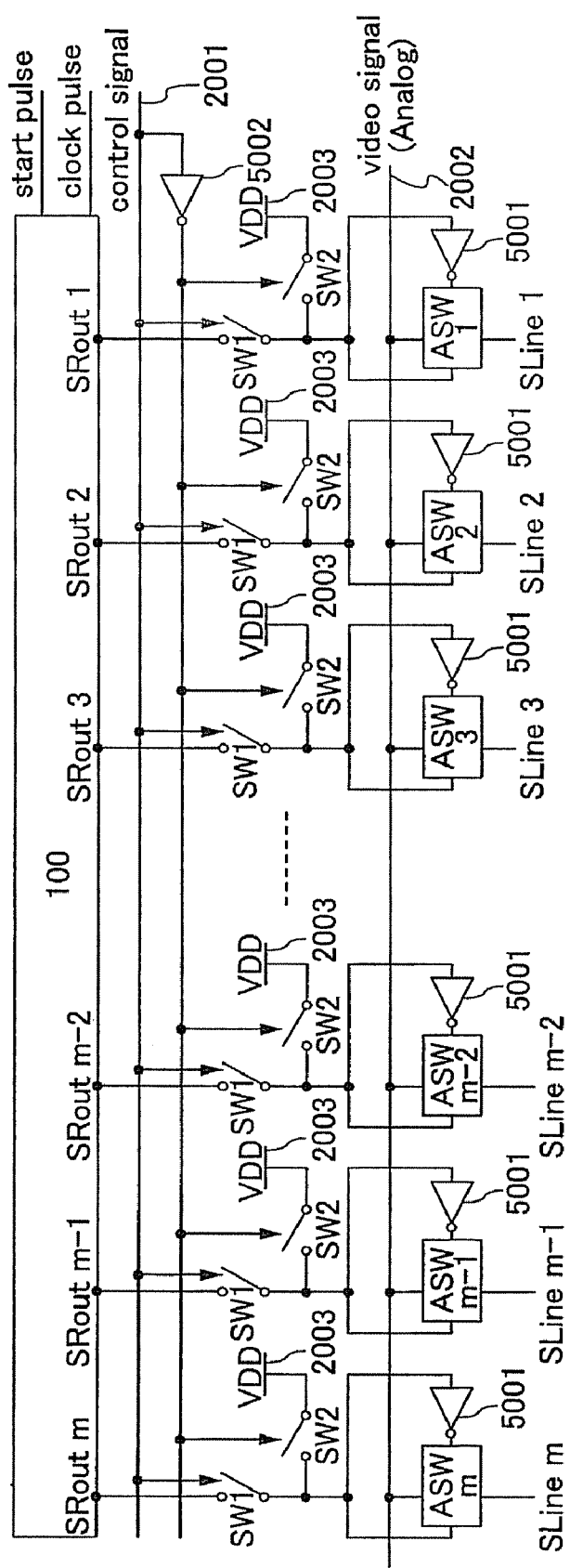
FIG. 1 is a diagram showing Embodiment Mode 1.
Figure 2:
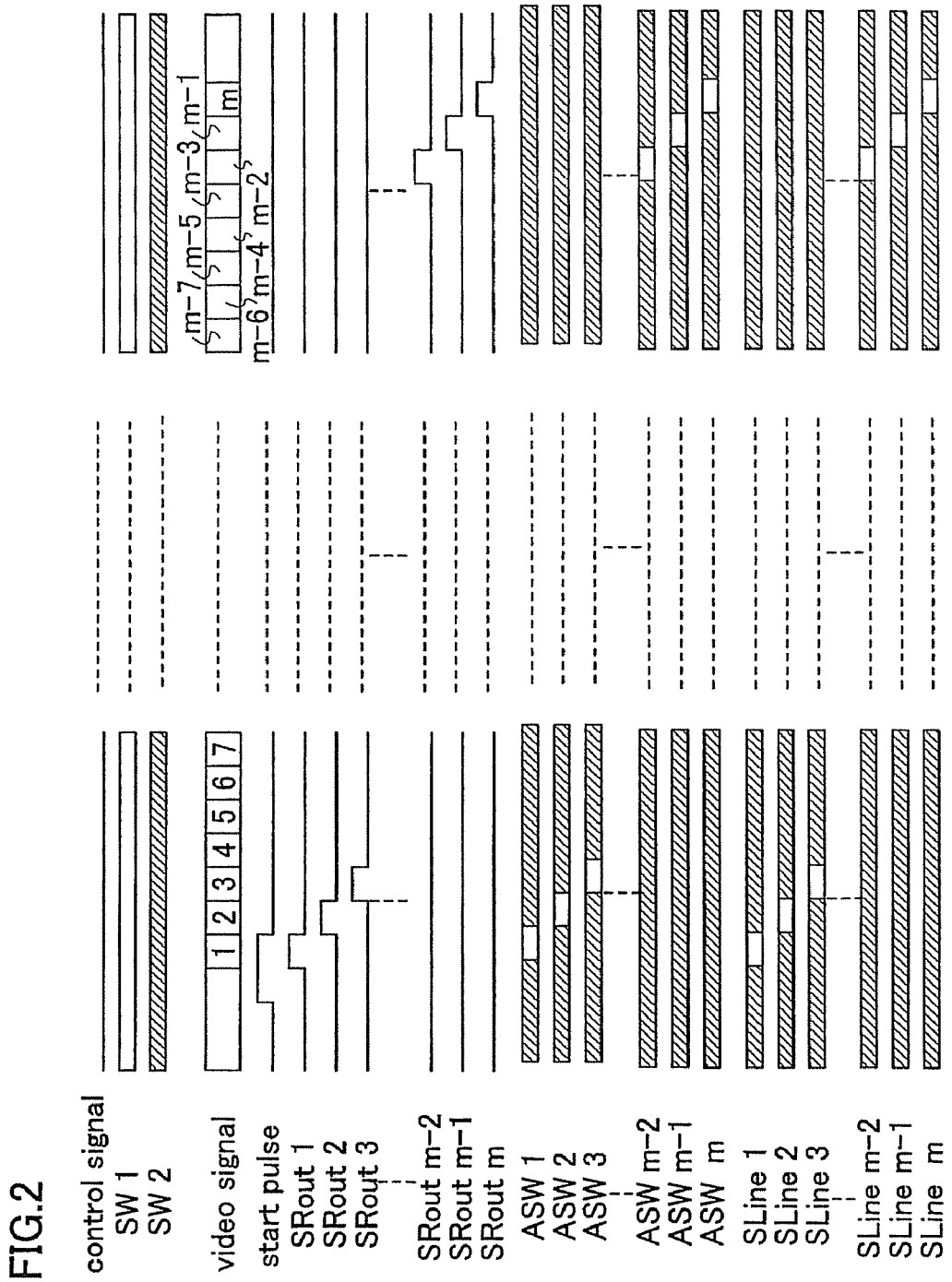
FIG. 2 is a diagram showing Embodiment Mode 1.
Figure 3:
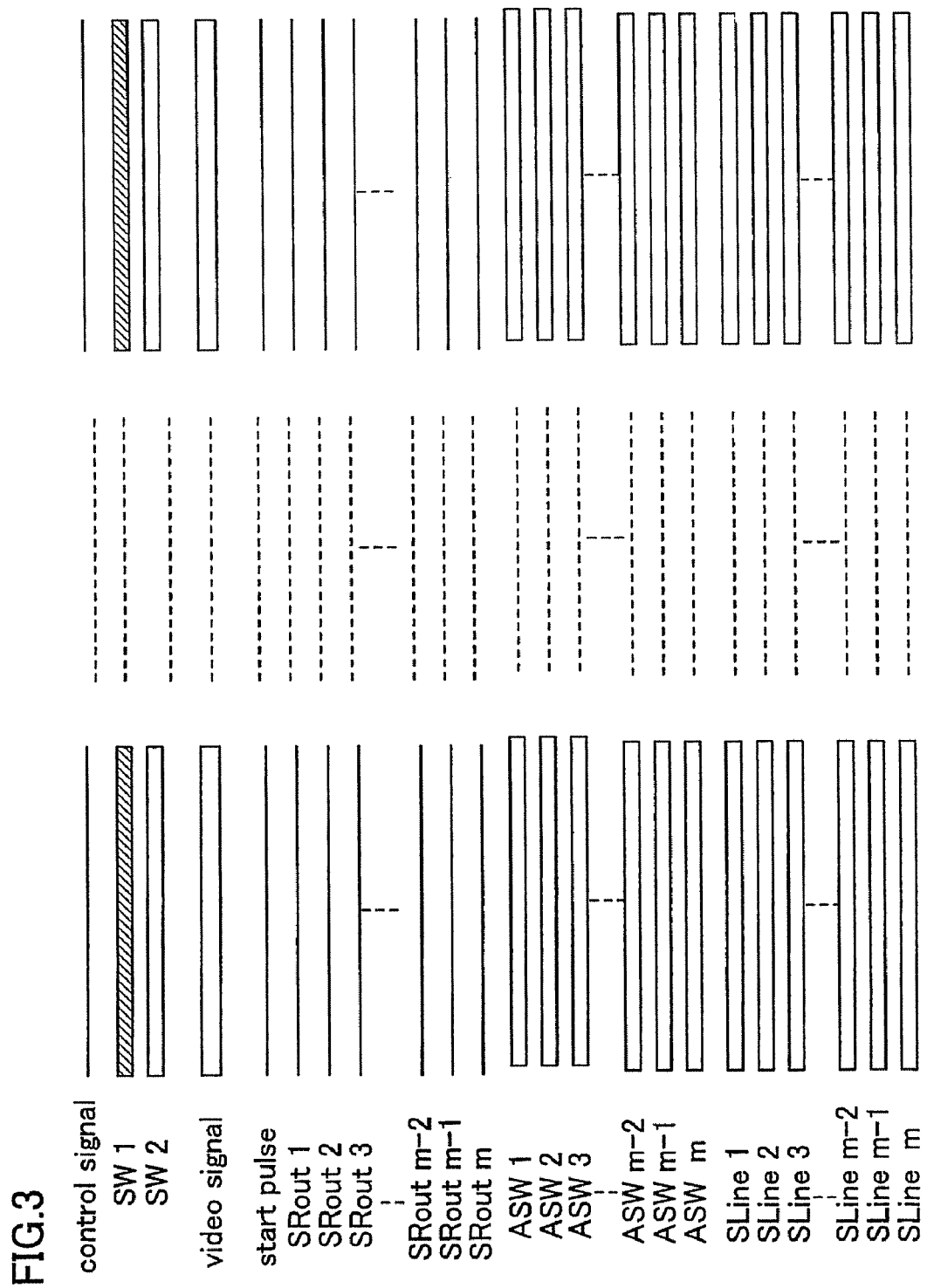
FIG. 3 is a diagram showing Embodiment Mode 1.

Note that this embodiment mode shows an example corresponding to a case of using analog video signals as video signals. Embodiment Mode 1 will be described with reference to FIGS. 1, 2, and 3. FIG. 1 is a diagram showing a structure of a source driver of a display device. FIGS. 2 and 3 are timing charts showing driving methods of the source driver shown in FIG. 1.

In FIG. 1, the source driver includes a shift register 100, a plurality of first switches (SW1), a plurality of second switches (SW2), a plurality of third switches (ASW1 to ASWm), a wiring 2001 to which a control signal is input, power source terminals 2003, and a wiring 2002 to which video signals are input. The source driver outputs signals to source signal lines (SLine 1 to SLine m).

Driving methods of the display device shown in FIG. 1 will be described with reference to FIGS. 2 and 3. A case where signals corresponding to at least two pixels among video signals corresponding to pixels in one row of a plurality of pixels are different from each other (hereinafter, referred to as normal drive) and a case where signals corresponding to all of the pixels in one row of the plurality of pixels are equal to one another (hereinafter, referred to as power-saving drive) will be individually described. A timing chart of the normal drive is shown in FIG. 2 and a timing chart of the power-saving driver is shown in FIG. 3. Note that, in the timing charts of FIGS. 2 and 3, conditions where the switches are turned off or predetermined video signals are not input, are shaded whereas conditions where the switches are turned on or predetermined video signals are input, are not shaded. The case where video signals corresponding to at least two pixels among video signals corresponding to pixels in one row of a plurality of pixels are different from each other, indicates, for example, a case where a signal 1 and a signal m are different from each other in FIG. 2. The case where signals corresponding to all of the pixels in one row of the plurality of pixels are equal to one another indicates, for example, signals 1 to m in FIG. 2 are equal to one another (this state is shown in FIG. 3).

The normal drive will be described with reference to FIG. 2. In the normal drive, the first switches (SW1) are turned on by a control signal input to the wiring 2001 whereas the second switches (SW2) are turned off by an inverted signal, which is generated by inverting the control signal input to the wiring 2001 by an inverter 5002. A shift register 100 input with a start pulse and a clock pulse sequentially outputs pulses (in the drawing, which are denoted by SRout 1 to SRout m (m is a natural number)) from a plurality of output terminals. These pulses are referred to as sampling pulses. The sampling pulses are input to the third switches (ASW 1 to ASW m) through the first switches (SW1), which are turned on. The third switches (ASW 1 to ASW m) are analog switches having control terminals, and are turned on or off in accordance with signals input to the control terminals Note that, each of the third switches (ASW 1 to ASW m) shown in FIG. 1 has two control terminals, wherein a signal is input to one of the two control terminals whereas an inverted signal generated by inverting the signal is input to the other one. That is, each of the third switches (ASW 1 to ASW m) shown in FIG. 1 is turned on or off by inputting the sampling pulses and inverted signals of the sampling pulses to the two control terminals. The sampling pulses are inverted by an inverter 5001. By sequentially turning the third switches (ASW 1 to ASW m) on by the sampling pulses, video signals (denoted by 1 to m in FIG. 2) input to the wiring 2002, which corresponds to an image signal input line, can be sequentially output to the source signal lines (SLine 1 to SLine m). The driving method by which the video signals are sequentially output to the source signal lines (SLine 1 to SLine m), is referred to as a dot sequential drive.

Next, the power-saving drive will be described with reference to FIG. 3. In the power-saving drive, the first switches (SW1) are turned off by a control signal whereas the second switches (SW2) are turned on by an inverted signal of the control signal. By turning the first switches (SW1) off, the shift register 100 and the control terminals of the third switches (ASW 1 to ASW m) are disconnected. Under this condition, a start pulse input to the shift register 100 is stopped. Thus, driving of the shift register 100 is stopped. Stopping the driving of the shift register indicates a condition where sampling pulses output from the shift register are stopped.

By turning the second switches (SW2) on, the power source terminals 2003 are connected to the control terminals of the third switches (ASW 1 to ASW m). The power source terminals 2003 are supplied with the predetermined potential VDD. Therefore, by turning the second switches (SW2) on, the potential VDD is input to the control terminals of all of the third switches (ASW 1 to ASW m). The potential VDD is set such that the third switches (ASW 1 to ASW m) are turned on when the potential VDD is input to the control terminals of the third switches (ASW 1 to ASW m). Thus, all of the third switches (ASW 1 to ASW m) are simultaneously turned on so that the same video signals (predetermined video signals) can be simultaneously output to all of the source signal lines (SLine 1 to SLine m). Note that, the length of a period of outputting signals to the source signal lines (SLine 1 to SLine m) can be arbitrarily set.

According to the above described operation, the same video signals can be simultaneously output to all of the source signal lines (SLine 1 to Sline m) without operating the shift register 100. Therefore, power consumption of the source driver can be reduced for power consumption required for operating the shift register 100.

The video signals, which are input to the source signal lines (SLine 1 to SLine m) by the above described normal drive or power-saving drive, are input to one row of the plurality of pixels included in the display device. Video signals are input to the plurality of pixels in all of rows by the normal drive or the power-saving drive in the same manner so that an image is displayed by the plurality of pixels.

Note that the potential VDD may be applied to the power source terminals 2003 when the second switches (SW2) are turned on. As a signal input to the power source terminals 2003, for example, the control signal input to the wiring 2001 or the start pulse may be used.

The source drive having the structure in which the second switch (SW2) is provided in each source signal line (SLine 1 to SLine m) is shown in FIG. 1; however, the present invention is not limited to this structure. A plurality of source signal lines can share one second switch (SW2).

A means (hereinafter, referred to as a source driver control circuit) for inputting a control signal, a video signal, a start pulse, and a clock pulse to the source driver will be described with reference to FIG. 28A.

A source driver control circuit 1900 includes a control circuit 1901 and a memory 1902, and inputs a control signal, a video signal, a start pulse, and a clock pulse to a source driver 1910.

Video signals are stored in the memory 1902. Video signals corresponding to pixels in one row of a plurality of pixels are readout. The readout video signals are input to the source driver 1910.

The control circuit 1901 includes a determination circuit 1903 and a pulse output circuit 1904. The video signals readout from the memory 1902 are also input to the control circuit 1901. The determination circuit 1903 included in the control circuit 1901 determines whether or not all of the video signals corresponding to pixels in one row of the plurality of pixels are equal to one another. The determination circuit 1903 outputs different control signals in a case where all of the video signals corresponding to the pixels in one row of the plurality of pixels are equal to one another and in a case where at least two video signals among the video signals corresponding to the pixels in one row of the plurality of pixels are different from each other. The control signals are input to the source driver 1910.

Further, controls signals are input to a pulse output circuit 1904 from the determination circuit 1903. When control signals, which correspond to the case where at least two of the video signals corresponding to the pixels in one row of the plurality of pixels are different from each other, are input to the pulse output circuit 1904, the pulse output circuit 1904 supplies a start pulse and a clock pulse of the normal driver to the source driver 1910. On the other hand, when control signals, which correspond to the case where all of the video signals corresponding to the pixels in one row of the plurality of pixels are equal to one another, are input to the pulse output circuit 1904, the pulse output circuit 1904 stop output of a start pulse to the source driver 1910. Note that, the pulse output circuit 1904 may have a structure in which output of a clock pulse to the source driver 1910 is stopped in accordance with a control signal input to the pulse output circuit 1904, or a structure in which output of a start pulse and output of a clock pulse to the source driver 1910 are both stopped.

Embodiment Mode 2

Figure 4:
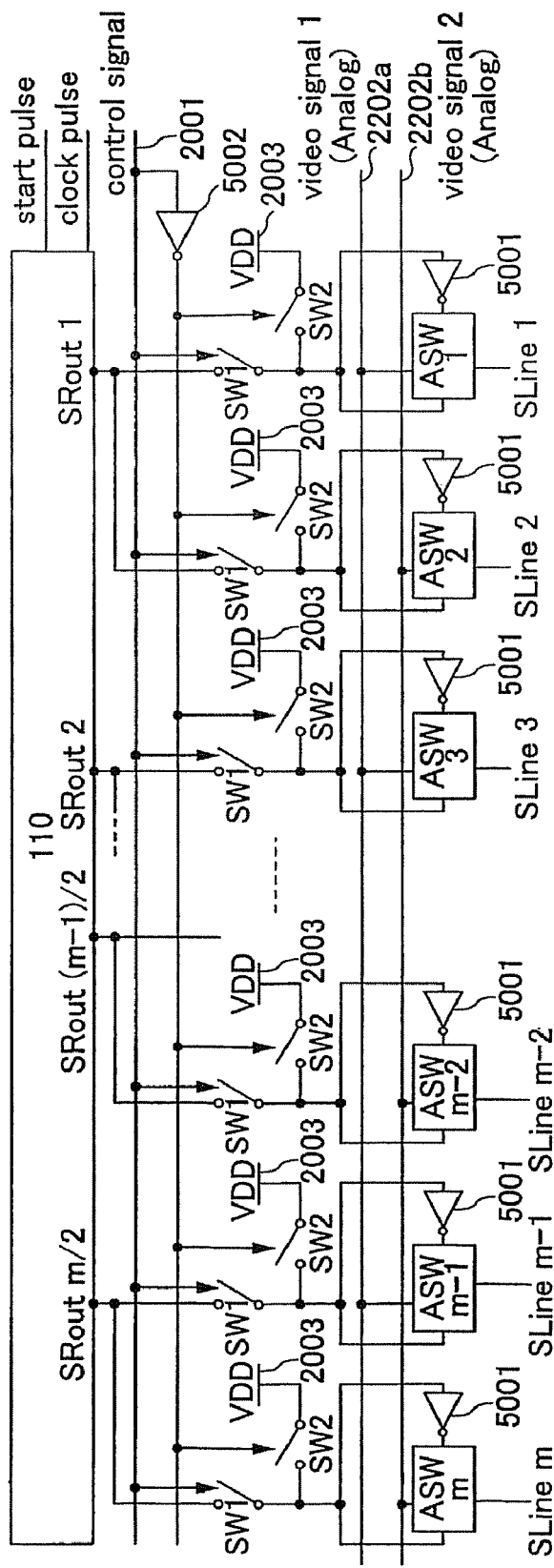
FIG. 4 is a diagram showing Embodiment Mode 2.
Figure 5:
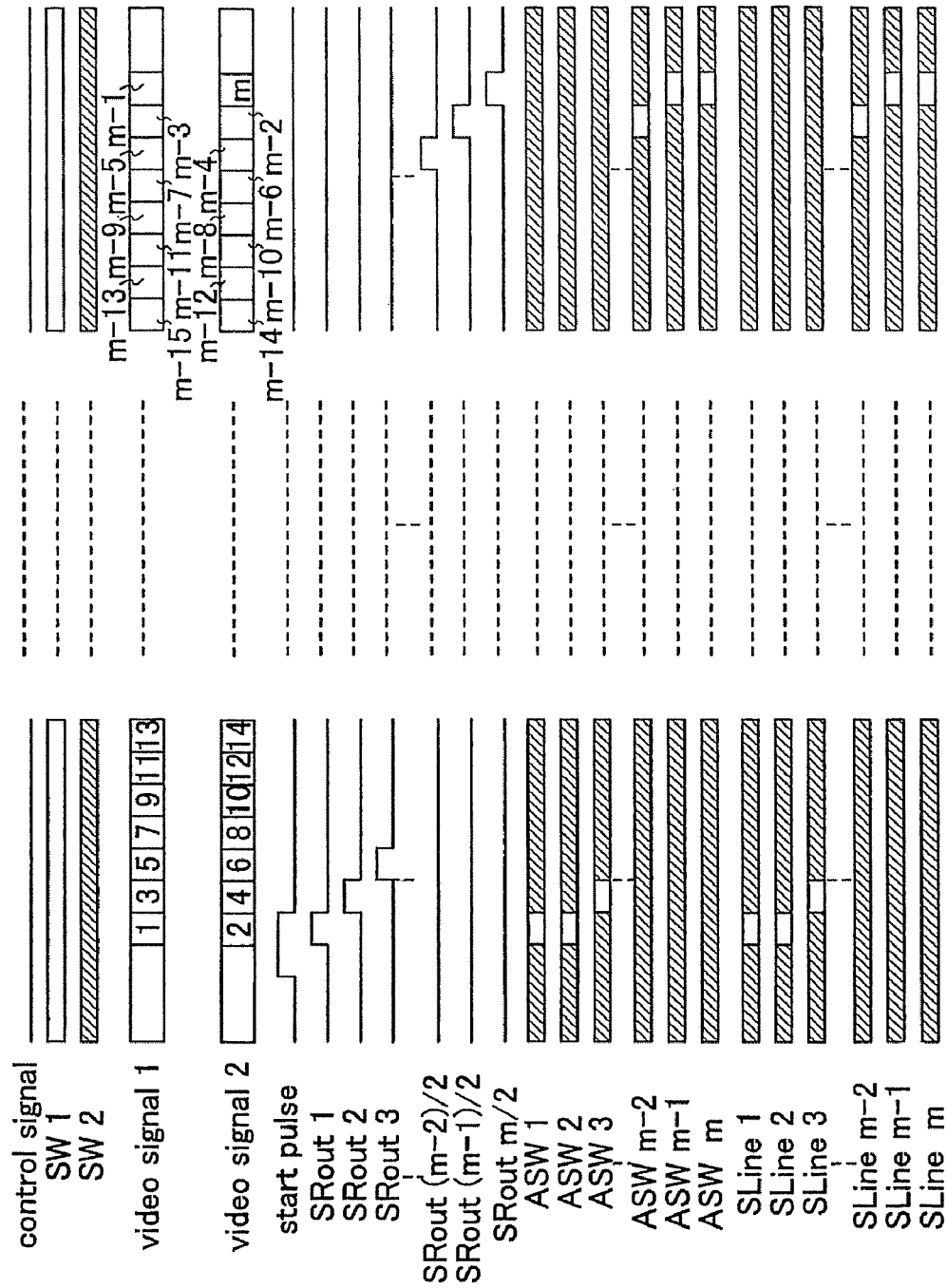
FIG. 5 is a diagram showing Embodiment Mode 2.
Figure 6:
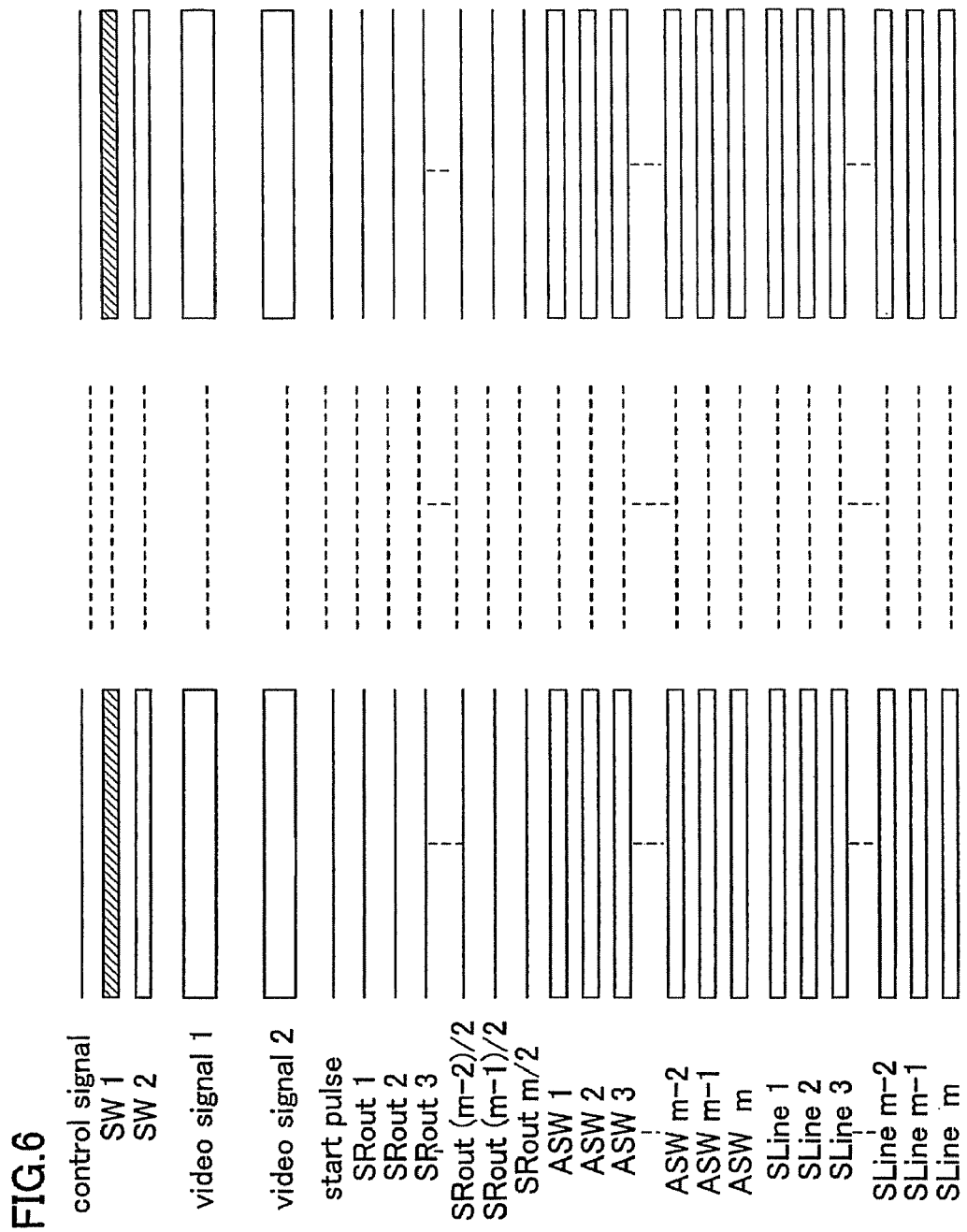
FIG. 6 is a diagram showing Embodiment Mode 2.

Embodiment Mode 2 is an embodiment mode corresponding to the first driving method and the second circuit structure. Embodiment Mode 2 will be described with reference to FIGS. 4, 5, and 6. Note that the embodiment mode shows an example corresponding to a case of using analog video signals as video signals. FIG. 4 is a diagram showing a structure of a source driver of a display device. FIGS. 5 and 6 are timing charts showing driving methods of the source driver shown in FIG. 4. In FIGS. 4, 5, and 6, the same portions as those of FIGS. 1, 2, and 3 are denoted by the same reference numerals, and will not be further described. A timing chart of normal drive is shown in FIG. 5 and a timing chart of power-saving drive is shown in FIG. 6.

The source driver shown in FIG. 4 has a feature of including a wiring 2202a and a wiring 2202b instead of the wiring 2002 of the source driver shown in FIG. 1. That is, differing from the source driver shown in FIG. 1, the source driver shown in FIG. 4 has the two wirings, which correspond to image signal input lines. Each of source signal lines in odd-numbered columns (SLine 1, SLine 3, . . . ) is connected to the wiring 2202a through a single third switch of a plurality of third switches (ASW 1 to ASW m), and each of source signal lines in even-numbered columns (SLine 2, SLine 4, . . . ) is connected to the wiring 2202b through a single third switch of the plurality of third switches (ASW 1 to ASW m). A first video signal is input to the wiring 2202a whereas a second video signal is input to the wiring 2202b. By inverting a polarity of the second video signal (denoted by a video signal 2 in the drawing) with respect to the first video signal (denoted by a video signal 1 in the drawing), source line inversion drive can be performed.

The normal drive will be described with reference to FIG. 5. In the normal drive, the first switches (SW1) are turned on whereas the second switches (SW2) are turned off by control signals input to the wiring 2001. A start pulse is input to a shift register 110. By sampling pulses output by the shift register 110, the third switches (ASW 1 to ASW m) are turned on so that a first video signal and a second video signal are output to the source signal lines.

Note that, in the source driver shown in this embodiment mode, the two wirings (the wirings 2202a and 2202b), which correspond to the image signal input lines, are provided. Thus, the first video signal corresponding to one (SLine p, wherein p is an odd number equal to or lower than m) of the source signal lines in the odd-numbered columns and the second video signal corresponding to one (SLine p+1) of source signal lines in even-numbered columns, which is adjacent to the source signal line in the odd-numbered column (SLine p), can be simultaneously sampled. That is, in the normal drive, the third switch (ASWp) corresponding to the source signal line (SLine p) and the third switch (ASWp+1) corresponding to the source signal line (SLine p+1) can be simultaneously turned on or off. Accordingly, one output terminal of the source driver may be provided for the third switch (ASWp) and the third switch (ASWp+1). Therefore, the source driver shown in this embodiment mode requires about half the number of output terminals of the shift register 110 required for the source driver shown in Embodiment Mode 1. FIG. 3 shows an example in which m is set to be an even number and the number of output terminals of the shift register 110 is set to be SLine 1 to SLine m/2. Thus, a driving frequency of the shift register 110 can be reduced.

In general, it may be possible to employ a driving method (hereinafter, referred to as source line division drive, wherein k is referred to as a division number) in which the number of image signal input lines to which different video signals are input is set to be k (k is a natural number equal to or more than 2), a plurality of source signal lines are divided into units each having k pieces of the source signal lines, and k pieces of third switches corresponding to the k pieces of the source signal lines are simultaneously turned on or off.

In this embodiment mode, an example of combining the source line inversion drive and source line division drive of a division number 2, is shown. Alternatively, the present invention can be combined with source line division drive of an arbitrary division number. Note that, when combining the source line inversion drive and the source line division drive of a division number k, k is necessary to be an even number. Further, only the source line division drive of an arbitrary division number may be performed. Furthermore, when the source line inversion drive is not performed, polarities of video signals input to the plurality of image signal input lines are not necessary to be inverted.

Next, power-saving drive will be described with reference to FIG. 6. In the power-saving drive, the first switches (SW1) are turned off whereas the second switches (SW2) are turned on by a control signal. By turning the first switches (SW1) off, the shift register 110 and the control terminals of the third switches (ASW 1 to ASW m) are disconnected. Under this condition, a start pulse input to the shift register 110 is stopped. Thus, driving of the shift register 110 is stopped.

By turning the second switches (SW2) on, the power source terminals 2003 are connected to the control terminals of the third switches (ASW 1 to ASW m). The power source terminals 2003 are supplied with the predetermined potential VDD. Therefore, by turning the second switches (SW2) on, the potential VDD is input to the control terminals of all of the third switches (ASW 1 to ASW m). The potential VDD is set such that the third switches (ASW 1 to ASW m) are turned on when the potential VDD is input to the control terminals of the third switches (ASW 1 to ASW m). Thus, all of the third switches (ASW 1 to ASW m) are simultaneously turned on so that the first video signal can be output to the source signal lines in the odd-numbered columns simultaneously while the second video signal can be output to the source signal lines in the even-numbered columns. Thus, the first video signal (predetermined video signal) or the second video signal, which is generated by inverting a polarity of the first video signal, can be simultaneously output to all of the source signal lines (SLine 1 to SLine m). Note that, the length of a period of outputting signals to the source signal lines (SLine 1 to SLine m) can be arbitrarily set.

According to the above described operation, the same video signals (note that, video signals whose polarities are inverted for each source signal line) can be simultaneously output to the all of the source signal lines (SLine 1 to Sline m) without driving the shift register 110. Therefore, power consumption of the source driver can be reduced for power consumption required for operating the shift register 110.

Other structures are the same as the source driver shown in FIG. 1, and will not be further described here.

The video signals, which are input to the source signal lines (SLine 1 to SLine m) by the above described normal drive or power-saving drive, is input to pixels in one row of a plurality of pixels included in a display device. Video signals are input to the plurality of pixels in all of rows by the normal drive or the power-saving drive in the same manner so that an image is displayed by the plurality of pixels.

A source driver control circuit will be described with reference to FIG. 28B. The same portions as FIG. 28A are denoted by the same reference numerals in FIG. 28B, and will not be further described. Differing from the source driver control circuit 1900 of FIG. 28A, a source driver control circuit 1911 of FIG. 28B has an inversion circuit 1905. In the source driver control circuit 1911, video signals readout from the memory 1902 are input to the inversion circuit 1905 and polarities of the video signals are inverted and then output. Thus, the source driver control circuit 1911 outputs a first video signal (denoted by a video signal 1 in the drawing) and a second video signal (denoted by a video signal 2 in the drawing), which is generated by inverting a polarity of the first video signal.

Embodiment Mode 3

Figure 7:
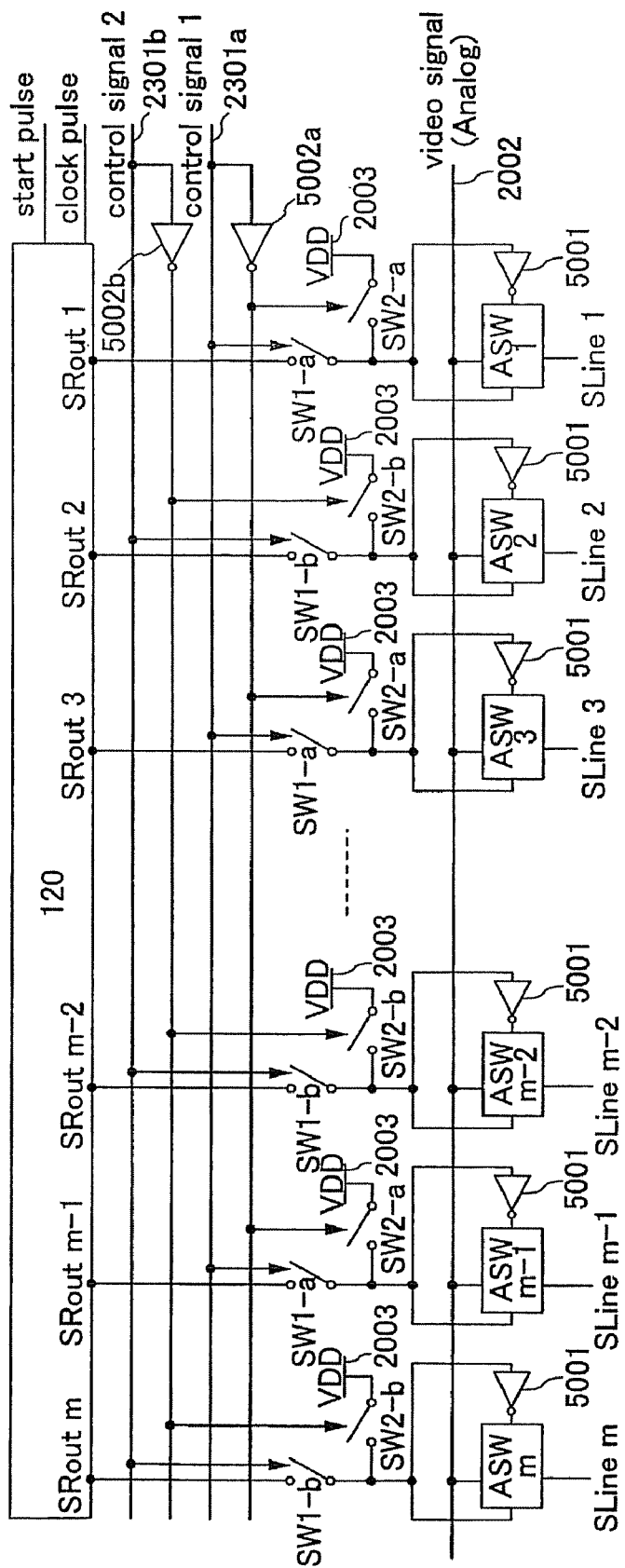
FIG. 7 is a diagram showing Embodiment Mode 3.
Figure 8:
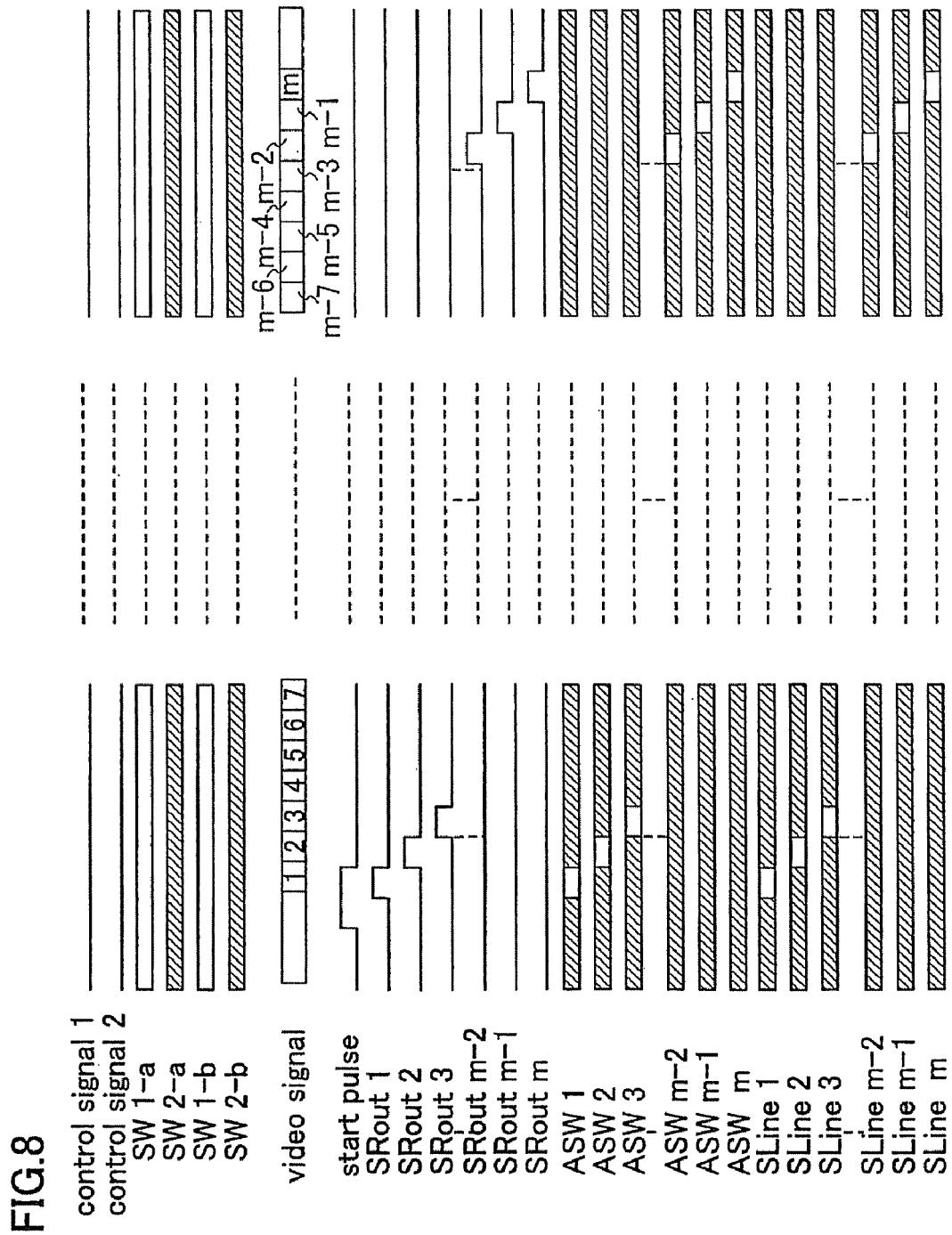
FIG. 8 is a diagram showing Embodiment Mode 3.
Figure 9:
FIG. 9 is a diagram showing Embodiment Mode 3.

Embodiment Mode 3 is an embodiment mode corresponding to the first driving method and the third circuit structure. Embodiment Mode 3 will be described with reference to FIGS. 7, 8, and 9. Note that this embodiment mode shows an example corresponding to a case of using analog video signals as video signals. FIG. 7 is a diagram showing a structure of a source driver of a display device. FIGS. 8 and 9 are timing charts showing driving methods of the source driver shown in FIG. 7. In FIGS. 7, 8, and 9, the same portions as those of FIGS. 1, 2, and 3 are denoted by the same reference numerals, and will not be further described. A timing chart in normal drive is shown in FIG. 8 and a timing chart of power-saving drive is shown in FIG. 9.

The source driver shown in FIG. 7 has a feature of including a wiring 2301a and a wiring 2301b instead of the wiring 2001 of the source driver shown in FIG. 1. That is, differing from the source driver shown in FIG. 1, the source driver shown in FIG. 7 has the two wirings, to which control signals are input. A first control signal (denoted by a control signal 1) is input to the wiring 2301a whereas a second control signal (denoted by a control signal 2) is input to the wiring 2301b.

The first control signal input to the wiring 2301a is input to control terminals of first switches (SW1-a) corresponding to each of source signal lines in odd-numbered columns (SLine 1, SLine 3, . . . ). An inverted signal of the first control signal, which is input to the wiring 2301a, is input to control terminals of second switches (SW2-a) corresponding to each of the source signal lines in the odd-numbered columns (SLine 1, SLine 3, . . . ). The first control signal is inverted by an inverter 5002a. The second control signal input to the wiring 2301b is input to control terminals of first switches (SW1-b) corresponding to each of source signal lines in even-numbered columns (SLine 2, SLine 4, . . . ). An inverted signal of the second control signal, which is input to the wiring 2301b, is input to control terminals of second switches (SW2-b) corresponding to each of the source signal lines in the even-numbered columns (SLine 2, SLine 4, . . . ). The second control signal is inverted by an inverter 5002b. When the first switches (SW1-a) are turned on, the second switches (SW2-a) are turned off, whereas when the second switches (SW2-b) are turned on, the first switches (2W1-a) are turned off. When the first switches (SW1-b) are turned on, the second switches (SW2-b) are turned off, whereas when the second switches are turned on, the first switches are turned off. Further, when performing source line inversion drive, in a case where the first switches (SW1-a) are turned on, the first switches (SW1-b) are turned off In a case where the first switches (SW1-a) are turned off, the first switches (SW1-b) are turned on.

The normal drive will be described with reference to FIG. 8. In the normal drive, the first switches (SW1-a) are turned on whereas the second switches (SW2-a) are turned off by the first control signal. Further, the first switches (SW1-b) are turned on whereas the second switches (SW2-b) are turned off by the second control signal. In a case where a start pulse is input to a shift register 120, the third switches (ASW 1 to ASW m) are sequentially turned on by sampling pulses output from the shift register 120 so that video signals are sequentially output to the source signal lines.

Next, the power-saving drive will be described with reference to FIG. 9. A period of outputting video signals to pixels in one row (hereinafter, referred to as one line period) is divided into first half and last half. Video signals are input to source signal lines corresponding to odd-numbered columns of one of the first half and the last half, and video signals are input to source signal lines corresponding to even-numbered columns in the other of the first half and the last half In the first half and the last half of one line period, by changing polarities of the input video signals, source line inversion drive can be performed. In this embodiment mode, an example where video signals are input to the source signal lines corresponding to the odd-numbered columns in the first half of the one line period whereas video signals are input to the source signal lines corresponding to the even-numbered columns in the last half thereof, will be described.

In the first half of the one line period, the first switches (SW1-a) are turned off while the second switches (SW2-a) are turned on by the first control signal. The first switches (SW1-b) are turned on while the second switches (SW2-b) are turned off by the second control signal. By turning the first switches (SW1-a) off, an output terminal of the shift register is disconnected to the control terminals of the third switches (ASW 1, ASW 3, . . . ) corresponding to the source signal lines in the odd-numbered columns. Under this condition, a start pulse input to the shift register 120 is stopped. Thus, driving of the shift register 120 is stopped.

Since the second switches (SW2-a) are turned on, power source terminals 2003 are connected to the control terminals of the third switches (ASW 1, ASW 3, . . . ) corresponding to the source signal lines in the odd-numbered columns. The power source terminals 2003 are supplied with the predetermined potential VDD. Therefore, by turning the second switches (SW2-a) on, the potential VDD is input to the control terminals of the third switches (ASW 1, ASW 3, . . . ) corresponding to the source signal lines in the odd-numbered columns. The potential VDD is set such that the third switches (ASW 1 to ASW m) are turned on when the potential VDD is input to the control terminals of the third switches (ASW 1 to ASW m). Thus, the third switches (ASW 1, ASW 3, . . . ) corresponding to the source signal lines in the odd-numbered columns can be simultaneously turned on, and therefore, video signals can be simultaneously output to the source signal lines in the odd-numbered columns. In this case, since the first switches (SW1-b) are turned on, signals (SRout 2, SRout 4, . . . ) output from the shift register 120 corresponding to the source signal lines in the even-numbered columns are input to the control terminals of the third switches (ASW 2, ASW 4, . . . ) corresponding to the source signal lines in the even-numbered columns. Since a start pulse is not input to the shift register 120, the shift register 120 does not output a sampling pulse. Therefore, the third switches (ASW 2, ASW 4, . . . ) corresponding to the source signal lines in the even-numbered columns are turned off. Accordingly, the source signal lines in the even-numbered columns (SLine 2, SLine 4, . . . ) are input with no signals.

In the last half of the one line period, the first switches (SW1-a) are turned on while the second switches (SW2-a) are turned off by the first control, signal. The first switches (SW1-b) are turned off while the second switches (SW2-b) are turned on by the second control signal. By turning the first switches (SW1-b) off, an output terminal of the shift register 120 is disconnected to the control terminals of the third switches (ASW1, ASW 3, . . . ) corresponding to the source signal lines in the even-numbered columns. Under this condition, a start pulse input to the shift register 120 is stopped. Thus, driving of the shift register 120 is stopped.

Since the second switches (SW2-b) are turned on, the power source terminals 2003 are connected to the control terminals of the third switches (ASW 2, ASW 4, . . . ) corresponding to the source signal lines in the even-numbered columns. The power source terminals 2003 are supplied with the predetermined potential VDD. Therefore, by turning the second switches (SW2-b) on, the potential VDD is input to the control terminals of the third switches (ASW 2, ASW 4, . . . ) corresponding to the source signal lines in the even-numbered columns. Thus, the third switches (ASW 2, ASW 4, . . . ) corresponding to the source signal lines in the even-numbered columns can be simultaneously turned on, and therefore, video signals can be simultaneously output to the source signal lines in the even-numbered columns. In this case, since the first switches (SW1-a) are turned on, signals output from the shift register 120 corresponding to the source signal lines in the odd-numbered columns (SRout 1, SRout 3, . . . ) are input to the control terminals of the third switches (ASW 1, ASW 3, . . . ) corresponding to the source signal lines in the odd-numbered columns. Since a start pulse is not input to the shift register 120, the shift register 120 does not output a sampling pulse. Therefore, the third switches (ASW 1, ASW 3, . . . ) corresponding to the source signal lines in the odd-numbered columns are turned off. Accordingly, the source signal lines in the odd-numbered columns (SLine 1, SLine 3, . . . ) are input with no signals.

When polarities of video signals to be input are changed between the first half and the last half of the one line period, source line inversion drive can be performed. Note that, the length of a period of outputting signals to the source signal lines (SLine 1 to SLine m) can be arbitrarily set.

The timing charts of FIGS. 8 and 9 show examples of performing the source line inversion drive only in the case of the power-saving drive as shown in FIG. 9; however, the present invention is not limited thereto. The source line inversion drive may also be performed in the normal drive shown in FIG. 8.

According to the above described operation, the same video signals (note that, whose polarities are inverted in each source signal line) can be output to all of the source signal lines (SLine a to SLine m) without driving the shift register 120. Consequently, power consumption of the source driver can be reduced for power consumption required for driving the shift register 120.

Other structures are the same as those of the source driver shown in FIG. 1, and will not be further described.

The video signals input to the source signal lines (SLine 1 to SLine m) are input to pixels in one row of a plurality of pixels included in a display device by the normal drive or the power-saving drive as described above. Video signals are input to the plurality of pixels in all of rows by the normal drive or the power-saving drive in the same manner so that an image is displayed by the plurality of pixels.

A source driver control circuit will be described with reference to FIG. 28C. The same portions as FIG. 28A are denoted by same reference numerals in FIG. 28C, and will not be further described. Differing from the source driver control circuit 1900 of FIG. 28A, a source driver control circuit 1912 of FIG. 28C has a control circuit 1906 having a structure different from the control circuit 1901 of FIG. 28A. In the source driver control circuit 1912, video signals readout from the memory 1902 are input to the control circuit 1906. A determination circuit 1907 included in the control circuit 1906 determines whether or not all of the video signals corresponding to pixels in one row of the plurality of pixels are equal to one another. The determination circuit 1907 outputs a first control signal (denoted by a control signal 1 in the drawing) and a second control signal (denoted by a control signal 2 in the drawing), which are different from each other, in a case where all of the video signals corresponding to pixels in one row of the plurality of pixels are equal to one another and in a case where at least two video signals among the video signals corresponding to pixels in one row of the plurality of pixels are different from each other. The first and second control signals are input to the source driver 1910. Note that, a structure of the pulse output circuit 1904 included in the control circuit 1906 is the same as FIG. 28A, and will not be further described here.

Embodiment Mode 4

Figure 10:
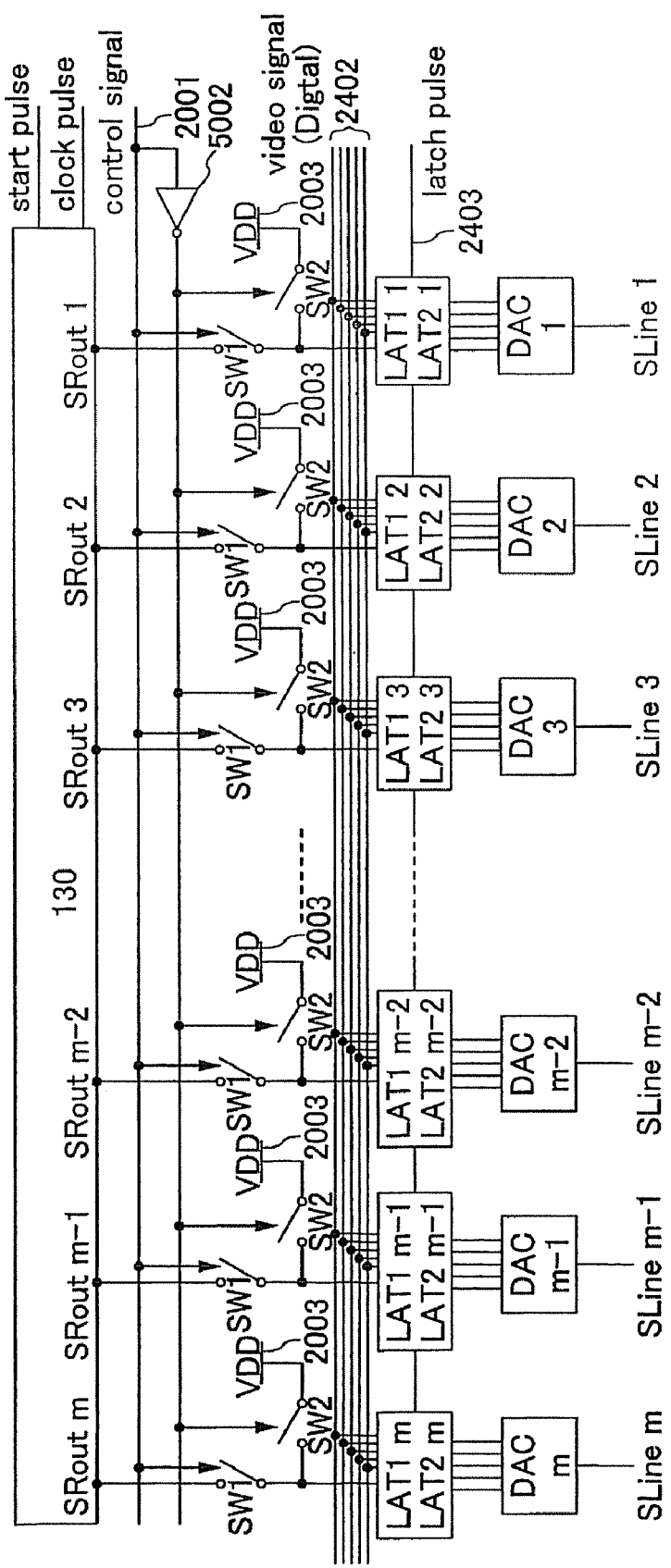
FIG. 10 is a diagram showing Embodiment Mode 4.
Figure 11:
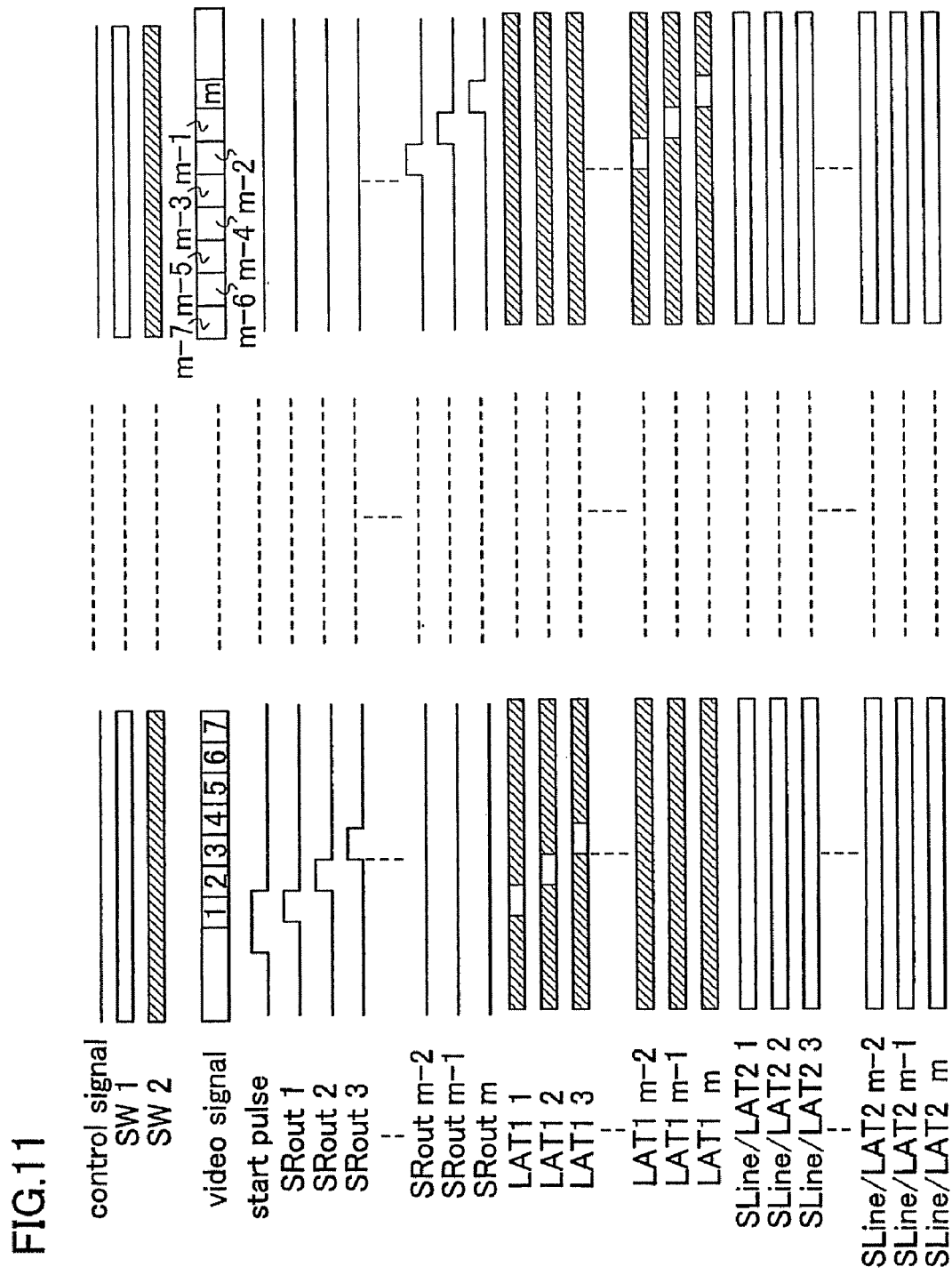
FIG. 11 is a diagram showing Embodiment Mode 4.
Figure 12:
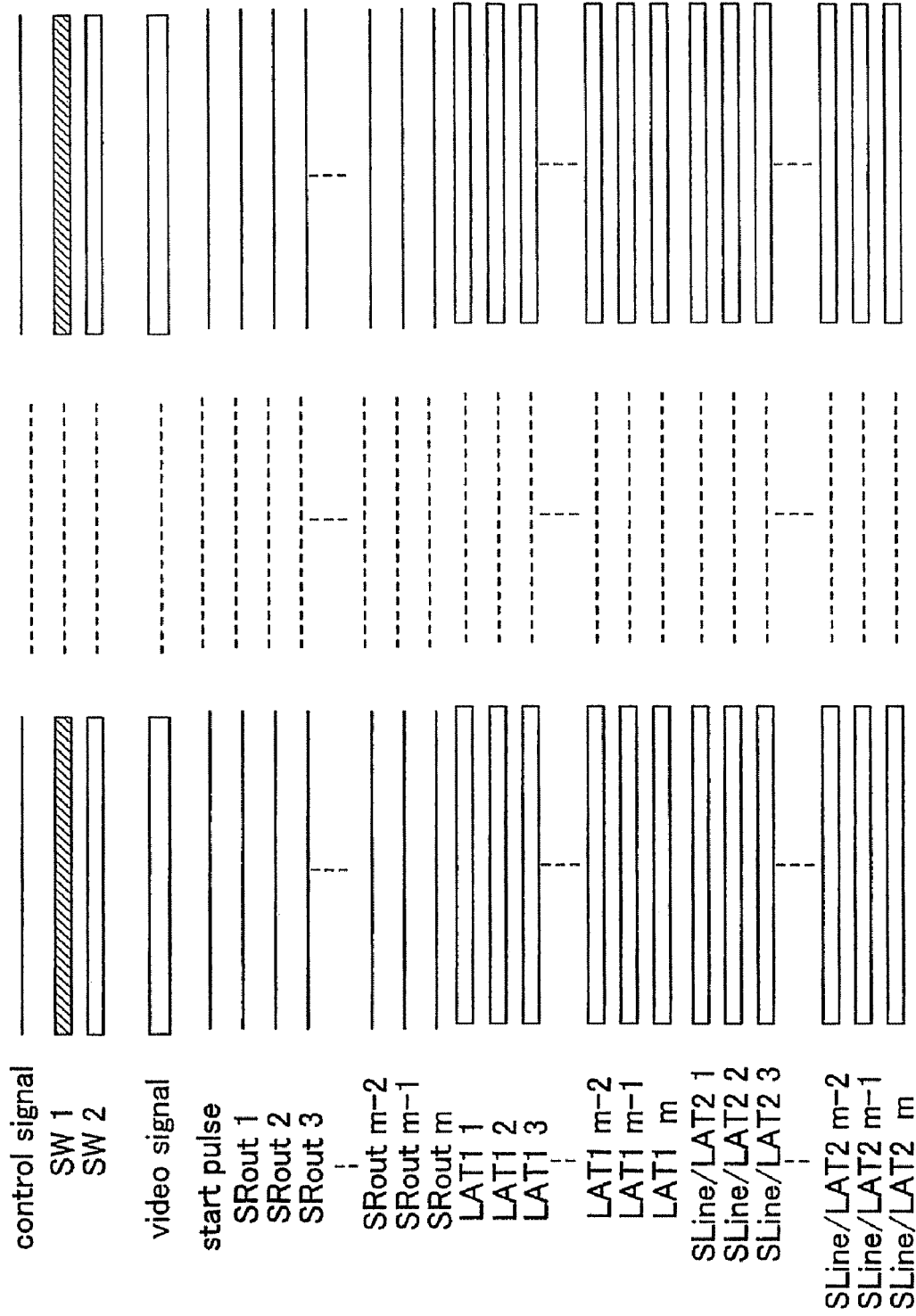
FIG. 12 is a diagram showing Embodiment Mode 4.

Embodiment Mode 4 is an embodiment mode corresponding to the second driving method and the fourth circuit structure. Embodiment Mode 4 will be described with reference to FIGS. 10, 11, and 12. FIG. 10 is a diagram showing a structure of a source driver of a display device. FIGS. 11 and 12 are timing charts showing driving methods of the source driver shown in FIG. 10.

The source driver shown in FIG. 10 has a structure in which in the source driver shown in FIG. 1 of Embodiment Mode 1, digital video signals are employed as the video signals, and image signal input lines, to which the video signals are input, are provided for each bit of the digital video signals. That is, when the digital video signals are n (n is a natural number) bits, n pieces of image signal input lines are provided. The source driver shown in FIG. 10 corresponds to an example where n is 4. Further, the source driver shown in FIG. 10 includes first latch circuits (denoted by LAT1 1 to LAT1 m in the drawing), second latch circuits (denoted by LAT2 1 to LAT2 m in the drawing), and a wiring 2403 for inputting signals to the second latch circuits (LAT2 1 to LAT2 m).

The normal drive will be described with reference to FIG. 11. In the normal drive, the first switches (SW1) are turned on by a control signal input to the wiring 2001 whereas the second switches (SW2) are turned off by an inverted control signal input to the wiring 2001. The inversion of the control signal is performed by the inverter 5002. A start pulse is input to a shift register 130, and sampling pulses output from the shift register are input to control terminals of the first latch circuits (LAT1 1 to LAT1 m). When the sampling pulses are input to the control terminals, each of the first latch circuits (LAT1 1 to LAT1 m) stores a digital video signal (a 4-bit digital video signal) to be input to wirings 2402. The wirings 2402 correspond to a plurality of image signal input lines. Thus, the first latch circuits (LAT1 1 to LAT1 m) sequentially store digital video signals input to the wirings 2402. The 4-bit digital video signals stored in the first latch circuits (LAT1 1 to LAT1 m) are simultaneously input and stored in the second latch circuits (LAT2 1 to LAT2 m) in synchronization with a latch pulse input to the wirings 2403. The 4-bit digital video signals stored in the second latch circuits (LAT2 1 to LAT2 m) are input to D/A converter circuits (denoted by DAC1 to DACm in the drawing). The D/A converter circuits (DAC1 to DACm) convert the 4-bit digital video signals into corresponding analog signals. The converted analog signals (analog video signals) are simultaneously output to the source signal lines (SLine 1 to SLine m). Thus, a driving method (line sequential drive) by which signals are simultaneously output to the source signal lines (SLine 1 to SLine m), is performed.

Note that, in each of the timing charts shown in FIG. 11 and FIG. 12, a condition of signals of one source signal line (SLine p, wherein p is a natural number equal to or lower than m) of the source signal lines (SLine 1 to SLine m) and the second latch circuit (LAT2 p) corresponding to the source signal line (SLine p), is collectively denoted by SLine/LAT2 p. In FIG. 11, SLine/LAT2 p indicates a state that a digital video signal, which is stored in the first latch circuit (LAT1 p), or a signal obtained by converting the digital video signal into an analog video signal is output by a sampling pulse before one line period.

The power-saving drive will be described with reference to FIG. 12. In the power-saving drive, the first switches (SW1) are turned off by a control signal whereas the second switches (SW2) are turned on by an inverted signal of the control signal. By turning the first switches (SW1) off, an output terminal of a shift register 130 is disconnected to control terminals of the first latch circuits (LAT1 1 to LAT1 m). Under this condition, a start pulse input from the shift register 130 is stopped. Thus, driving of the shift register 130 is stopped. By turning the second switches (SW2) on, potential VDD applied to power source terminals 2003 is simultaneously input to all of the control terminals of the first latch circuits (LAT1 1 to LAT1 m). The potential VDD is set such that digital video signals input to the wirings 2402 are stored when the potential VDD is input to the control terminals of the first latch circuits (LAT1 1 to LAT1 m). Thus, video signals corresponding to all of the source signal lines (SLine 1 to SLine m) can be simultaneously stored in the first latch circuits (LAT1 1 to LAT1 m). Accordingly, the digital video signals corresponding to all of the source signal lines (SLine 1 to SLine m) can be simultaneously stored in the first latch circuits (LAT1 1 to LAT1 m) without driving the shift register 130. The thus stored digital video signals are converted into analog video signals and can be simultaneously output to the source signal lines (SLine 1 to SLine m). Note that, the length of a period of outputting the signals to the source signal lines (SLine 1 to SLine m) can be arbitrarily set.

In a case where source line inversion drive is performed in the source driver described in this embodiment mode with reference to FIG. 10, polarities of analog video signals may be inverted between the source signal lines corresponding to odd-numbered columns and the source signal lines corresponding to even-numbered columns by the D/A converter circuits (DAC1 to DACm).

According to the above described operation, the same video signals can be simultaneously output to all of the source signal lines (SLine 1 to SLine m) without driving the shift register 130. Therefore, power consumption of the source driver can be reduced for power consumption required for operating the shift register 130.

The video signals input to the source signal lines (SLine 1 to SLine m) by the normal drive or the power-saving drive as described above, are input to pixels in one row of a plurality of pixels included in a display device. Video signals are input to the plurality of pixels in all of rows by the normal drive or the power-saving drive in the same manner so that an image is displayed by the plurality of pixels.

Note that, the power source terminals 2003 may be applied with the potential VDD when the second switches (SW2) are turned on. As a signal input to the power source terminals 2003, for example, a control signal input to the wiring 2001 or a start pulse may be used.

The source driver shown in FIG. 10 has a structure in which the second switch (SW2) is provided in each of the source signal lines (SLine 1 to SLine m); however, the present invention is not limited thereto. A plurality of source signal lines can share one second switch (SW2).

A source driver control circuit has the similar structure to the one described in FIG. 28A of Embodiment Mode 1. However, differing from the source driver control circuit shown in FIG. 28A, in the source driver control circuit of this embodiment mode, the video signals are digital video signals, and signals corresponding to each bit of the digital video signals are input to the plurality of image signal input lines.

Embodiment Mode 5

Figure 13:
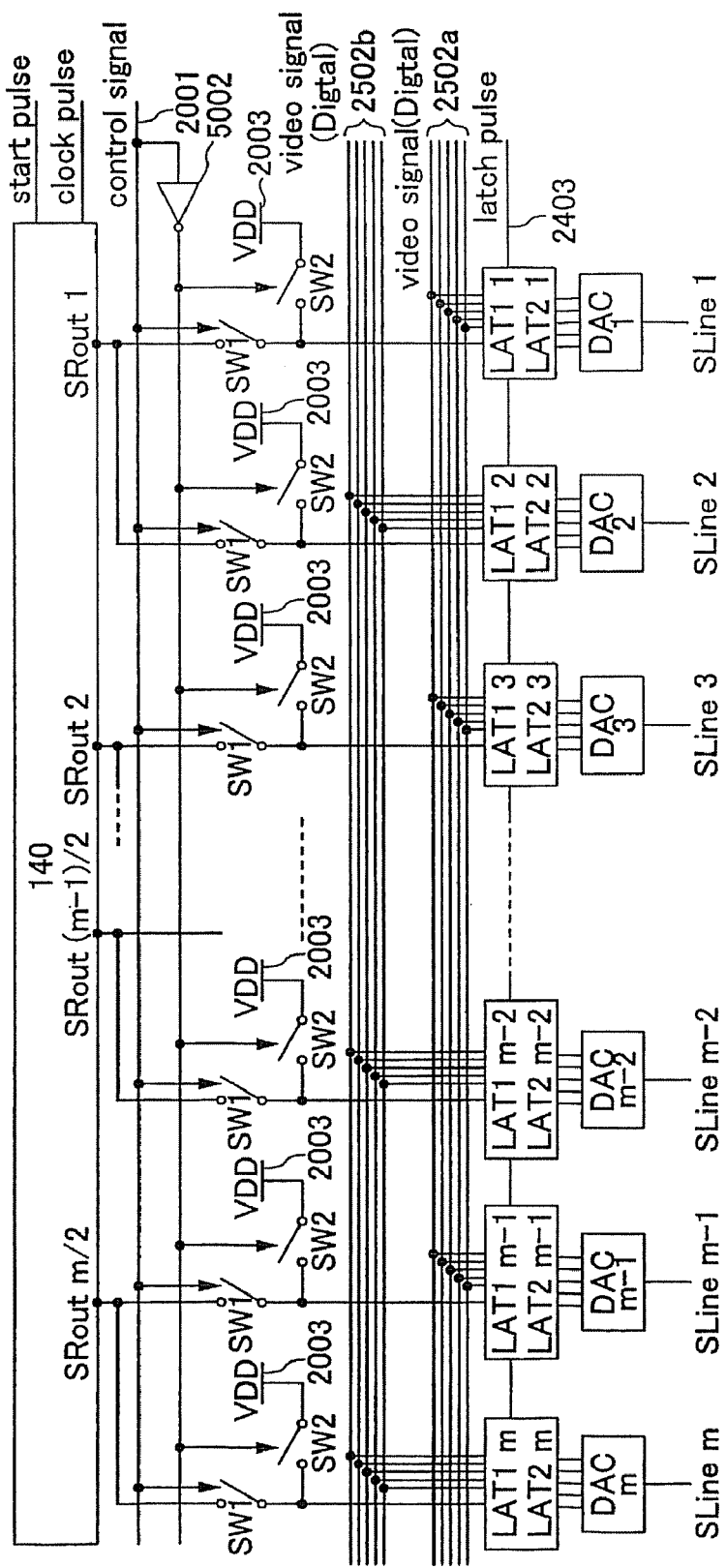
FIG. 13 is a diagram showing Embodiment Mode 5.
Figure 14:
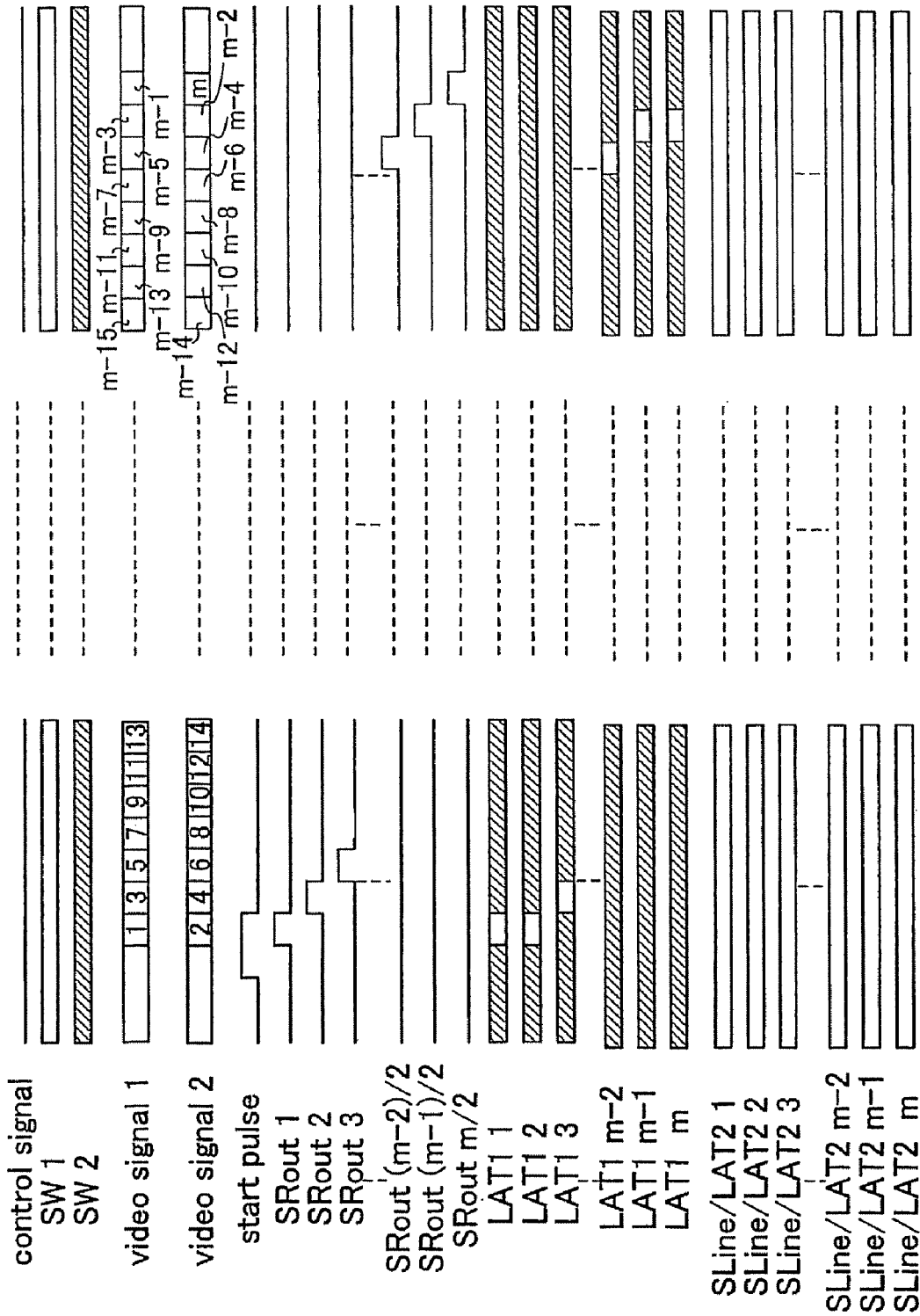
FIG. 14 is a diagram showing Embodiment Mode 5.
Figure 15:
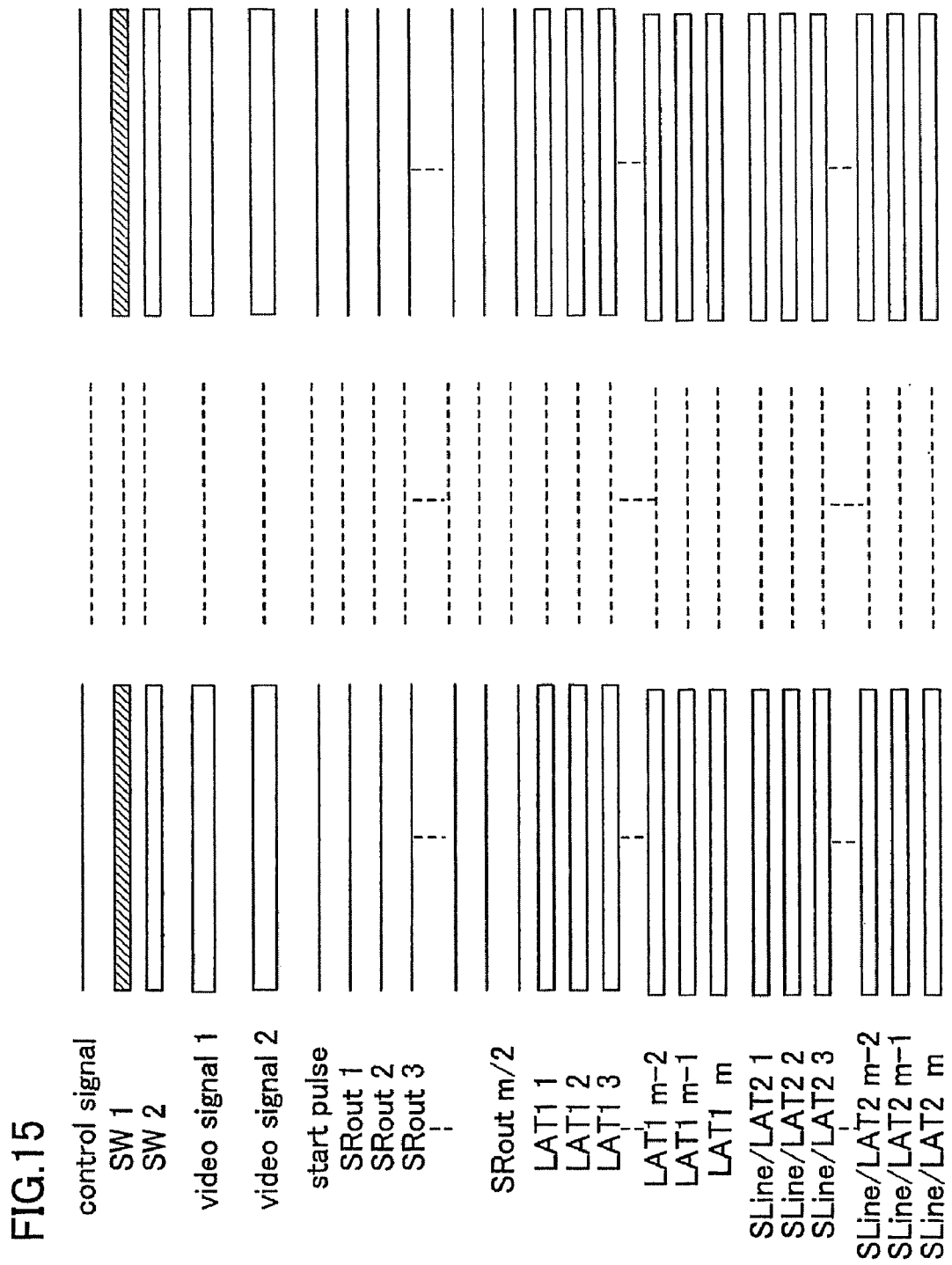
FIG. 15 is a diagram showing Embodiment Mode 5.

Embodiment Mode 5 is an embodiment mode corresponding to the second driving method and the fifth circuit structure. Embodiment Mode 5 will be described with reference to FIGS. 13, 14, and 15. FIG. 13 is a diagram showing a structure of a source driver of a display device. FIGS. 14 and 15 are timing charts showing driving methods of the source driver shown in FIG. 13. In FIGS. 13, 14, and 15, the same portions as those of FIGS. 10, 11, and 12 are denoted by the same reference numerals, and will not be further described here.

The source driver shown in FIG. 13 has a feature of providing two wirings 2502a and 2502b instead of the wirings 2402 shown in FIG. 10. Specifically, differing from the source driver shown in FIG. 10, the two units of wirings corresponding to a plurality of image signal input lines are provided in the source driver shown in FIG. 13. Each of source signal lines in odd-numbered columns is connected to the wiring 2502a while each of source signal lines in even-numbered columns is connected to the wiring 2502b through one first latch circuit (LAT1 p, wherein p is a natural number equal to or lower than m) of the plurality of first latch circuits, one second latch circuit (LAT2 p) of the plurality of second latch circuits, and one D/A converter circuit (DACp) of the plurality of D/A converter circuits. A first digital video signal is input to the wiring 2502a whereas a second digital video signal is input to the wiring 2502b. By inverting a polarity of the second digital video signal with respect to the first digital video signal, source line inversion drive can be performed.

The normal drive will be described with reference to FIG. 14. In the normal drive, the first switches (SW1) are turned on by a control signal input to the wiring 2001 whereas the second switches (SW2) are turned off by an inverted signal of the control signal input to the wiring 2001. The inversion of the control signal is performed by the inverter 5002. A start pulse is input to a shift register 140, and the first digital video signal and the second digital video signal are sequentially stored in the first latch circuits (LAT1 1 to LAT1 m) by sampling pulses output from the shift register. An operation of converting the stored digital video signals into analog video signals and outputting the analog video signals to the source signal lines, is the same as Embodiment Mode 4, and will not be further described.

Note that, in the source driver shown in this embodiment mode, the two units of wirings corresponding to the plurality of image signal input lines (the wirings 2502a and 2502b) are provided. Thus, the first digital video signal corresponding to one source signal line (SLine p, wherein p is an odd number equal to or lower than m) of the source signal lines in the odd-numbered columns and the second digital video signal corresponding to one source signal line (SLine p+1) of the source signal lines in even-numbered columns, which is adjacent to the source signal line in the odd-numbered column (SLine p), can be simultaneously sampled. That is, in the normal drive, the first latch circuit (LAT1 p) corresponding to the source signal line (SLine p) and the first latch circuit (LAT1 p+1) corresponding to the source signal line (SLine p+1) can be simultaneously made into a state where digital video signals can be stored. Accordingly, one output terminal of the source driver may be provided for the first latch circuit (LAT1 p) and the first latch circuit (LAT1 p+1). Therefore, the source driver shown in this embodiment mode requires about half the number of output terminals of the shift register 140 required for the source driver shown in Embodiment Mode 4. FIG. 13 shows an example in which m is set to an even number and the number of output terminals of the shift register 140 is set to be SLine 1 to SLine m/2. Thus, a drive frequency of the shift register 140 can be reduced.

In general, it may be possible to employ a driving method (hereinafter, referred to as source line division drive, wherein k is referred to as division number), in which k (k is a natural number equal to or more than 2) units of a plurality of image signal input lines, to which different video signals are input, are provided, a plurality of source signal lines are divided into units each having k pieces of the source signal lines, and k pieces of first latch circuits corresponding to the k pieces of the source signal lines are simultaneously made into a state where digital video signals can be input to the first latch circuits.

In this embodiment mode, an example of combining the source line inversion drive and source line division drive of a division number 2, is shown. Alternatively, the present invention can be combined with source line division drive of an arbitrary division number. Note that, when combining the source line inversion drive and the source line division, drive of a division number k, k is necessary to be an even number. Further, only the source line division drive of an arbitrary division number may be performed. Furthermore, when the source line inversion drive is not performed, polarities of video signals input to plurality units of image signal input lines are not necessary to be inverted.

Next, the power-saving drive will be described with reference to FIG. 15. In the power-saving drive, the first switches (SW1) are turned off by a control signal whereas the second switches (SW2) are turned on by an inverted signal of the control signal. By turning the first switches (SW1) off, the shift register 140 and the control terminals of the first latch circuits (LAT1 1 to LAT1 m) are disconnected. Under this condition, start pulses input to the shift register 140 are stopped. Thus, driving of the shift register 140 is stopped.

By turning the second switches (SW2) on, the power source terminals 2003 are connected to the control terminals of the first latch circuits (LAT1 1 to LAT1 m). The power source terminals 2003 are supplied with the predetermined potential VDD. Therefore, by turning the second switches (SW2) on, the potential VDD is input to the control terminals of all of the first latch circuits (LAT1 1 to LAT1 m). The potential VDD is set such that the first latch circuits (LAT1 1 to LAT1 m) are made into a state where digital video signals can be stored when the potential VDD is input to the control terminals of the first latch circuits (LAT1 1 to LAT1 m). Thus, digital video signals can simultaneously be stored in all of the first latch circuits (LAT1 1 to LAT1 m). Thus, an analog signal, which is generated by converting the first digital video signal, or a signal whose polarity is inverted can be output simultaneously in all of the source signal lines (SLine 1 to SLine m). Note that, the length of a period of outputting signals to the source signal lines (SLine 1 to SLine m) can be arbitrarily set.

According to the above described operation, analog video signals corresponding to the same video signals (note that, signals whose polarities are inverted for each source signal line) can be simultaneously output to all of the source signal lines (SLine 1 to Sline m) without driving the shift register 140. Therefore, power consumption of the source driver can be reduced for power consumption required for operating the shift register 140.

Other structures are the same as the source driver shown in FIG. 10, and will not be further described.

The video signals, which are input to the source signal lines (SLine 1 to SLine m) by the above described normal drive or power-saving drive, are input to one row of a plurality of pixels included in a display device. Video signals are input to the plurality of pixels in all of rows by the normal drive or the power-saving drive in the same manner so that an image is displayed by the plurality of pixels.

A source driver control circuit has the similar structure to the one described in FIG. 28B of Embodiment Mode 2. However, differing from the source driver control circuit shown in FIG. 28B, in the source driver control circuit of this embodiment mode, the video signals are digital video signals, and signals corresponding to each bit of the digital video signals are input to the plurality of image signal input lines.

Embodiment Mode 6

Figure 16:
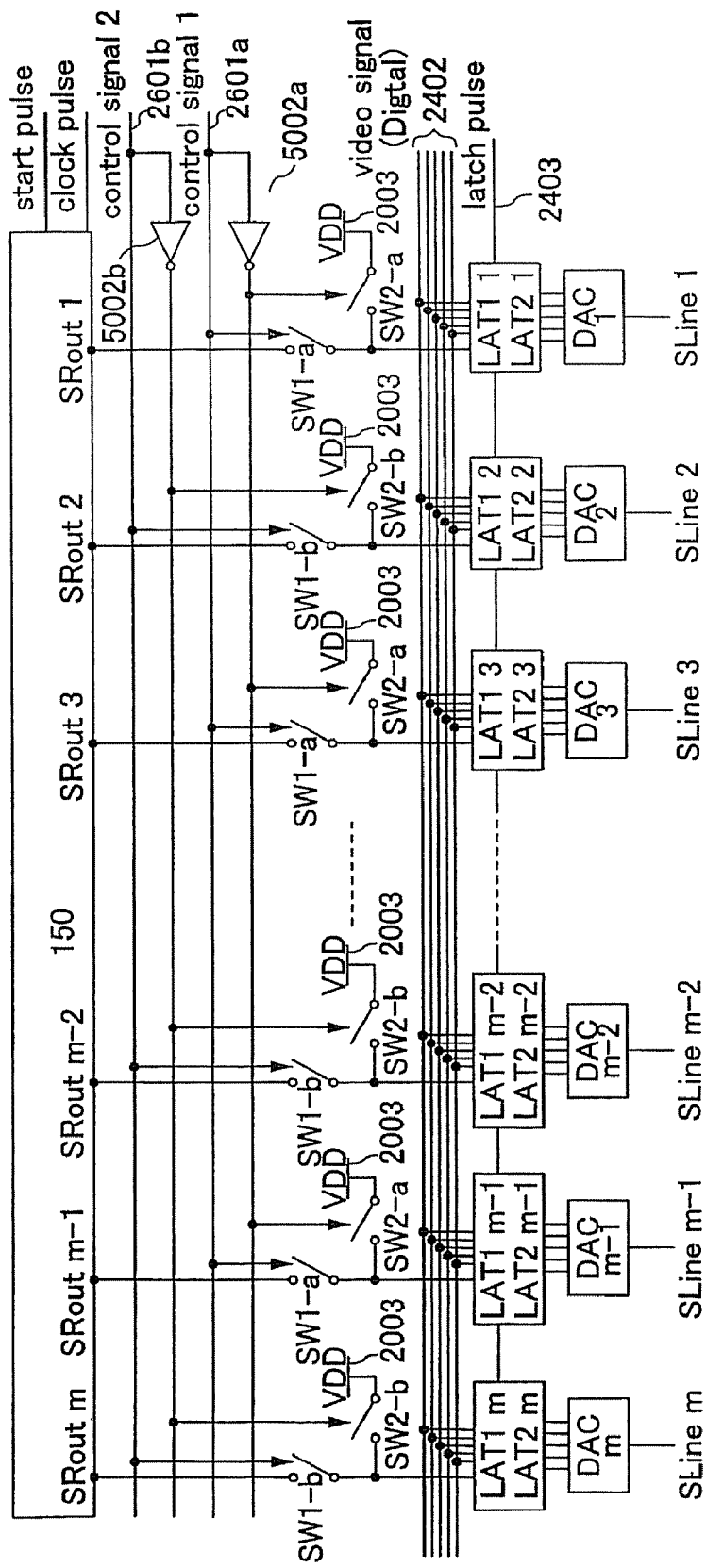
FIG. 16 is a diagram showing Embodiment Mode 6.
Figure 17:
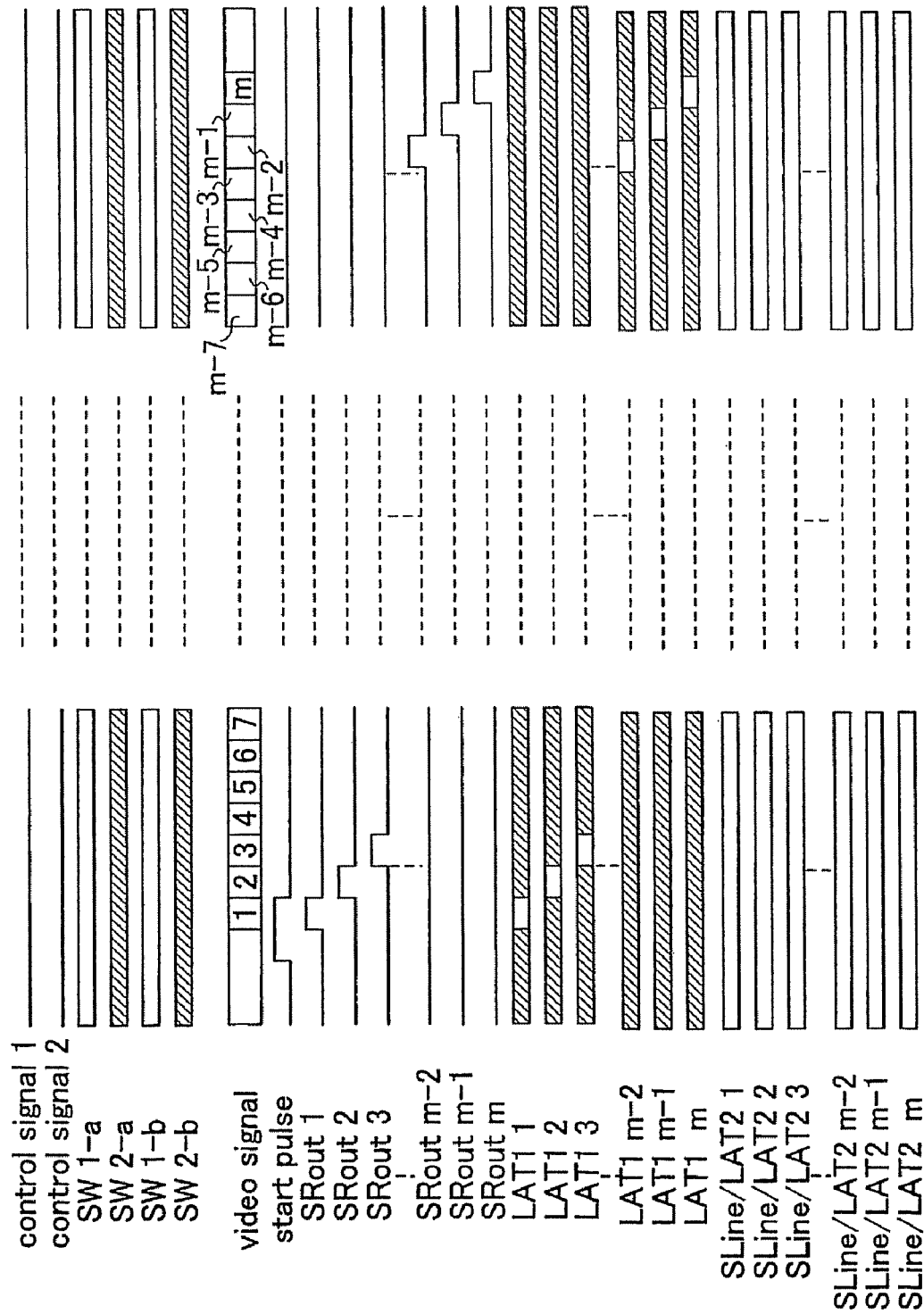
FIG. 17 is a diagram showing Embodiment Mode 6.
Figure 18:
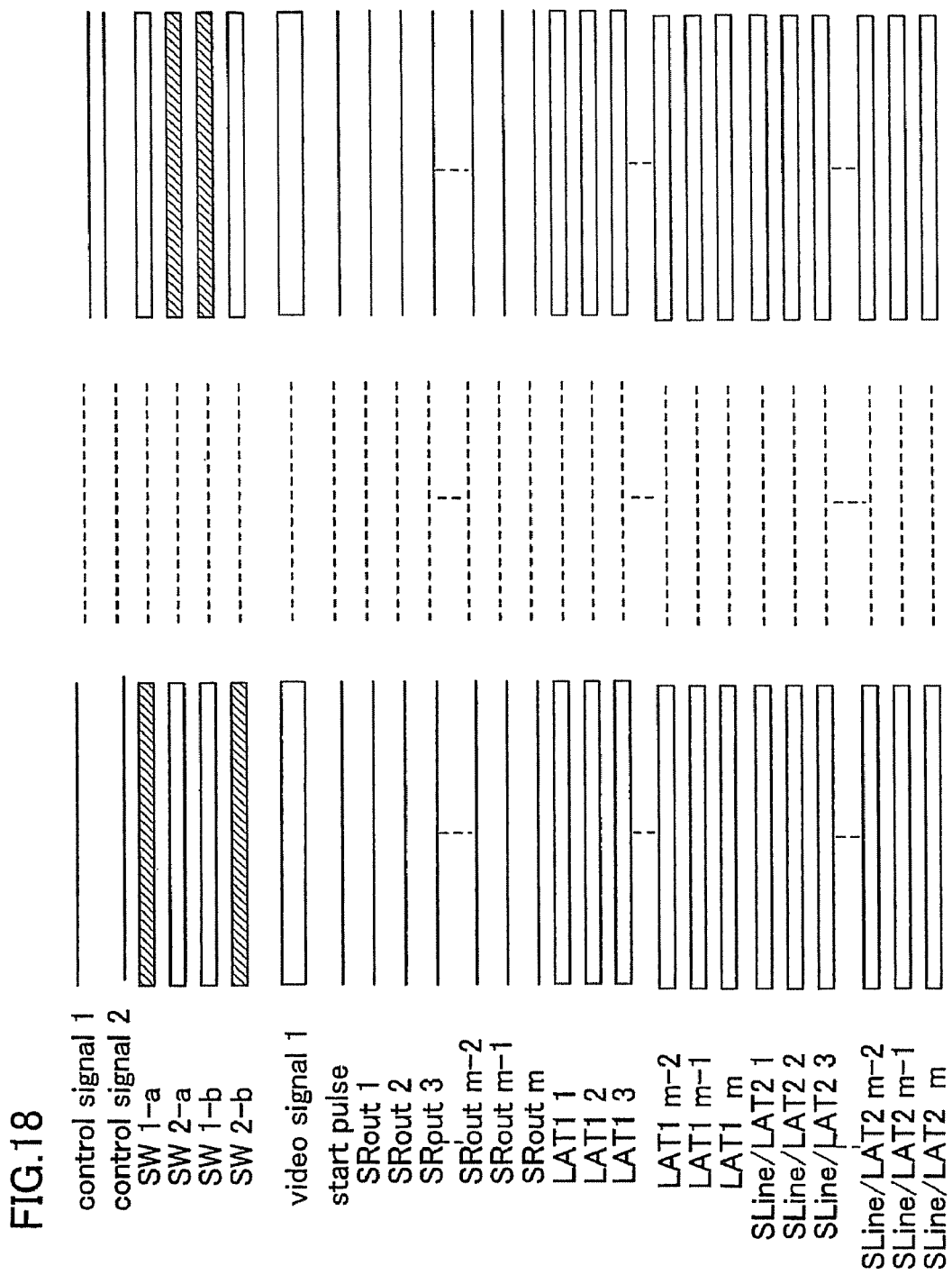
FIG. 18 is a diagram showing Embodiment Mode 6.

Embodiment Mode 6 is an embodiment mode corresponding to the second driving method and the sixth circuit structure. Embodiment Mode 6 will be described with reference to FIGS. 16, 17, and 18. FIG. 16 is a diagram showing a structure of a source driver of a display device. FIGS. 17 and 18 are timing charts showing driving methods of the source driver shown in FIG. 16. In FIGS. 16, 17, and 18, the same portions as those of FIGS. 10, 11 and 12 are denoted by the same reference numerals, and will not be further described.

The source driver shown in FIG. 16 has a feature of including a wiring 2601a and a wiring 2601b instead of the wiring 2001 of the source driver shown in FIG. 10. That is, differing from the source driver shown in FIG. 10, the source driver shown in FIG. 16 has the two wirings, to which control signals are input. A first control signal (denoted by a control signal 1 in the drawing) is input to the wiring 2601a whereas a second control signal (denoted by a control signal 2 in the drawing) is input to the wiring 2601b.

The first control signal input to the wiring 2601a is input to control terminals of first switches (SW1-a) corresponding to each of source signal lines in odd-numbered columns (SLine 1, SLine 3, . . . ). An inverted signal of the first control signal, which is input to the wiring 2601a, is input to control terminals of second switches (SW2-a) corresponding to each of the source signal lines in the odd-numbered columns (SLine 1, SLine 3, . . . ). The inversion of the first control signal is performed by an inverter 5002a. A second control signal input to the wiring 2601b is input to control terminals of first switches (SW1-b) corresponding to each of source signal lines in even-numbered columns (SLine 2, SLine 4, . . . ). An inverted signal of the second control signal, which is input to the wiring 2601b, is input to control terminals of second switches (SW2-b) corresponding to each of the source signal lines in the even-numbered columns (SLine 2, SLine 4, . . . ). The inversion of the second control signal is performed by an inverter 5002b. When the first switches (SW1-a) are turned on, the second switches (SW2-a) are turned off, whereas when the second switches (SW2-a) are turned on, the first switches (SW1-a) are turned off. When the first switches (SW1-b) are turned on, the second switches (SW2-b) are turned off, whereas when the second switches (SW2-b) are turned on, the first switches (SW1-b) are turned off. Further, when performing source line inversion drive, in a case where the first switches (SW1-a) are turned on, the first switches (SW1-b) are turned off. In a case where the first switches (SW1-a) are turned off, the first switches (SW1-b) are turned on.

The normal drive will be described with reference to FIG. 17. In the normal drive, the first switches (SW1-a) are turned on by a first control signal whereas the second switches (SW2-a) are turned off by an inverted signal of the first control signal. Further, the first switches (SW1-b) are turned on by a second control signal whereas the second switches (SW2-b) are turned off by an inverted signal of the second control signal. A start pulse is input to a shift register 150, and digital video signals are sequentially stored in first latch circuits (LAT1 1 to LAT1 m) by sampling pulses output from the shift register. An operation of inverting the stored digital video signals into analog video signals and outputting the analog video signals to the source signal lines, is the same as Embodiment Mode 4, and will not be further described.

Next, the power-saving drive will be described with reference to FIG. 18. A period of outputting digital video signals corresponding to pixels in one row to the first latch circuits (LAT1 1 to LAT1 m) (hereinafter, referred to as one line sampling period) is divided into first half and last half Digital video signals are stored in the first latch circuits corresponding to odd-numbered columns of one of the first half and the last half, and digital video signals are stored in the first latch circuits corresponding to even-numbered columns in the other of the first half and the last half. In the first half and the last half of one line sampling period, by changing polarities of the input video signals, source line inversion drive can be performed. In this embodiment mode, an example where digital video signals are stored in the first latch circuits corresponding to the source signal lines in the odd-numbered columns in the first half of the one line sampling period whereas digital video signals are stored in the first latch circuits corresponding to the source signal lines in the even-numbered columns in the last half thereof, will be described.

In the first half of the one line sampling period, the first switches (SW1-a) are turned off by the first control signal whereas the second switches (SW2-a) are turned on by an inverted signal of the first control signal. The first switches (SW1-b) are turned on by a second control signal while the second switches (SW2-b) are turned off by an inverted signal of the second control signal. By turning the first switches (SW1-a) off, an output terminal of the shift register 150 is disconnected to the control terminals of the first latch circuits (LAT1 1 to LAT1 m) corresponding to the source signal lines in the odd-numbered columns. Under this condition, a start pulse input to the shift register 150 is stopped. Thus, driving of the shift register 150 is stopped.

Since the second switches (SW2-*a*) are turned on, power source terminals 2003 are connected to control terminals of the first latch circuits (LAT1 1, LAT1 3, . . . ) corresponding to the source signal lines in the odd-numbered columns. The power source terminals 2003 are supplied with the predetermined potential VDD. Therefore, by turning the second switches (SW2-*a*) on, the potential VDD is input to the control terminals of the first latch circuits (LAT1 1, LAT1 3, . . . ) corresponding to the source signal lines in the odd-numbered columns. The potential VDD is set such that the first latch circuits (LAT1 1 to LAT1 m) can store the digital video signals when the potential VDD is input to the control terminals of the first latch circuits (LAT1 1 to LAT1 m). Thus, the digital video signals can be simultaneously stored in the first latch circuits (LAT1 1, LAT1 3, . . . ) corresponding to the source signal lines in the odd-numbered columns. In this case, since the first switches (SW1-*b*) are turned on, signals output from the shift register 150 corresponding to the source signal lines in the even-numbered columns (SRout 2, SRout 4, . . . ) are input to the control terminals of the first latch circuits (LAT1 2, LAT1 4, . . . ) corresponding to the source signal lines in the even-numbered columns. Since a start pulse is not input to the shift register 150, the shift register 150 does not output a sampling pulse. Therefore, new video signals are not stored in the first latch circuits (LAT1 2, LAT1 4, . . . ) corresponding to the source signal lines in the even-numbered columns. Accordingly, only the digital video signals sampled previous to the one line sampling period are stored in the first latch circuits (LAT1 2, LAT1 4, . . . ) corresponding to the source signal lines in the even-numbered columns.

In the last half of the one line period, the first switches (SW1-*a*) are turned on by the first control signal while the second switches (SW2-*a*) are turned off by an inverted signal of the first control signal. The first switches (SW1-*b*) are turned off by the second control signal while the second switches (SW2-*b*) are turned on by an inverted signal of the second control signal. By turning the first switches (SW1-*b*) off, an output terminal of the shift register 150 is disconnected to the control terminals of first latch circuits (LAT1 2, LAT1 4, . . . ) corresponding to the source signal lines in the even-numbered columns. Under this condition, a start pulse input to the shift register 150 is stopped. Thus, driving of the shift register 150 is stopped.

Since the second switches (SW2-*b*) are turned on, the power source terminals 2003 are connected to the control terminals of the first latch circuits (LAT1 2, LAT1 4, . . . ) corresponding to the source signal lines in the even-numbered columns. The power source terminals 2003 are supplied with the predetermined potential VDD. Therefore, by turning the second switches (SW2-*b*) on, the potential VDD is input to the control terminals of the first latch circuits (LAT1 2, LAT1 4, . . . ) corresponding to the source signal lines in the even-numbered columns. Thus, digital video signals can be simultaneously stored in the first latch circuits (LAT1 2, LAT1 4, . . . ) corresponding to the source signal lines in the even-numbered columns. In this case, since the first switches (SW1-*a*) are turned on, signals output from the shift register 150 (SRout 1, SRout 3, . . . ) corresponding to the source signal lines in the odd-numbered columns are input to the control terminals of the first latch circuits (LAT1 1, LAT1 3, . . . ) corresponding to the source signal lines in the odd-numbered columns. Since a start pulse is not input to the shift register 150, the shift register 150 does not output a sampling pulse. Therefore, new digital video signals are not stored in the first latch circuits (LAT1 1, LAT1 3, . . . ) corresponding to the source signal lines in the odd-numbered columns. Accordingly, only the digital video signals sampled in the first half of the one line sampling period are stored in the first latch circuits (LAT1 1, LAT1 3, . . . ) corresponding to the source signal lines in the odd-numbered columns.

When polarities of input digital video signals are changed between the first half and the last half of the one line sampling period, source line inversion drive can be performed. Note that, the length of a period of outputting signals to the source signal lines (SLine 1 to SLine m) can be arbitrarily set.

The timing charts of FIGS. 17 and 18 show examples of performing the source line inversion drive only in the case of the power-saving drive as shown in FIG. 18; however, the present invention is not limited thereto. The source line inversion drive may also be performed in the normal drive shown in FIG. 17.

In accordance with the above described operation, analog signals corresponding to the same digital video signals (note that, whose polarities are inverted in each source signal line) can be output to all of the source signal lines (SLine a to SLine m) at the same time without driving the shift register 150. Consequently, power consumption of the source driver can be reduced for power consumption required for driving the shift register 150.

Other structures are the same as those of the source driver shown in FIG. 10, and will not be further described.

The video signals input to the source signal lines (SLine 1 to SLine m) by the normal drive or the power-saving drive as described above, are input to pixels in one row of a plurality of pixels included in a display device. Video signals are input to the plurality of pixels in all of rows by the normal drive or the power-saving drive in the same manner so that an image is displayed by the plurality of pixels.

A source driver control circuit has the similar structure to the one shown in FIG. 28C of Embodiment Mode 3. However, differing from the source driver control circuit shown in FIG. 28C, in the source driver control circuit of this embodiment mode, the video signals are digital video signals, and signals corresponding to each bit of the digital video signals are input to the plurality of image signal input lines.

Embodiment Mode 7

Figure 19:
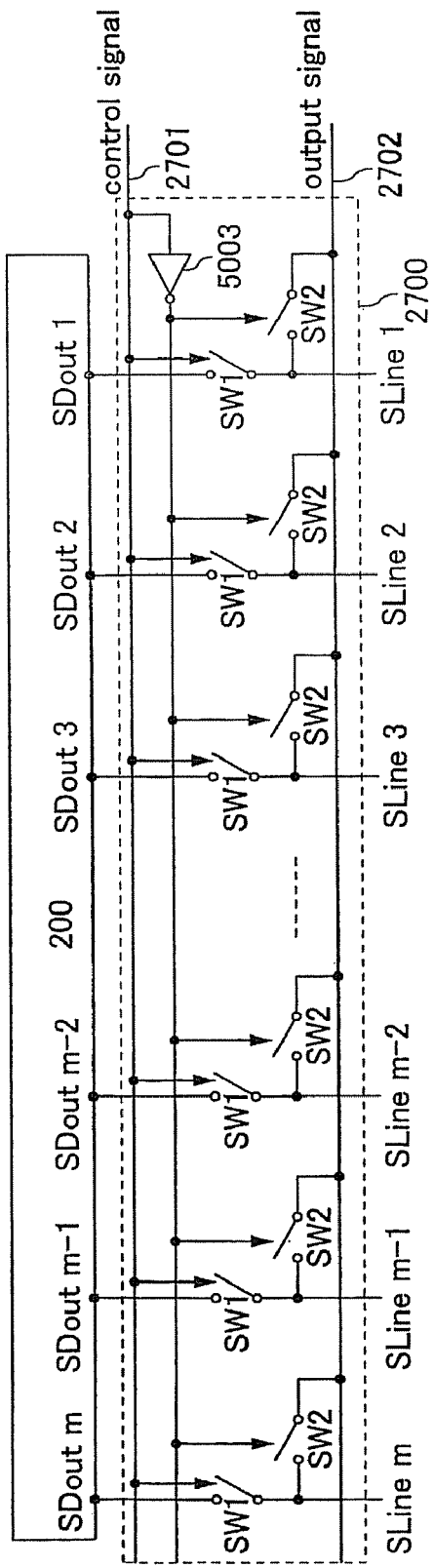
FIG. 19 is a diagram showing Embodiment Mode 7.
Figure 20:
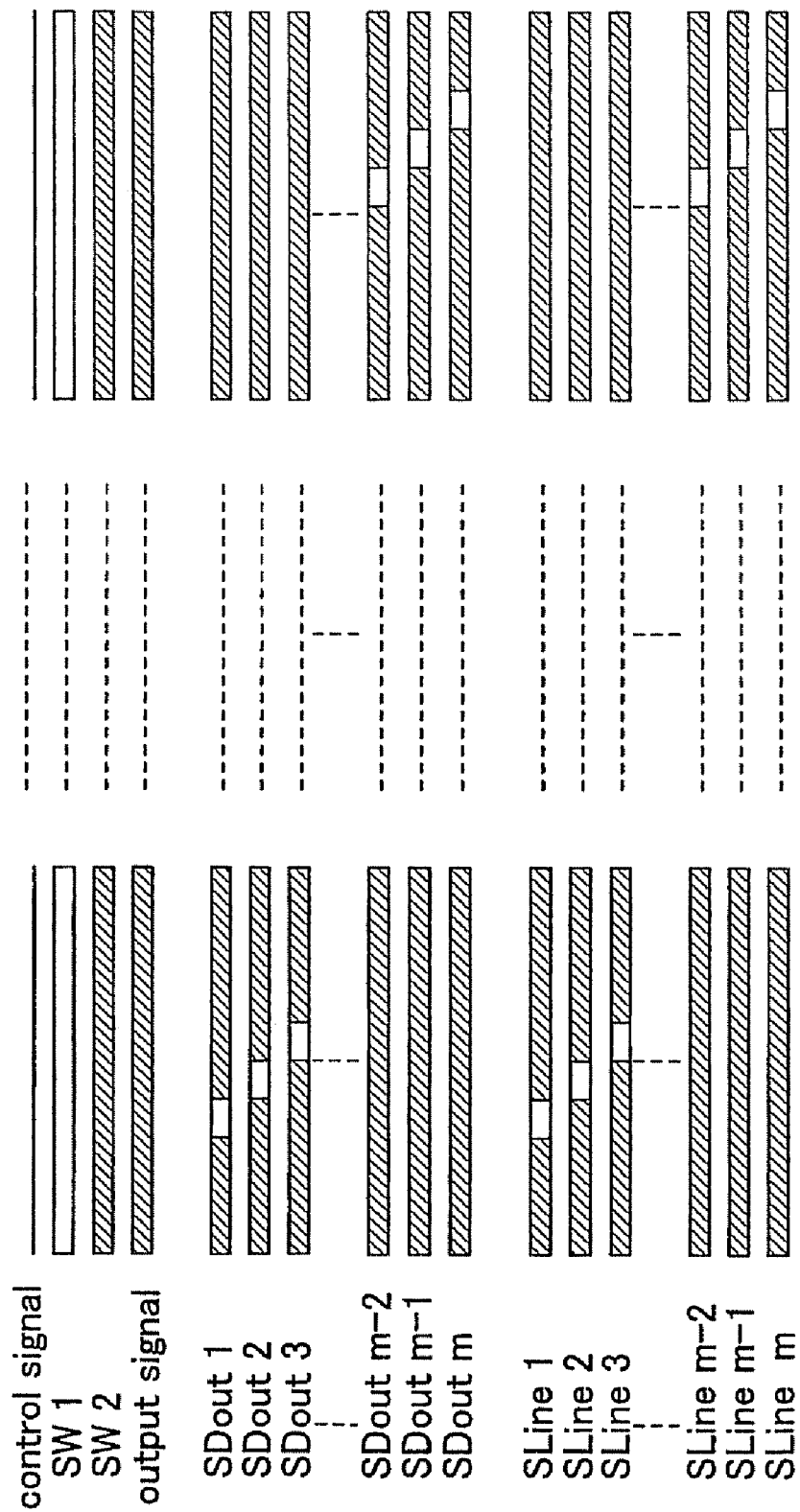
FIG. 20 is a diagram showing Embodiment Mode 7.
Figure 21:
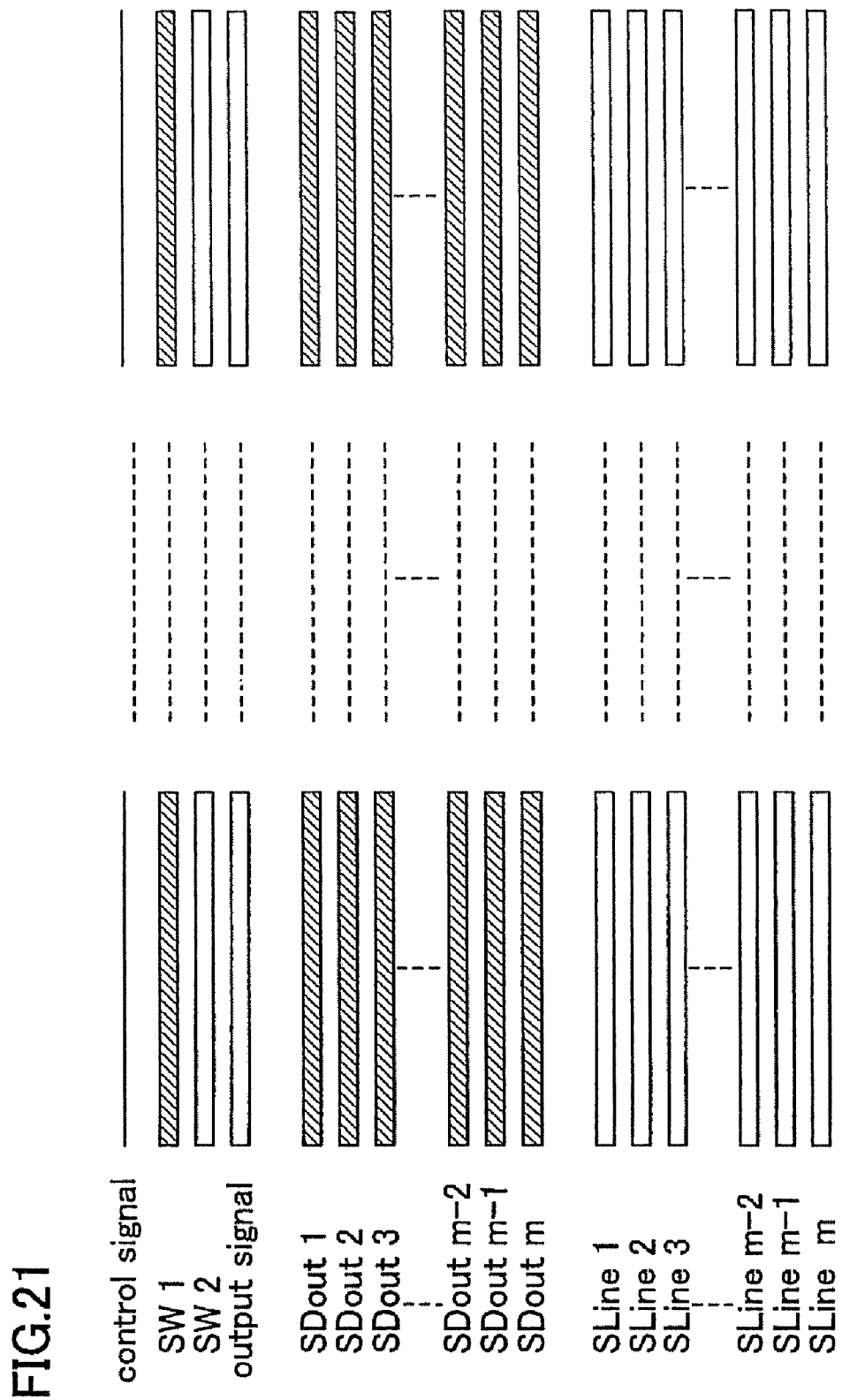
FIG. 21 is a diagram showing Embodiment Mode 7.

Embodiment Mode 7 is an embodiment mode corresponding to the third driving method and the seventh circuit structure. Embodiment Mode 7 will be described with reference to FIGS. 19, 20, and 21. FIG. 19 is a diagram showing a structure of a source driver of a display device and a switching circuit for selectively outputting signals output from the source driver to a plurality of source signal lines. FIGS. 20 and 21 are timing charts showing driving methods of the source driver and the switching circuit shown in FIG. 19.

In a structure of this embodiment mode shown in FIG. 19, a switching circuit 2700 is provided in an output portion of a source driver 200 having an arbitrary structure. In the structure of this embodiment mode, in a case of inputting the same video signals to all of pixels in one row of a plurality of pixels, the video signals are written in source signal lines without driving the source driver 200 regardless of line sequential drive or dot sequential drive. As one example, a timing chart in a case of the dot sequential drive is shown in each of FIGS. 20 and 21. A video signal output from the source driver 200 may be either a digital video signal or an analog video signal.

The normal drive will be described with reference to FIG. 20. In the normal drive, first switches (SW1) are turned on by a control signal input to a wiring 2701 whereas second switches (SW2) are turned off by an inverted signal of the control signal. The inversion of the control signal is performed by an inverter 5003. By turning the first switches (SW1) on, output terminals (denoted by SDout 1 to SDout m in the drawing) of the source driver are connected to the source signal lines (SLine 1 to SLine m). By turning the second switches (SW2) off, the wiring 2702, which is kept at the predetermined potential, is disconnected to the source signal lines (SLine 1 to SLine m). The wiring 2702 is also referred to as an output signal line. A start pulse is input to a shift register included in the source driver 200, and video signals are sequentially output from the output terminals (SDout 1 to SDout m) of the source driver 200. The output video signals are input to the source signal lines (SLine 1 to SLine m).

The power-saving drive will be described with reference to FIG. 21. In the power-saving drive, the first switches (SW1) are turned off by a control signal whereas the second switches (SW2) are turned on by an inverted signal of the control signal. By turning the first switches (SW1) off, the output terminals of the source driver 200 are disconnected to the source signal lines (SLine 1 to SLine m). Under this condition, a start pulse input to the shift register included in the source driver 200 is stopped. Thus, driving of the source driver 200 is stopped. By turning the second switches (SW2) on, the predetermined potential applied to the wiring 2702 is simultaneously input to all of the source signal lines (SLine 1 to SLine m). When the predetermined potential is set to correspond to video signals, which are equal to each other, in the pixels in one row, the same video signals can be simultaneously input to all of the source signal lines (SLine 1 to SLine m). Note that, the length of a period of outputting the signals to the source signal lines (SLine 1 to SLine m) can be arbitrarily set.

According to the above described operation, the same video signals can be simultaneously output to all of the source signal lines (SLine 1 to SLine m) without driving the source driver 200. Consequently, power consumption can be reduced for power consumption required for driving the source driver 200.

The video signals input to the source signal lines (SLine 1 to SLine m) by the normal drive or the power-saving drive as described above, are input to pixels in one row of a plurality of pixels included in a display device. Video signals are input to the plurality of pixels in all of rows by the normal drive or the power-saving drive in the same manner so that an image is displayed by the plurality of pixels.

A control circuit for controlling the switching circuit 2700 of this embodiment mode has the similar structure to the source driver control circuit shown in FIG. 28A of Embodiment Mode 1. However, differing from the source driver control circuit shown in FIG. 28A, in the switching circuit 2700 of this embodiment mode, the control signal output from the determination circuit 1903 is input to the switching circuit 2700 rather than the source driver 200, and the output signals corresponding to video signals are input to the wiring 2702 of the switching circuit 2700.

Embodiment Mode 8

Figure 22:
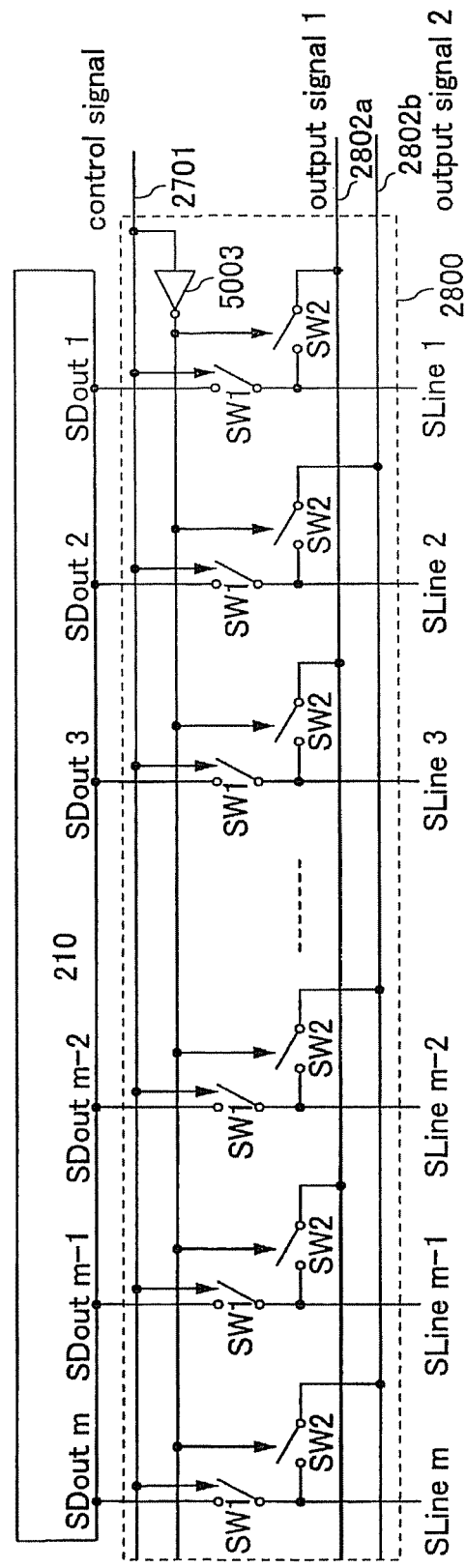
FIG. 22 is a diagram showing Embodiment Mode 8.
Figure 23:
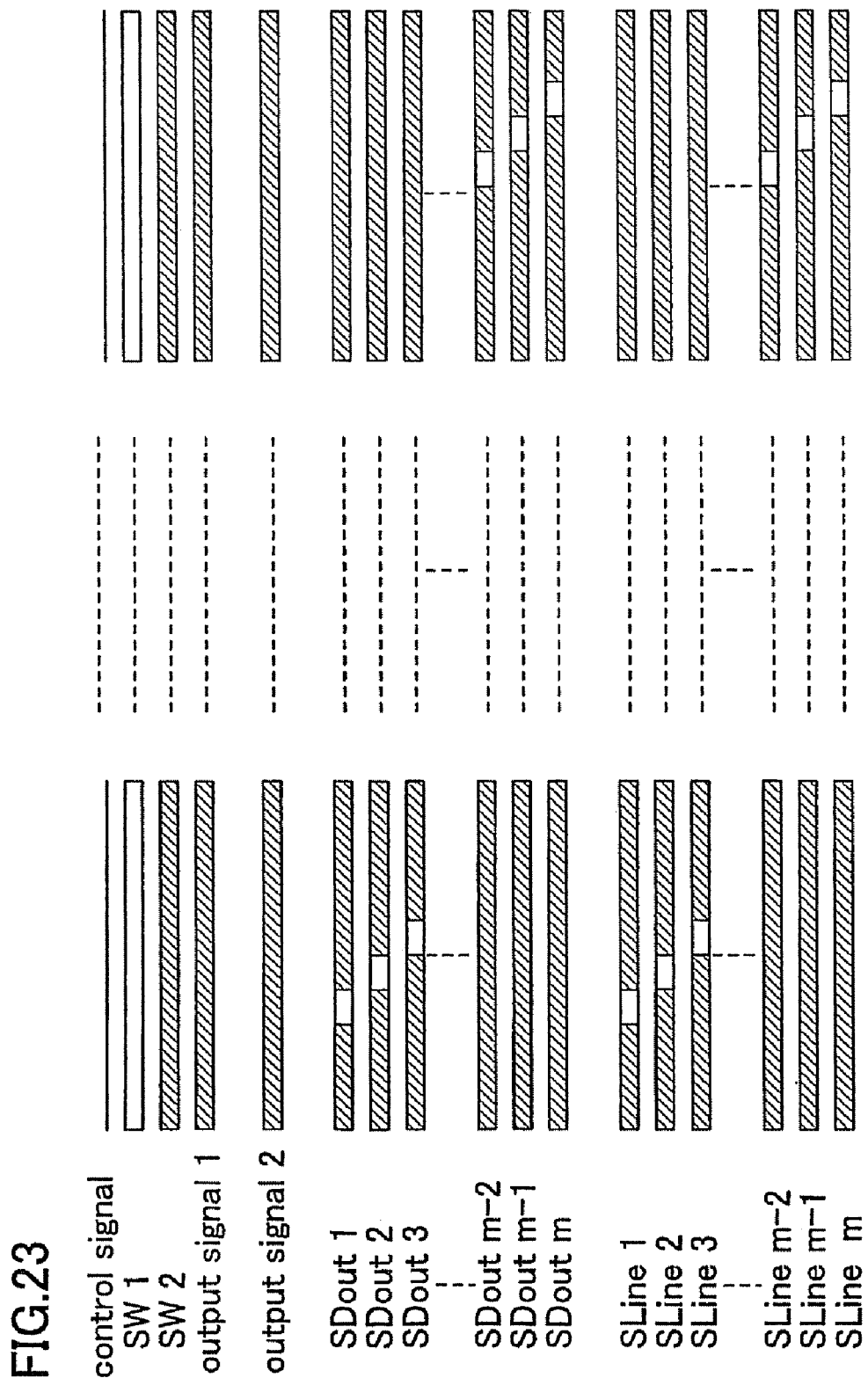
FIG. 23 is a diagram showing Embodiment Mode 8.
Figure 24:
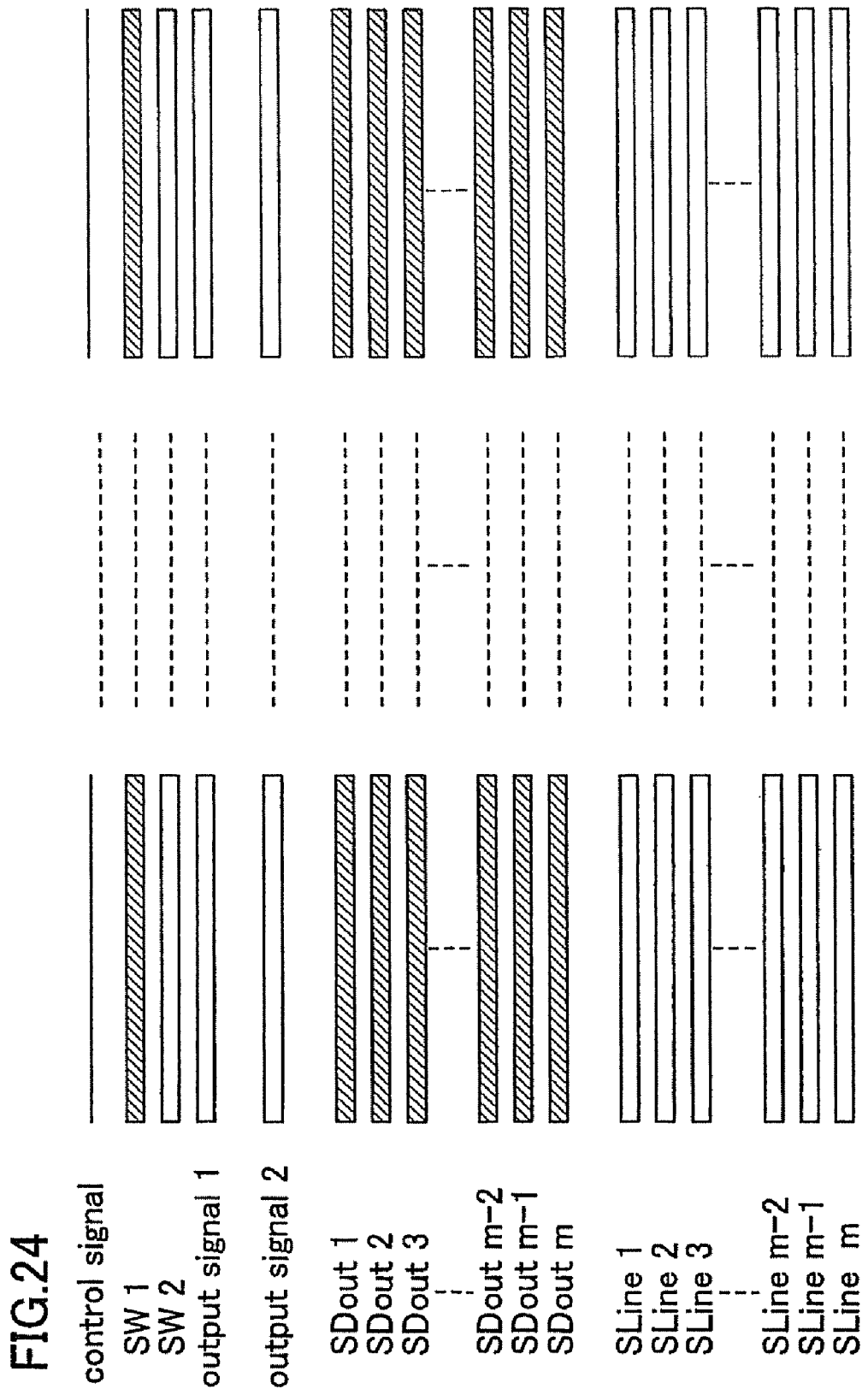
FIG. 24 is a diagram showing Embodiment Mode 8.

Embodiment Mode 8 is an embodiment mode corresponding to the third driving method and the eighth circuit structure. Embodiment Mode 8 will be described with reference to FIGS. 22, 23, and 24. FIG. 22 is a diagram showing a structure of a source driver 210 of a display device and a switching circuit 2800 for selectively outputting a signal output from the source driver 210 to a plurality of source signal lines. FIGS. 23 and 24 are timing charts showing driving methods of the source driver 210 and the switching circuit 2800 shown in FIG. 22. In FIGS. 22, 23, and 24, the same portions as those of FIGS. 19, 20, and 21 are denoted by the same reference numerals, and will not be further described.

In a structure of this embodiment mode shown in FIG. 22, a switching circuit 2800 is provided in an output portion of a source driver 210 having an arbitrary structure. In the structure of this embodiment mode, in a case of inputting the same video signals to all of pixels in one row of a plurality of pixels, the video signals are input to a source signal line without driving the source driver 210 regardless of line sequential drive or dot sequential drive. As one example, a timing chart in a case of the dot sequential drive is shown in each of FIGS. 23 and 24. A video signal output from the source driver may be either a digital video signal or an analog video signal.

The switching circuit 2800 shown in FIG. 22 has a feature of providing two wirings 2802a and 2802b instead of the wirings 2702 of the switching circuit 2700 shown in FIG. 19. Specifically, differing from the switching circuit 2700 shown in FIG. 19, the two wirings corresponding to output signal lines are provided in the switching circuit 2800 shown in FIG. 22. Each of source signal lines (SLine 1, SLine 3, . . . ) in odd-numbered columns is connected to the wiring 2802a while each of source signal lines (SLine 2, SLine 4, . . . ) in even-numbered columns is connected to the wiring 2802b through the second switches (SW2).

The normal drive will be described with reference to FIG. 23. In the normal drive, the first switches (SW1) are turned on by a control signal input to the wiring 2701 whereas the second switches (SW2) are turned off by an inverted signal of the control signal input to the wiring 2701. The inversion of the control signals are performed by an inverter 5003. By turning the first switches (SW1) on, output terminals (denoted by SDout 1 to SDout m in the drawing) of the source driver 210 are connected to the source signal lines (SLine 1 to SLine m). By turning the second switches (SW2) off, the wiring 2802a or 2802b kept at the predetermined potential is disconnected to the source signal lines (SLine 1 to SLine m). A start pulse is input to a shift register of the source driver 210, and video signals are sequentially output from the output terminals (SDout 1 to SDout m) of the sourcfe driver 210. The output video signals are input to the source signal lines (SLine 1 to SLine m).

The power-saving drive will be described with reference to FIG. 24. In the power-saving drive, the first switches (SW1) are turned off by a control signal whereas the second switches (SW2) are turned on by an inverted signal of the control signal. By turning the first switches (SW1) off, the output terminals of the source driver 210 are disconnected to the source signal lines (SLine 1 to SLine m). Under this condition, a start pulse input to the shift register included in the source driver 210 is stopped. Thus, driving of the source driver 210 is stopped. By turning the second switches (SW2) on, predetermined first potential applied to the wiring 2802a is simultaneously input to the source signal lines in the odd-numbered columns while predetermined second potential applied to the wiring 2802b is simultaneously input to the source signal lines in the even-numbered columns. When the predetermined second potential is made to have an inverted polarity of the predetermined first potential and the predetermined first potential is set to correspond to a video signal, which is equal in pixels in one row, the same video signal can be simultaneously input to all of the source signal lines (SLine 1 to SLine m), and source line inversion drive can be performed. Note that, length of a period of outputting the signals to the source signal lines (SLine 1 to SLine m) can be arbitrarily set.

According to the above described operation, the same video signals (note that, whose polarities are inverted in each source signal line) can be output to all of the source signal lines (SLine 1 to SLine m) without driving the source driver 210. Consequently, power consumption can be reduced for power consumption required for driving the source driver 210.

The video signals input to the source signal lines (SLine 1 to SLine m) by the normal drive or the power-saving drive as described above, are input to pixels in one row of a plurality of pixels included in a display device. Video signals are input to the plurality of pixels in all of rows by the normal drive or the power-saving drive in the same manner so that an image is displayed by the plurality of pixels.

In this embodiment mode, a control circuit for controlling the switching circuit 2800 has the similar structure to the source driver control circuit shown in FIG. 28B of Embodiment Mode 2. However, differing from the source driver control circuit shown in FIG. 28B, in the switching circuit 2800 of this embodiment mode, the control signals output from the determination circuit 1903 are input to the switching circuit 2800 rather than the source driver, and the output signals corresponding to video signals are input to the wirings 2802a and 2802b of the switching circuit 2800.

Embodiment Mode 9

Figure 25:
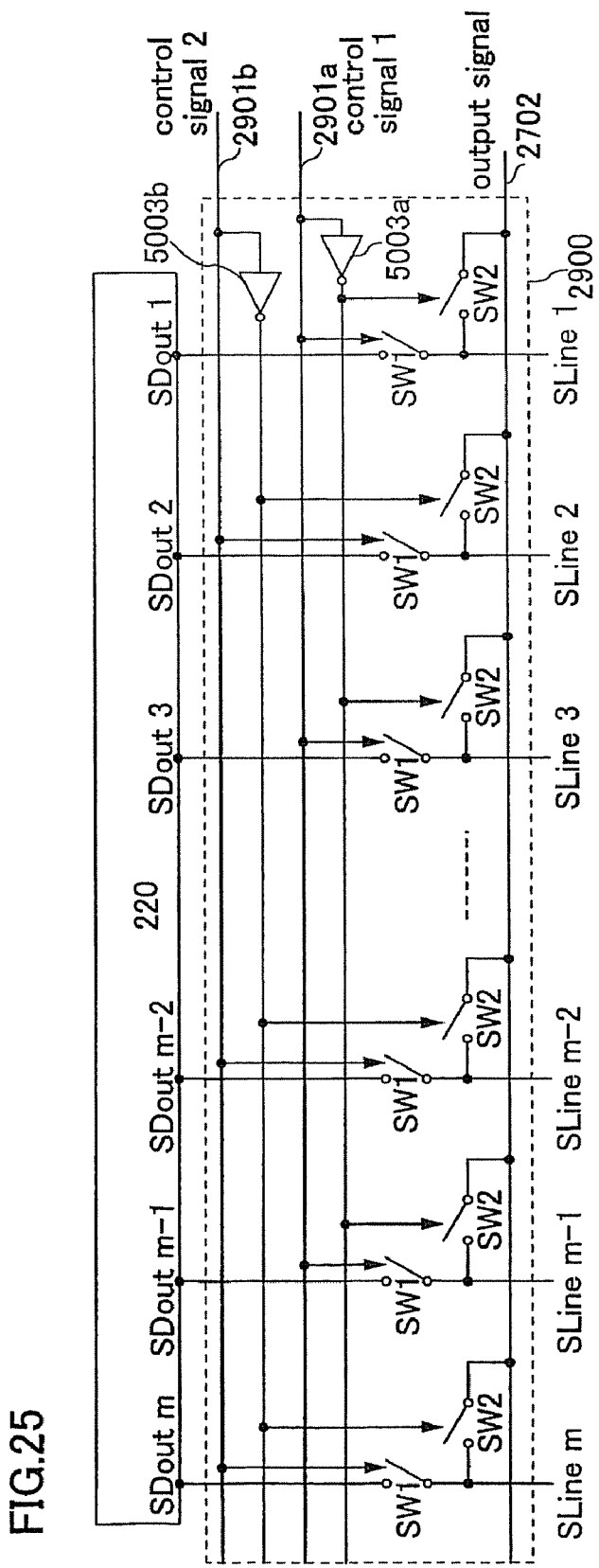
FIG. 25 is a diagram showing Embodiment Mode 9.
Figure 26:
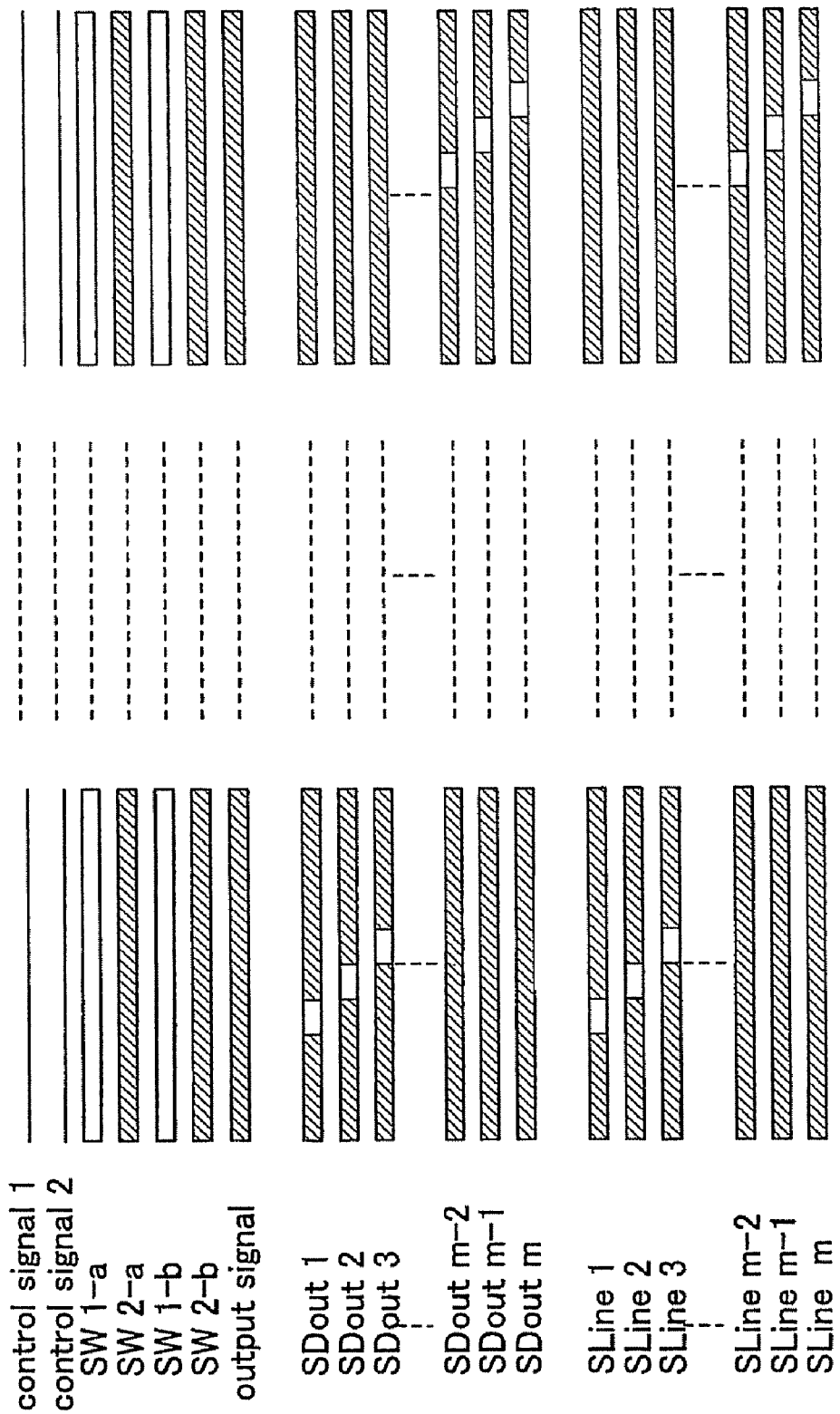
FIG. 26 is a diagram showing Embodiment Mode 9.
Figure 27:
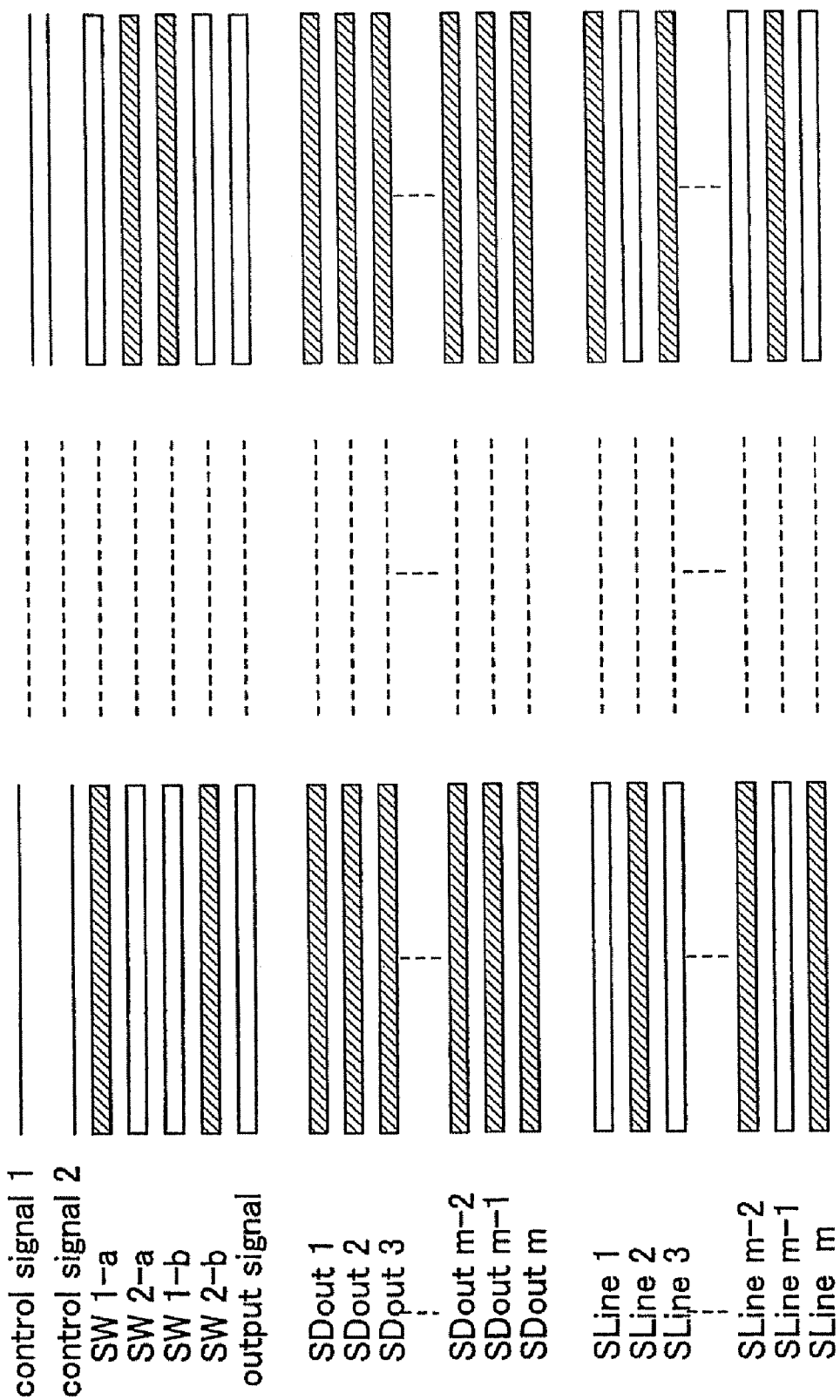
FIG. 27 is a diagram showing Embodiment Mode 9.

Embodiment Mode 9 is an embodiment mode corresponding to the third driving method and the ninth circuit structure. Embodiment Mode 9 will be described with reference to FIGS. 25, 26, and 27. FIG. 25 is a diagram showing a structure of a source driver 220 of a display device and a switching circuit 2900 for selectively outputting signals output from the source driver 220 to a plurality of source signal lines. FIGS. 26 and 27 are timing charts showing driving methods of the source driver 220 and the switching circuit 2900 shown in FIG. 25. In FIGS. 25, 26, and 27, the same portions as those of FIGS. 19, 20, and 21 are denoted by the same reference numerals, and will not be further described.

In a structure of this embodiment mode shown in FIG. 25, the switching circuit 2900 is provided in an output portion of a source driver 220 having an arbitrary structure. In the structure of this embodiment mode, in a case of inputting the same video signals to all of pixels in one row of a plurality of pixels, the video signals are input to a source signal line without driving the source driver 220 regardless of line sequential drive or dot sequential drive. As one example, a timing chart in a case of the dot sequential drive is shown in each of FIGS. 26 and 27. A video signal output from the source driver 220 may be either a digital video signal or an analog video signal.

The switching circuit 2900 shown in FIG. 25 has a feature of providing two wirings 2901a and 2901b instead of the wiring 2701 of the switching circuit 2700 shown in FIG. 19, to which a control signal is input.

A first control signal input to the wiring 2901a is input to control terminals of first switches (SW1-a) corresponding to each of source signal lines (SLine 1, SLine 3, . . . ) in odd-numbered columns. An inverted signal of the first control signal, which is input to the wiring 2901a, is input to control terminals of second switches (SW2-a) corresponding to each of the source signal lines in the odd-numbered columns (SLine 1, SLine 3, . . . ). The inversion of the first control signal is performed by an inverter 5003a. A second control signal input to the wiring 2901b is input to control terminals of first switches (SW1-b) corresponding to each of the source signal lines in even-numbered columns (SLine 2, SLine 4, . . . ). An inverted signal of the second control signal, which is input to the wiring 2901b, is input to control terminals of second switches (SW2-b) corresponding to each of the source signal lines in even-numbered columns (SLine 2, SLine 4, . . . ). The inversion of the second control signal is performed by an inverter 5003b. When the first switches (SW1-a) are turned on, the second switches (SW2-a) are turned off, whereas when the second switches (SW2-a) are turned on, the first switches (SW1-a) are turned off. When the first switches (SW1-b) are turned on, the second switches (SW2-b) are turned off, whereas when the second switches (SW2-b) are turned on, the first switches (SW1-b) are turned off. Further, when performing source line inversion drive, in a case where the first switches (SW1-a) are turned on, the first switches (SW1-b) are turned off. In a case where the first switches (SW1-a) are turned off the first switches (SW1-b) are turned on.

The normal drive will be described with reference to FIG. 26. In the normal drive, the first switches (SW1-a) are turned on by a first control signal whereas the second switches (SW2-a) are turned off by an inverted signal of the first control signal. Further, the first switches (SW1-b) are turned on by a second control signal whereas the second switches (SW2-b) are turned off by an inverted signal of the second control signal. A start pulse is input to a shift register of the source driver 220. The source driver 220 sequentially outputs video signals from output terminals (SDout 1 to SDout m). The output video signals are input to the source signal lines (SLine 1 to SLine m).

Next, the power-saving drive will be described with reference to FIG. 27. One line period is divided into first half and last half Video signals are output to source signal lines in odd-numbered columns (SLine 1, SLine 3, . . . ) in one of the first half and the last half while video signals are output to source signal lines in even-numbered columns (SLine 2, SLine 4, . . . ) in the other one. In the first half and the last half of the one line period, by changing polarities of the video signals input to the wirings 2901a and 2901b, source line inversion drive can be performed. In this embodiment mode, an example where video signals are output to the source signal lines in the odd-numbered columns (SLine 1, SLine 3, . . . ) in the first half of the one line period whereas video signals are output to the source signal lines in the even-numbered columns (SLine 2, SLine 4, . . . ) in the last half thereof, will be described.

In the first half of the one line period, the first switches (SW1-a) are turned off by the first control signal while the second switches (SW2-a) are turned on by an inverted signal of the first control signal. The first switches (SW 1-b)are turned on by the second control signal while the second switches (SW2-b) are turned off by an inverted signal of the second control signal. By turning the first switches (SW1-a) off, the output terminals of the source driver 220 are disconnected to source signal lines in the odd-numbered columns (SLine 1, SLine 3, . . . ). Under this condition, a start pulse input to the shift register of the source driver 220 is stopped. Thus, driving of the source driver 220 is stopped.

Since the second switches (SW2-a) are turned on, the wiring 2702 is connected to the source signal lines in the odd-numbered columns (SLine 1, SLine 3, . . . ). The predetermined potential applied to the wiring 2702 is simultaneously input to the source signal lines in the odd-numbered columns. When the predetermined potential is set to correspond to a video signal, which is equal in pixels in one row, the same video signals can be simultaneously input to the source signal lines in the odd-numbered columns (SLine 1, SLine 3, . . . ).

In this case, since the first switches (SW1-b) are turned on, signals output from the output terminals corresponding to the source signal lines in the even-numbered columns (SDout 2, SDout 4, . . . ) are input to the source signal lines in the even-numbered columns (SLine 2, SLine 4, . . . ). Since a start pulse is not input to the shift register of the source driver 220, the shift register 220 does not output a sampling pulse. Therefore, new video signals are not output to the source signal lines in the even-numbered columns.

In the last half of the one line period, the first switches (SW1-*a*) are turned on by the first control signal while the second switches (SW2-*a*) are turned off by an inverted signal of the first control signal. The first switches (SW1-*b*) are turned off by the second control signal while the second switches (SW2-*b*) are turned on by an inverted signal of the second control signal. By turning the first switches (SW1-*b*) off, the output terminals of the source driver 220 are disconnected to the source signal lines in the even-numbered columns (SLine 2, SLine 4, . . . ). Under this condition, a start pulse input to the sift register of the source driver 220 is stopped. Thus, driving of the source driver 220 is stopped.

Since the second switches (SW2-*b*) are turned on, the wiring 2702 is connected to the source signal lines in the even-numbered columns (SLine 2, SLine 4, . . . ). The predetermined potential applied to the wiring 2702 is simultaneously input to the source signal lines in the even-numbered columns. When the predetermined potential is set to correspond to a video signal, which is equal in pixels in one row, the same video signals can be simultaneously input to the source signal lines in the even-numbered columns (SLine 2, SLine 4, . . . ).

In this case, since the first switches (SW1-*a*) are turned on, signals output from the output terminals corresponding to the source signal lines in the odd-numbered columns (SDout 1, SDout 3, . . . ) are input to the source signal lines in the odd-numbered columns (SLine 1, SLine 3, . . . ). Since a start pulse is not input to the shift register of the source driver 220, the shift register does not output a sampling pulse. Therefore, new video signals are not output to the source signal, lines in the odd-numbered columns.

When a polarity of the predetermined potential input to the wiring 2702 is changed between the first half and the last half of the one line period, source line inversion drive can be performed. Note that, the length of a period of outputting signals to the source signal lines (SLine 1 to SLine m) can be arbitrarily set.

The timing charts of FIGS. 26 and 27 show examples of performing the source line inversion drive only in the case of the power-saving drive as shown in FIG. 27; however, the present invention is not limited thereto. The source line inversion drive may also be performed in the normal drive shown in FIG. 26.

According to the above described operation, the same video signals (note that, whose polarities are inverted in each source signal line) can be output to all of the source signal lines (SLine 1 to SLine m) without driving the source driver 220. Consequently, power consumption can be reduced for power consumption required for driving the source driver 220.

The video signals input to the source signal lines (SLine 1 to SLine m) by the normal drive or the power-saving drive as described above, are input to pixels in one row of a plurality of pixels included in a display device. Video signals are input to the plurality of pixels in all of rows by the normal drive or the power-saving drive in the same manner so that an image is displayed by the plurality of pixels.

In this embodiment mode, a control circuit for controlling the switching circuit 2900 has the similar structure to the source driver control circuit shown in FIG. 28C of Embodiment Mode 3. However, differing from the source driver control circuit shown in FIG. 28C, in the switching circuit 2900 of this embodiment mode, the first and second control signals output from the determination circuit 1907 are input to the switching circuit 2900 rather than the source driver 220, and the output signals corresponding to video signals are input to the wiring 2702 of the switching circuit 2900.

Embodiment Mode 10

Figure 29A:
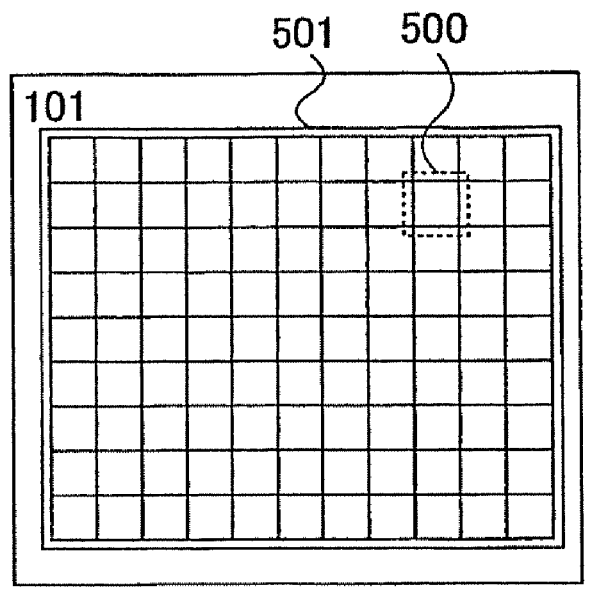
FIGS. 29A and 29B are diagrams showing Embodiment Mode 10.

An example of a panel over which a plurality of pixels are formed will be described in Embodiment Mode 10 with reference to FIGS. 29A and 29B. In FIG. 29A, a panel 101 includes a pixel portion 501 including a plurality of pixels 500 arranged in a matrix form. The pixel portion 501 can have an active matrix structure in which a switching element such as a thin film transistor is provided in each pixel 500. As display mediums of the pixels 500, light emitting elements such as electroluminescence elements may be provided, or liquid crystal elements may be provided.

Figure 29B:
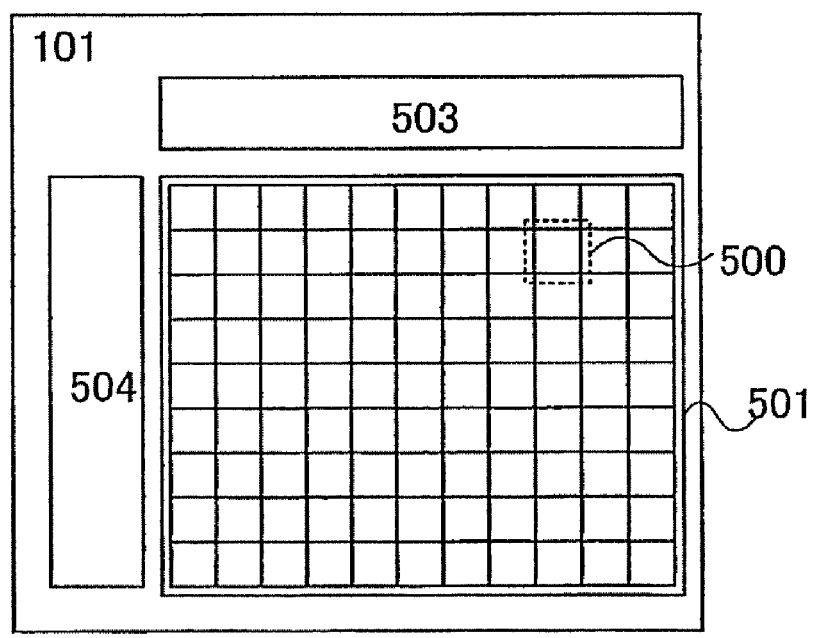

Further, as shown in FIG. 29B, a driver circuit for driving the pixel portion 501 may be provided over the same substrate over which the pixel portion 501 is formed. In FIG. 29B, the same portions as those of FIG. 29A are denoted by the same reference numerals, and will not be further described. In FIG. 29B, a source driver 503 and a gate driver 504 are provided as driver circuits. Further, the present invention is not limited thereto, and other driver circuit may also be provided in addition to the source driver 503 and the gate driver 504. The driver circuit may be provided over other substrate and may be mounted over the substrate over which the pixel portion 501 is formed. For example, the pixel portion 501 may be formed over a glass substrate by using a thin film transistor whereas the driver circuit may be formed over a single crystalline substrate, and an IC chip of the driver circuit may be connected to the glass substrate by a COG (chip on glass) technique. Alternatively, the IC chip may be connected to the glass substrate by a TAB (tape automated bonding) technique or by using a printed substrate.

Further, a driver circuit may be formed over the same substrate over which the pixel portion 501 is formed by using a thin film transistor formed through the same process as the thin film transistors included in the pixels 500. A channel formation region of each thin film transistor may be formed using polycrystalline semiconductor or amorphous semiconductor.

This embodiment mode can be implemented by being freely combined with Embodiment Mode 1 through Embodiment Mode 9.

Embodiment Mode 11

Figure 30A:
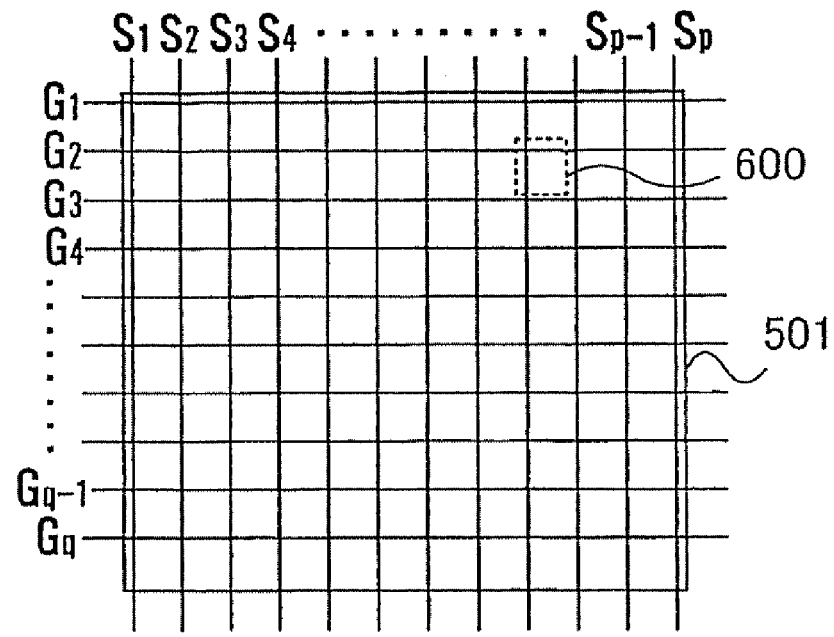
FIGS. 30A and 30B are diagrams showing Embodiment Mode 11.

A structural example (hereinafter, referred to as a first pixel structure) of the pixel portion 501 shown in each of FIGS. 29A and 29B, is shown in FIG. 30A. The pixel portion 501 includes a plurality of source signal lines $S_1$ to $S_p$ (p is a natural number); a plurality of scanning lines $G_1$ to $G_q$ (q is a natural number) provided to be intersected with the plurality of source signal lines $S_1$ to $S_p$; and pixels 600 each of which is provided in each intersection of the source signal lines $S_1$ to $S_p$ and the scanning lines $G_1$ to $G_q$.

Figure 30B:
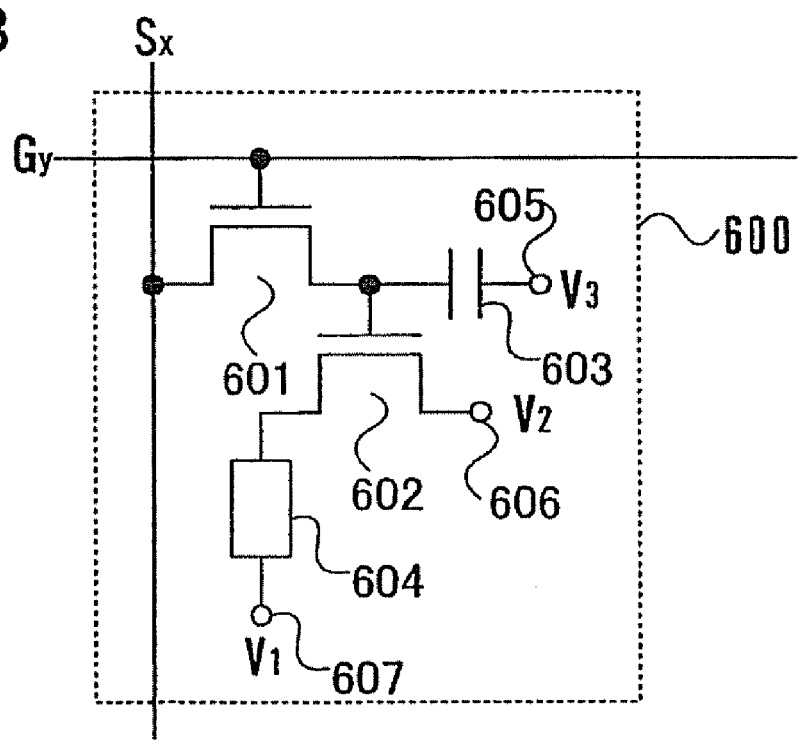

A structure of each pixel 600 of FIG. 30A is shown in FIG. 30B. FIG. 30B shows one of the pixels 600 formed in an intersection of one signal line $S_x$ (x is a natural number equal to or lower than p) of the plurality of source signal lines $S_1$ to $S_p$ and one scanning line Gy (y is a natural number equal to or lower than q) of the plurality of scanning lines $G_1$ to $G_q$. The pixel 600 includes a first transistor 601, a second transistor 602, a capacitor element 603, and a light emitting element 604. In this embodiment mode, an element having a pair of electrodes, which emits light by feeding current between the pair of electrodes, is, for example, used as the light emitting element 604. Further, a parasitic capacitance of the second transistor 602 or the like may be actively utilized as the capacitor element 603. Each of the first transistor 601 and the second transistor 602 may be either an n-channel transistor or a p-channel transistor. As a transistor included in the pixel 600, a thin film transistor can be used.

A gate of the first transistor 601 is connected to the scanning line $G_y$. One of a source and a drain of the first transistor 601 is connected to the source signal line $S_x$ while the other is connected to a gate of the second transistor 602 and one of electrodes of the capacitor element 603. The other electrode of the capacitor element 603 is connected to a terminal 605 applied with potential $V_3$. One of a source and a drain of the second transistor 602 is connected to one of electrodes of the light emitting element 604, and the other of the source and the drain of the second transistor 602 is connected to a terminal 606 applied with potential $V_2$. The other electrode of the light emitting element 604 is connected to a terminal 607 applied with potential $V_1$.

A display method of the pixel portion 501 shown in FIGS. 30A and 30B will be described.

One of the plurality of scanning lines $G_1$ to $G_q$ is selected, and while selecting the scanning line, image signals are input to all of the plurality of source signal lines $S_1$ to $S_p$. Thus, the image signals are input to pixels in one row of the pixel portion 501. The plurality of scanning lines $G_1$ to $G_q$ are sequentially selected and the same operation is performed to input the image signals to all of the pixels 600 of the pixel portion 501.

An operation of the pixel 600 where one scanning line $G_y$ of the plurality of scanning lines $G_1$ to $G_q$ is selected and an image signal is input from one source signal line $S_x$ of the plurality of source signal lines $S_1$ to $S_p$, will be described. When the scanning line $G_y$ is selected, the first transistor 601 becomes an on state. The on state of a transistor indicates a state where a source and a drain are in a conduction state. An off state of a transistor indicates a state where a source and a drain are in a non-conduction state. When the first transistor 601 becomes the on state, an image signal input to the source signal line $S_x$ is input to a gate of the second transistor 602 through the first transistor 601. An on state or an off state of the second transistor 602 is selected based on an image signal input to the second transistor 602. When the second transistor 602 becomes the on state, drain current of the second transistor 602 flows through the light emitting element 604 so that the light emitting element 604 emits light.

Potential $V_2$ and potential $V_3$ are kept such that a constant potential difference is always maintained when the second transistor 602 becomes the on state. The potential $V_2$ may be set to be equal to the potential $V_3$. When the potential $V_2$ is set to be equal to the potential $V_3$, the terminal 605 and the terminal 606 may be connected to the same wiring. The potential $V_1$ and the potential $V_2$ may be set to have a certain potential difference when light emission of the light emitting element 604 is selected. Thus, current is fed to the light emitting element 604 so as to make the light emitting element 604 emit light.

This embodiment mode can be implemented by being freely combined with Embodiment Mode 1 through Embodiment Mode 10.

Embodiment Mode 12

Figure 31A:
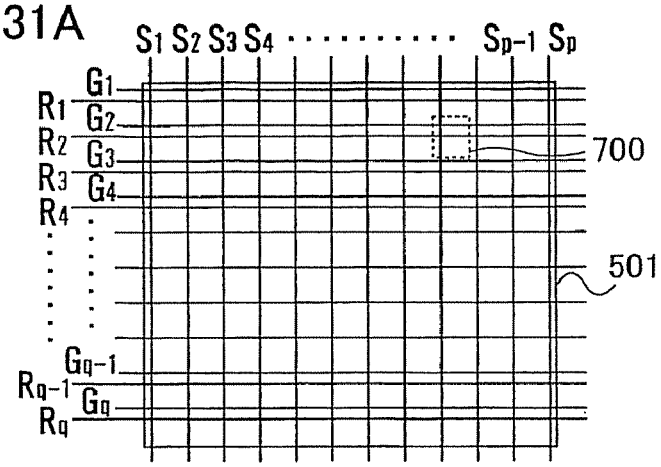
FIGS. 31A to 31C are diagrams showing Embodiment Mode 12.

A structural example (hereinafter, referred to as a second pixel structure), which is different from the first pixel structure shown in Embodiment Mode 11, of the pixel portion 501 shown in each of FIGS. 29A and 29B, is shown in FIG. 31A. The pixel portion 501 includes a plurality of source signal lines $S_1$ to $S_p$ (p is a natural number); a plurality of scanning lines $G_1$ to $G_q$ (q is a natural number) and a plurality of scanning lines $R_1$ to $R_q$ provided to be intersected with the plurality of source signal lines $S_1$ to $S_p$; and pixels 700 each of which is provided in each intersection of the source signal lines $S_1$ to $S_p$ and the scanning lines $G_1$ to $G_q$.

Figure 31B:
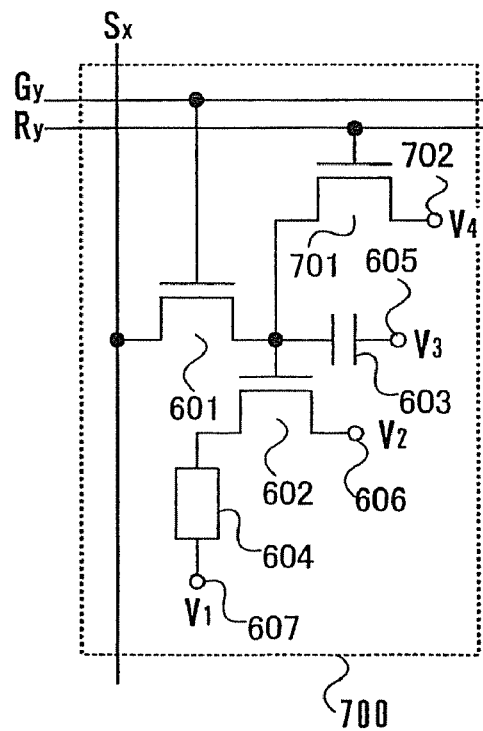

A structure of each pixel 700 of FIG. 31A is shown in FIG. 31B. FIG. 31B shows one of the pixels 700 formed in an intersection of one source signal line $S_x$ (x is a natural number equal to or lower than p) of the plurality of source signal lines $S_1$ to $S_p$ and one scanning line Gy (y is a natural number equal to or lower than q) of the plurality of scanning lines $G_1$ to $G_q$ and the plurality of scanning lines $R_1$ to $R_q$. Note that, the same portions as those of the pixel of FIG. 30B are denoted by the same reference numerals in the pixel shown in FIG. 31B, and will not be further described. Differing from the pixel 600 shown in FIG. 30B, the pixel 700 shown in FIG. 31B has a third transistor 701. The third transistor 701 may be either an n-channel transistor or a p-channel transistor. As a transistor included in the pixel 700, a thin film transistor can be used.

A gate of the third transistor 701 is connected to the scanning line $R_y$. One of a source and a drain of the third transistor 701 is connected to a gate of the second transistor 602 and one electrode of the capacitor element 603, and the other of the third transistor 701 is connected to a terminal 702 applied with potential $V_4$.

A display method of the pixel portion 501 shown in FIGS. 31A and 31B will be described.

A method for making a light emitting element 604 emit light is the same as the method described in Embodiment Mode 11. The pixel structure shown in each of FIGS. 31A and 31B has one feature that since each pixel 700 has the scanning line $R_y$ and the third transistor 701, the light emitting element 604 of the pixel 700 can be made emit no light regardless of an image signal input from the source signal line S. By a signal input to the scanning line $R_y$, light emitting time of the light emitting element 604 of the pixel 700 can be set. Thus, by sequentially selecting the scanning lines $G_1$ to $G_q$, a light emitting period, which is shorter than a period of selecting all of the scanning lines $G_1$ to $G_q$, can be set. Accordingly, in a case of displaying an image by a time division gray scale method, a short sub-frame period can be set, and hence, a high gray scale can be expressed.

The potential $V_4$ may be set such that when the third transistor 701 becomes an on state, the second transistor 602 becomes an off state. For example, the potential $V_4$ can be set to be made equal to the potential $V_3$ when the third transistor 701 becomes the on state. By making the potential $V_4$ equal to the potential $V_3$, charges stored in the capacitor element 603 can be discharged, and by setting voltage between the source and the gate of the second transistor 602 to be zero, the second transistor 602 can be made to be the off state. Further, when the potential $V_3$ is made equal to the potential $V_4$, the terminal 605 and the terminal 702 may be connected to the same wiring.

The third transistor 701 is not limited to the position shown in FIG. 31B. For example, the third transistor 701 may be placed in series with the second transistor 602. In this structure, by making the third transistor 701 to be the off state by a signal input to the scanning line $R_y$, current flowing through the light emitting element 604 is stopped so that the light emitting element 604 can be made to emit no light.

Figure 31C:
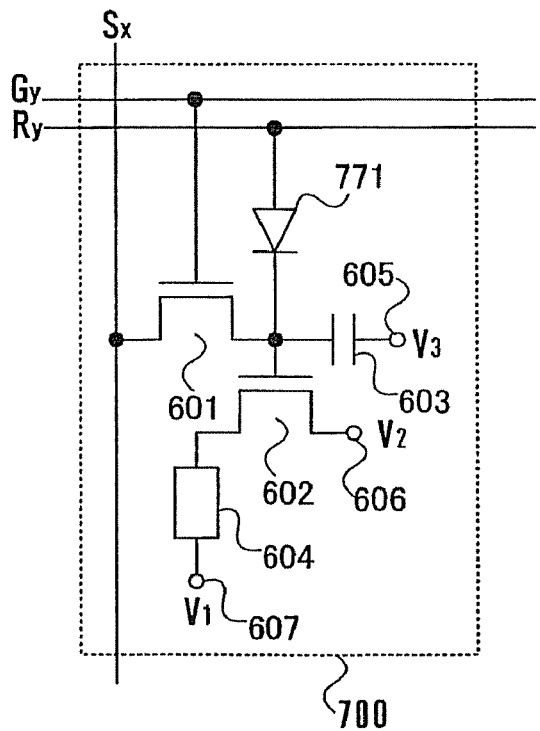

A diode can be used as substitute for the third transistor 701 shown in FIG. 31B. A pixel structure using a diode as substitute for the third transistor 701 is shown in FIG. 31C. In FIG. 31C, the same portions as those of FIG. 31B are denoted by the same reference numerals, and will not be further described. One electrode of a diode 771 is connected to the scanning line $R_y$, and the other electrode of the diode 771 is connected to the gate of the second transistor 602 and one electrode of the capacitor element 603.

In the diode 771, current flows therethrough from one electrode to the other electrode. The second transistor 602 is set to be a p-channel transistor. By increasing potential of one electrode of the diode 771, potential of the gate of the second transistor 602 is increased so that the second transistor 602 can be made to be the off state.

FIG. 31C shows a structure of the diode 771 in which current flows from one electrode connected to the scanning line $R_y$ to the other electrode connected to the gate of the second transistor 602, and the second transistor 602 is a p-channel transistor; however, the present invention is not limited to this structure. The diode 771 may have a structure in which current flows from one electrode connected to the gate of the second transistor 602 to the other electrode connected to the scanning line $R_y$, and the second transistor 602 is an n-channel transistor. In a case where the second transistor 602 is the n-channel transistor, by decreasing potential of one of the electrodes of the diode 771, potential of the gate of the second transistor 602 is reduced, and therefore, the second transistor 602 can be made to be the off state.

As the diode 771, a transistor with a diode connection may be used. The diode with the diode connection indicates a transistor in which a drain and a gate are connected to each other. As the transistor with the diode connection, either a p-channel transistor or an n-channel transistor may be used.

This embodiment mode can be implemented by being freely combined with Embodiment Mode 1 through Embodiment Mode 11.

Embodiment Mode 13

Figure 36A:
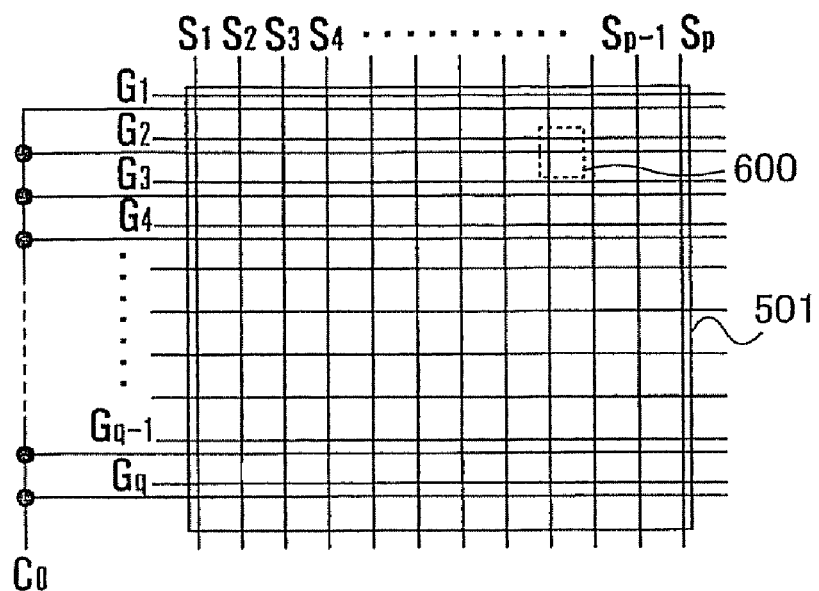
FIGS. 36A and 36B are diagrams showing Embodiment Mode 13.

A structural example (hereinafter, referred to as a third pixel structure) of the pixel portion 501 shown in each of FIGS. 29A and 29B, is shown in FIG. 36A. The pixel portion 501 includes a plurality of source signal lines $S_1$ to $S_p$ (p is a natural number); a plurality of scanning lines $G_1$ to $G_q$ (q is a natural number) provided to be intersected with the plurality of source signal lines $S_1$ to $S_p$; and pixels 600 each of which is provided in each intersection of the source signal lines $S_1$ to $S_p$ and the scanning lines $G_1$ to $G_q$.

Figure 36B:
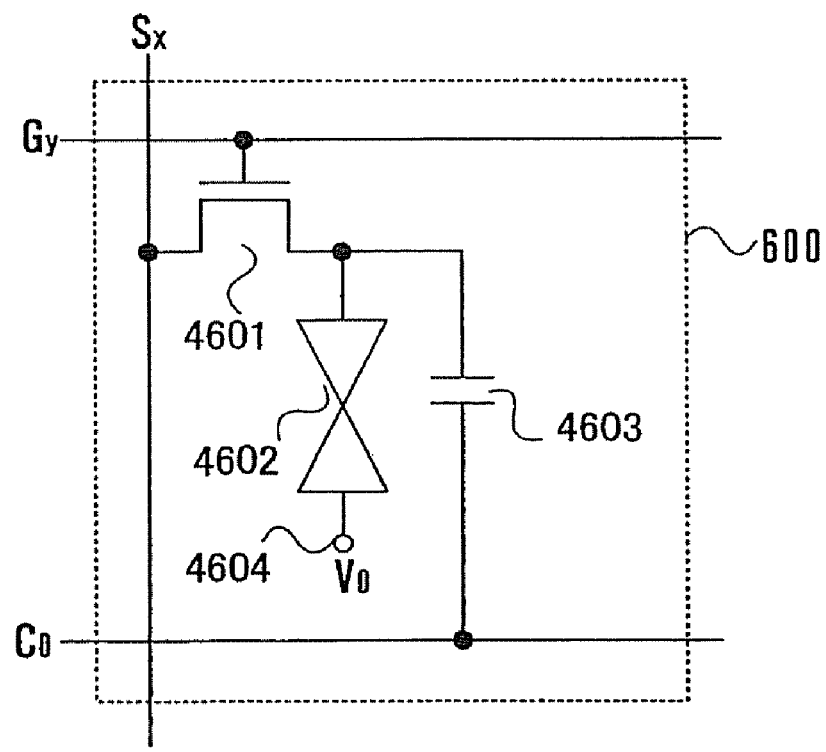

A structure of each pixel 600 of FIG. 36A is shown in FIG. 36B. FIG. 36B shows one pixel 600 formed in the intersection of one source signal line $S_x$ (x is a natural number equal to or lower than p) of the plurality of source signal lines $S_1$ to $S_p$ and one scanning line Gy (y is a natural number equal to or lower than q) of the plurality of scanning lines $G_1$ to $G_q$. Note that a capacitive line $C_0$ is provided in each row. The pixel 600 includes a transistor 4601, a liquid crystal element 4602, and a capacitor element 4603. The transistor 4601 may be either an n-channel transistor or a p-channel transistor. As a transistor included in the pixel 600, a thin film transistor can be used.

A gate of the transistor 4601 is connected to the scanning line $G_y$. One of a source and a drain of the transistor 4601 is connected to the source signal line $S_x$ while the other is connected to one of electrodes of the liquid crystal element 4602 and one of electrodes of the capacitor element 4603. The other electrode of the liquid crystal element 4602 is connected to a terminal 4604 applied with potential $V_0$. The other electrode of the capacitor element 4603 is connected to the capacitive line $C_0$. The capacitive line $C_0$ is applied with the same potential as the potential $V_0$ applied to the terminal 4604.

A display method of the pixel portion 501 shown in FIGS. 36A and 36B will be described.

On of the plurality of scanning lines $G_1$ to $G_q$ is selected, and while selecting the scanning line, image signals are input to all of the plurality of source signal lines $S_1$ to $S_p$. Thus, the image signals are input to pixels in one row of the pixel portion 501. The plurality of scanning lines $G_1$ to $G_q$ are sequentially selected and the same operation is performed to input the image signals to all of the pixels 600 of the pixel portion 501.

An operation of one pixel 600 where one scanning line $G_y$ of the plurality of scanning lines $G_1$ to $G_q$ is selected and an image signal is input from one source signal line $S_x$ of the plurality of source signal lines $S_1$ to $S_p$, will be described. When the scanning line $G_y$ is selected, the transistor 4601 becomes an on state. The on state of a transistor indicates a state where a source and a drain are in a conduction state. An off state of a transistor indicates a state where a source and a drain are in a non-conduction state. When the transistor 4601 becomes the on state, an image signal input to the source signal line $S_x$ is input to one electrode of the liquid crystal element 4602 and one electrode of the capacitor element 4603 through the transistor 4601. Thus, voltage (which corresponds to a potential difference between potential of the input image signal and potential $V_0$ of the terminal 4604) is applied to the pair of electrodes of the liquid crystal element 4602, and hence, transmittance of the liquid crystal element 4602 is changed.

The present invention can be implemented by being freely combined with Embodiment Mode 1 through Embodiment Mode 10.

Embodiment Mode 14

Figure 41:
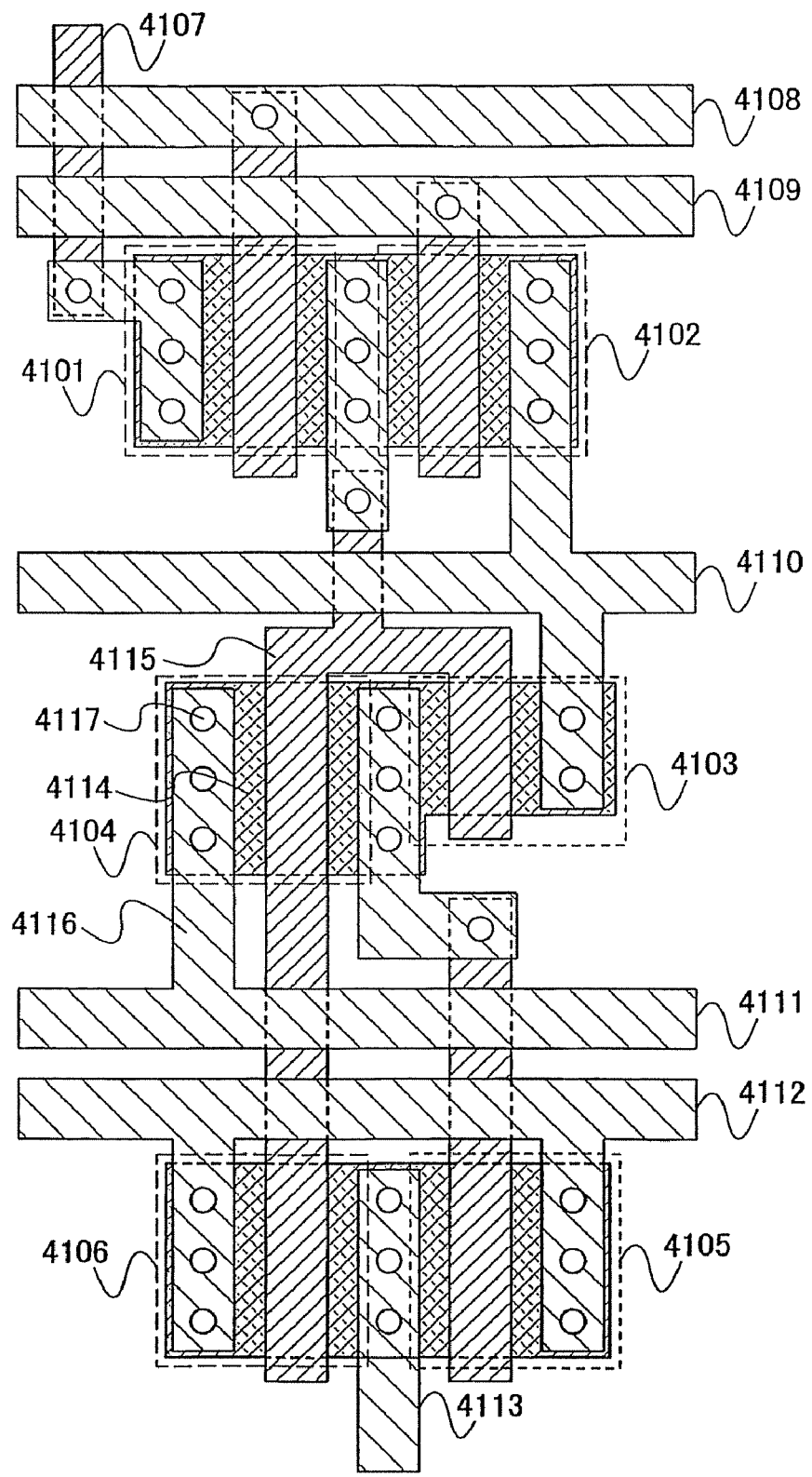
FIG. 41 is a diagram showing Embodiment Mode 14.

A layout example of a part of a source driver of a display device according to the present invention will be shown. Specifically, a layout example of a part of the source driver of the circuit diagram shown in FIG. 1 is shown in FIG. 41.

In the source driver, a transistor 4101, a transistor 4102, a transistor 4103, a transistor 4104, a transistor 4105, and a transistor 4106 are arranged. The transistor 4101 corresponds to the first switch SW1 of FIG. 1. The transistor 4102 corresponds to the second switch SW2 of FIG. 1. The transistor 4103 and the transistor 4104 constitute the inverter 5001 of FIG. 1. The transistor 4105 and the transistor 4106 constitute an analog switch and this analog switch corresponds to the third switches (ASW 1 to ASW m) of FIG. 1.

A connection relation of the source driver shown in FIG. 41 will be described. Note that, in each of the transistors, one of a source and a drain is referred to as a first terminal and the other is referred to as a second terminal. A first terminal of the transistor 4101 is connected to an input terminal 4107, and a second terminal of the transistor 4101 is connected to a second terminal of the transistor 4102, a second terminal of the transistor 4103, a second terminal of the transistor 4104, and a gate of the transistor 4106. A gate of the transistor 4101 is connected to a wiring 4108. A first terminal of the transistor 4102 is connected to a wiring 4110 and a gate of the transistor 4102 is connected to a wiring 4109. A first terminal of the transistor 4103 is connected to the wiring 4110 and the second terminal of the transistor 4103 is connected to the second terminal of the transistor 4104 and a gate of the transistor 4105. A first terminal of the transistor 4104 is connected to a wiring 4111. A first terminal of the transistor 4105 is connected to a wiring 4112, and the second terminal of the transistor 4105 is connected to the second terminal of the transistor 4106 and an output terminal 4113. A first terminal of the transistor 4106 is connected to the wiring 4112.

Note that the input terminal 4107 is connected to an output terminal of the shift register 100 of FIG. 1. The wiring 4108 corresponds to the wiring 2001 of FIG. 1. The wiring 4109 corresponds to a wiring connected to the wiring 2001 through the inverter 5002 of FIG. 1. The wiring 4110 corresponds to the power source terminal 2003 of FIG. 1. Further, in FIG. 41, the wiring 4110 also serves as a wiring for supplying high power potential of the inverter 5001 of FIG. 1. The wiring 4111 serves as a wiring for supplying low power potential of the inverter 5001 of FIG. 1. The wiring 4112 corresponds to the wiring 2002 of FIG. 1. The output terminal 4113 is connected to the source signal lines of FIG. 1 (SLine 1 to SLine m).

When each of the transistors included in the source driver has a top-gate structure, a semiconductor layer 4114, a gate insulating film, a wiring 4115 serving as a gate electrode, an interlayer insulating film, and a wiring 4116 serving as a source electrode and a drain electrode are stacked in this order over an insulated surface. When each of the transistors included in the source driver has a bottom-gate structure, the wiring 4115 serving as a gate electrode, the gate insulating film, the semiconductor layer 4114, the interlayer insulating film, and the wiring 4116 serving as a source electrode and a drain electrode are stacked in this order over an insulated surface. Note that, in the case of either the top-gate structure or the bottom-gate structure, the semiconductor layer 4114 and the wiring 4116 are connected to each other by a contact 4117.

Note that the transistor 4101 may be either a p-channel type or an n-channel type. The transistor 4102 may be either a p-channel type or an n-channel type. The transistor 4103 is a p-channel type and the transistor 4104 is an n-channel type. The transistor 4105 may be either a p-channel type or an n-channel type. In a case where the transistor 4105 is a p-channel type, the transistor 4106 is an n-channel type, whereas in a case where the transistor 4105 is an n-channel type, the transistor 4106 is a p-channel type.

Note that a width of the wiring 4110 may be set larger than that of the wiring 4111. When the normal drive is changed to the power-saving drive, all of the transistors 4102 are turned on, and therefore, a large amount of current instantaneously flows through the wiring 4110. Accordingly, by making the width of the wiring 4110 larger than that of the wiring 4111, resistance of the wiring 4110 can be reduced, making it possible to change the normal drive to the power-saving drive favorably.

Further, the wiring 4111 is provided between the wiring 4112 and the shift register 100. Thus, the wiring 4111 serves as a shielding material so as to prevent the shift register 100 from being adversely influenced by variations in potential of video signals supplied to the wiring 4112.

Furthermore, this embodiment mode can be implemented by being freely combined with Embodiment Mode 1 through Embodiment Mode 13.

Embodiment 1

Figure 32A:
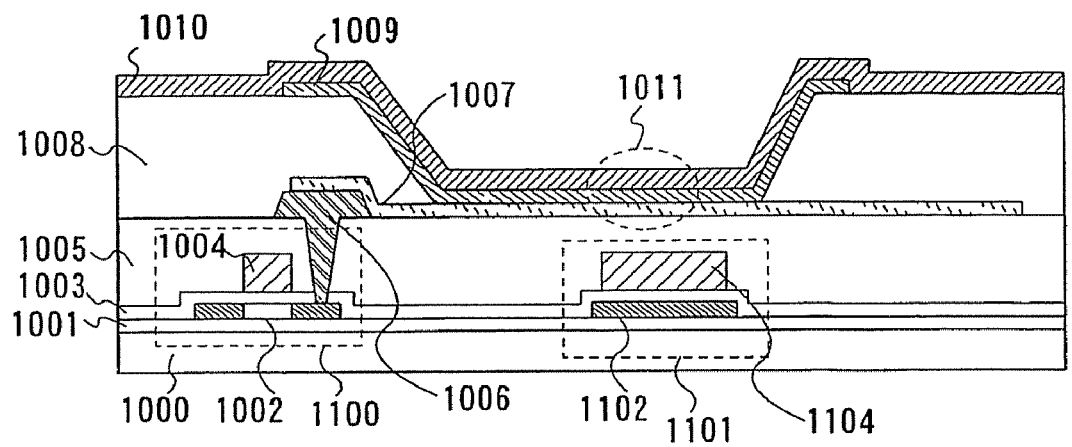
FIGS. 32A and 32B are diagrams showing Embodiment 1.
Figure 32B:
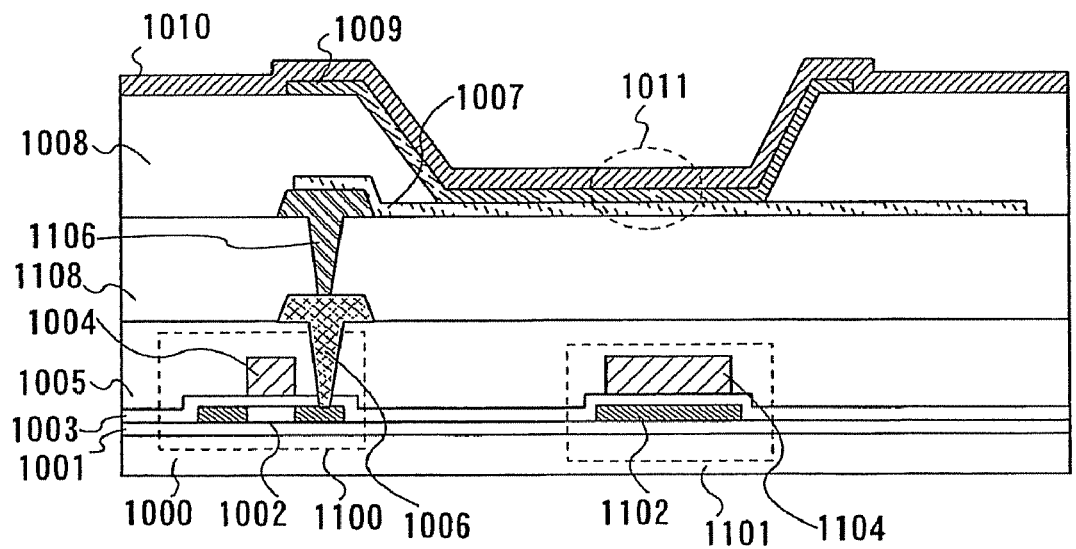

An example of actually forming a pixel will be described in this embodiment. FIGS. 32A and 32B are cross sectional views of pixels of panels described in Embodiment Mode 11 and Embodiment Mode 12. An example of using a TFT as a switching element arranged in a pixel and a light emitting element as a display medium arranged in the pixel, will be shown.

In each of FIGS. 32A and 32B, reference numeral 1000 indicates a substrate; 1001, a base film; 1002, a semiconductor layer; 1102, a semiconductor layer; 1003, a first insulating film; 1004, a gate electrode; 1104, an electrode; 1005, a second insulating film; 1006, an electrode; 1007, a first electrode; 1008, a third insulating film; 1009, a light emitting layer; and 1010, a second electrode. Reference numeral 1100 indicates a TFT; 1011, a light emitting element; and 1101, a capacitor element. In each of FIGS. 32A and 32B, the TFT 1100 and the capacitor element 1101 are representatively shown as elements constituting a pixel. A structure of FIG. 32A will be described.

As the substrate 1000, for example, a glass substrate such as barium borosilicate glass or alumino borosilicate glass, a quartz substrate, a ceramic substrate, and the like can be used. Further, a metal substrate containing stainless steel or a semiconductor substrate over which an insulating film is formed may be used. A surface of the substrate 1000 may be planarized by polishing such as a CMP technique.

As the base film 1001, an insulating film such as silicon oxide, silicon nitride, and silicon nitride oxide can be used. Providing the base film 1001 allows to prevent alkali metal such as Na or alkali earth metal contained in the substrate 1000 from dispersing in the semiconductor layer 1002 and prevent a characteristic of the TFT 1100 from being adversely affected by the alkali metal or alkali earth metal. In each of FIGS. 32A and 32B, the base film 1001 includes a single layer structure. Alternately, the base film 1001 may be formed to have two or more layers. Further, in a case of using a quartz substrate or the like, which is not adversely affected by dispersion of an impurity, the base film 1001 is not necessarily provided thereover.

As the semiconductor layer 1002 and the semiconductor layer 1102, a crystalline semiconductor film or an amorphous semiconductor film, which is processed into a predetermined shape, can be used. The crystalline semiconductor film can be obtained by crystallizing an amorphous semiconductor film. As a crystallization method, a laser crystallization method, a thermal crystallization method using RTA or a annealing furnace, a thermal crystallization method using a metal element for promoting crystallization, and the like can be used. The semiconductor layer 1002 includes a channel formation region and a pair of impurity regions added with an impurity element imparting one conductivity type. Further, an impurity region (an LDD region) to which a low concentration of the impurity element is added, may be provided between the channel formation region and the pair of impurity regions. Thus, the semiconductor layer 1102 can have a structure in which an impurity element for imparting one conductivity is entirely added.

As the first insulating film 1003, silicon oxide, silicon nitride, silicon nitride oxide, and the like can be used. The first insulating film 1003 can be formed by using a single layer or stacking a plurality of layers.

Note that, a film containing hydrogen may be used as the first insulating film 1003 so as to hydrogenate the semiconductor layer 1002.

As the gate electrode 1004 and the electrode 1104, one element selected from TA, W, Ti, Mo, Al, Cu, Cr, and Nd; or an alloy or a compound containing these elements, can be used. Further, each of the gate electrode 1004 and the electrode 1104 can be formed to have a single layer structure or a stacked layer structure.

The TFT 1100 includes the semiconductor layer 1002, the gate electrode 1004, and the first insulating film 1003 interposed between the semiconductor layer 1002 and the gate electrode 1004. In each of FIGS. 32A and 32B, as a TFT constituting a pixel, only the TFT 1100, which is connected to the first electrode 1007 of the light emitting element 1011, is shown. Alternatively, a pixel may include a plurality of TFTs. Furthermore, a top-gate transistor is shown as the TFT 1100 in this embodiment; however, the TFT 1100 may be a bottom-gate transistor having a gate electrode under a semiconductor layer or a dual-gate transistor having gate electrodes over and under a semiconductor layer.

The capacitor element 1101 uses the first insulating film 1003 as a dielectric body and includes the semiconductor layer 1102 and the electrode 1104, which face each other while sandwiching the first insulating film 1003 therebetween, as a pair of electrodes. Further, each of FIGS. 32A and 32B shows an example in which the semiconductor layer 1102, which is formed at the same time as the semiconductor layer 1002 of the TFT 1100, is used as one of the pair of electrodes of the capacitor element of the pixel and the electrode 1104, which is formed at the same time as the gate electrode 1004 of the TFT 1100, is used as the other of the pair of electrodes; however, the present invention is not limited to this structure.

As the second insulating film 1005, a single layer or stacked layers of an inorganic insulating film or an organic insulating film can be used. As the inorganic insulating film, a silicon oxide film formed by CVD, a silicon oxide film formed by the SOG (spin on glass) method, and the like can be used. As the organic insulating film, a film formed by using polyimide, polyamide, BCB (benzocyclobutene), acrylic, a positive photosensitive organic resin, a negative photosensitive organic resin, or the like can be used.

As the second insulating film 1005, a material including a skeleton structure constituted by silicon (Si) and oxygen (O) bonds can be used. As a substituent of this material, an organic group at least containing hydrogen (for example, an alkyl group and aromatic hydrocarbon) is used. As the substituent, a fluoro group may be used. Further, as the substituent, both of an organic group at least containing hydrogen and a fluoro group may be used.

Further, a surface of the second insulating film 1005 may be processed with high density plasma to be nitrided. The high density plasma is generated by using a high frequency microwave with, for example, 2.45 GHz. Note that, as the high density plasma, a high density plasma whose electron density is $10^{11}$ cm$^{-3}$ or more and an electron temperature is 0.2 eV or more and 2.0 eV or less (more preferably, 0.5 eV or more and 1.5 eV or less), is used. Since the high density plasma with a feature of the low electron temperature as mentioned above has low kinetic energy of active species, a film having less defects can be formed with lesser plasma damage as compared to the conventional plasma treatment. In high density plasma treatment, a temperature of the substrate 1000 is set to be 350 to 450° C. Further, in an apparatus of generating high density plasma, a distance between an antenna for generating a microwave and the substrate 1000 is set to be 20 mm or more and 80 mm or less (preferably, 20 mm or more and 60 mm or less).

Under an atmosphere of nitrogen (N) and a rare gas (containing at least any one of He, Ne, Ar, Kr, and Xe), or an atmosphere of nitrogen, hydrogen (H), and a rare gas, or an atmosphere of NH$_3$ and a rare gas, the above described plasma treatment is performed to nitride the surface of the second insulating film 1005. The surface of the second insulating film 1005 formed by the nitriding treatment with the high density plasma is mixed with H or an element such as He, Ne, Ar, Kr, or Xe. For example, a silicon oxide film or a silicon oxynitride film is used as the second insulating film 1005 and is subjected to the nitriding treatment with the high density plasma to form a silicon nitride film. By utilizing hydrogen contained in the thus formed silicon nitride film, the semiconductor layer 1002 of the TFT 1100 may be hydrogenated. Further, the hydrogenation treatment may be combined with the above described hydrogenation treatment using hydrogen contained in the first insulating film 1003.

Further, an insulating film may be formed over a nitride film formed by the above described high density plasma treatment so as to be used as the second insulating film 1005.

As the electrode 1006, an element selected from Al, W, Mo, Ti, Pt, Cu, Ta, Au, and Mn; or an alloy containing these elements can be used. Further, the electrode 1006 can be formed to have a single layer structure or a stacked layer structure.

One or both of the first electrode 1007 and the second electrode 1010 can be a transparent electrode or transparent electrodes. As a transparent electrode, indium oxide containing tungsten oxide (IWO), indium zinc oxide containing tungsten oxide (IWZO), indium oxide containing titanium oxide (ITiO), indium tin oxide containing titanium oxide (ITTiO), and the like can be used. Of course, indium tin oxide (ITO), indium zinc oxide (IZO), indium tin oxide added with silicon oxide (ITSO), or the like can also be used.

Moreover, light emitting elements are classified into a light emitting element, which emits light by being applied with direct-current voltage (hereinafter, referred to as a direct-current drive light emitting element), and a light emitting element, which emits light by being applied with alternating-current voltage (hereinafter, referred to as an alternating-current drive light emitting element).

The direct-current drive light emitting element is preferably formed by using a plurality of layers having different functions such as a hole injecting/transporting layer, a light emitting layer, and an electron injecting/transporting layer.

The hole injecting/transporting layer is preferably formed using an organic compound material having a hole transporting property and an inorganic compound material exhibiting an electron accepting property with respect to the organic compound material. By such a structure, many hole carriers are generated in an organic compound, which normally has almost no internal carriers, so that an extremely superior hole injecting/transporting property can be obtained. This advantageous effect makes it possible to reduce driving voltage as compared to the conventional light emitting element. Further, a thickness of a hole injecting/transporting layer can be increased without increasing driving voltage, thereby preventing short-circuiting of a light emitting element due to dusts and the like.

As an organic compound material having a hole transporting property, 4,4',4"-tris[N-(3-methylphenyl)-N-phenylamino]triphenylamine (abbreviation: MTDATA); 1,3,5-tris[N,N-di(m-tolyl)amino]benzene (abbreviation: m-MTDAB); N,N'-diphenyl-N,N'-bis(3-methylphenyl)-1,1'-biphenyl-4,4'-diamine (abbreviation: TPD); 4,4'-bis[N-(1-naphthyl)-N-phenylamino]biphenyl (abbreviation: NPB); and the like can be given. However, the present invention is not limited thereto.

As an inorganic compound material having an electron accepting property, titanium oxide, zirconium oxide, vanadium oxide, molybdenum oxide, tungsten oxide, rhenium oxide, ruthenium oxide, zinc oxide, and the like can be given. In particular, since vanadium oxide, molybdenum oxide, tungsten oxide, and rhenium oxide can be easily handled in vacuum evaporation, they are preferable.

An electron injecting/transporting layer is formed by using an organic compound material having an electron transporting property. Specifically, tris(8-quinolinolato)aluminum (abbreviation: Alq$_3$), tris(4-methyl-8-quinolinolato)aluminum (abbreviation: Almq$_3$), and the like can be given; however, the present invention is not limited thereto.

In a case of a direct-current drive light emitting element, a light emitting layer can be formed using the following materials: 9,10-di(2-naphthyl)anthracene (abbreviation: DNA);

9,10-di(2-naphthyl)-2-tert-butylanthracene (abbreviation: t-BuDNA); 4,4'-bis(2,2-diphenylvinyl)biphenyl (abbreviation: DPVBi); coumarin 30; coumarin 6; coumarin 545; coumarin 545T; perylene; rubrene; periflanthene; 2,5,8,11-tetra (tert-buthyl)perylene (abbreviation: TBP); 9,10-diphenylanthracene (abbreviation: DPA); 5,12-diphenyltetracene; 4-(dicyanomethylene)-2-methyl-[p-(dimethylamino)styryl]-4H-pyran (abbreviation: DCM1); 4-(dicyanomethylene)-2-methyl-6-[2-(julolidine-9-yl)ethenyl]-4H-pyran (abbreviation: DCM2); 4-(dicyanomethylene)-2,6-bis[p-(dimethylamino)styryl]-4H-pyran (abbreviation: BisDCM); and the like. Further, the following compounds which can emit phosphorescence can also be used: bis[2-(4',6'-difluorophenyl)pyridinato-N,$C^{2'}$]iridium (picolinato) (abbreviation: Flrpic); bis{2-[3',5'-bis(trifluoromethyl)phenyl]pyridinato-N,$C^{2'}$}iridium(picolinato) (abbreviation: Ir($CF_3$ppy)$_2$(pic)); tris(2-phenylpyridinato-N,$C^{2'}$)iridium (abbreviation: Ir(ppy)$_3$); bis(2-phenylpyridinato-N,$C^{2'}$)iridium(acetylacetonato) (abbreviation: Ir(ppy)$_2$(acac)); bis[2-(2'-thienyl)pyridinato-N,$C^{3'}$]iridium (acetylacetonato) (abbreviation: Ir(thp)$_2$(acac)); bis(2-phenylquinolinato-N,$C^{2'}$)iridium(acetylacetonato) (abbreviation: Ir(pq)$_2$(acac)); bis[2-(2'-benzothienyl)pyridinato-N,$C^{3'}$]iridium(acetylacetonato) (abbreviation: Ir(btp)$_2$(acac)); and the like.

In addition, as a high molecular electroluminescence material, which can be used for forming a light emitting layer, polyparaphenylenevinylene, polyparaphenylene, polythiophene, polyflorene, and the like can be given.

Either the first electrode 1007 or the second electrode 1010 may be formed using a material having no light transmitting property. For example, alkali metal such as Li or Cs, alkali earth metal such as Mg, Ca, or Sr, an alloy containing there elements (e.g., Mg:Ag, Al:Li, Mg:In, or the like), a compound of these elements (e.g., $CaF_2$, calcium nitride, or the like) can be used. In addition, rare earth metal such as Yb or Er can be used.

The third insulating film 1008 cam be formed by using the same material as the second insulating film 1005. The third insulating film 1008 is formed to cover an edge of the first electrode 1007 around the first electrode 1007 so that light emitting layers 1009 of the adjacent pixels are isolated from each other by the third insulating film.

The light emitting layer 1009 includes a single layer or a plurality of layers. In a case where the light emitting layer 1009 includes a plurality of layers, the plurality of layers can be classified into a hole injecting layer, a hole transporting layer, a light emitting layer, an electron transporting layer, an electron injecting layer, and the like from the aspect of carrier transporting properties. Note that a boundary line of the respective layers is not necessarily distinct. There is a case where materials included in the respective layers may be partly mixed and a boundary line between the respective layers is indistinct. Each layer can be formed using an organic material and an inorganic material. As an organic material, either a high molecular material or a low molecular material can be used.

The light emitting element 1011 includes the light emitting layer 1009, the first electrode 1007 and the second electrode 1010 between which the light emitting layer 1009 is interposed. One of the first electrode 1007 and the second electrode 1010 corresponds to an anode whereas the other corresponds to a cathode. When forward bias voltage larger than threshold value voltage is applied between the anode and the cathode of the light emitting element 1011, current flows from the anode to the cathode so as to emit light.

On the other hand, an alternating-current drive light emitting element has a two layered insulating structure having a light emitting layer sandwiched between two insulating films, between a pair of electrodes. By applying alternating-current voltage to the pair of electrodes, light emission can be obtained. In the alternating-current drive light emitting element, the light emitting layer can be formed using ZnS, SrS, $BaAl_2S_4$, and the like. As the two insulating films between which the light emitting layer is sandwiched, $Ta_2O_5$, $SiO_2$, $Y_2O_3$, $BaTiO_3$, $SrTiO_3$, silicon nitride, and the like can be used.

A structure of FIG. 32B will be described. Note that, the same portions as those of FIG. 32A are denoted by the same reference numerals, and will not be further described.

FIG. 32B shows a structure in which an insulating film 1108 is provided between the second insulating film 1005 and the third insulating film 1008 of FIG. 32A. The electrode 1006 and the first electrode 1007 are connected to each other by an electrode 1106 through a contact hole provided in the insulating film 1108.

Note that the electrode 1106 is not necessarily provided. That is, the first electrode 1007 may be directly connected to the electrode 1006 not through the electrode 1106. In this case, the number of steps required for forming the electrode 1106 can be reduced so that cost can be reduced.

Further, in the case where the first electrode 1007 is directly connected to the electrode 1006 not through the electrode 1106, coverage of the first electrode 1007 may be sometimes degraded and disconnection may be generated in some cases depending on a material and a forming method of the first electrode 1007. In this case, as shown in FIG. 32B, it is more preferable that the electrode 1006 and the first electrode 1007 be connected to each other by the electrode 1106 through the contact hole provided in the insulating film 1108.

The insulating film 1108 can be formed to have the same structure as the second insulating film 1005. The electrode 1106 can be formed to have the same structure as the electrode 1006.

This embodiment can be implemented by being freely combined with the embodiment modes of the present invention.

Embodiment 2

Figure 37:
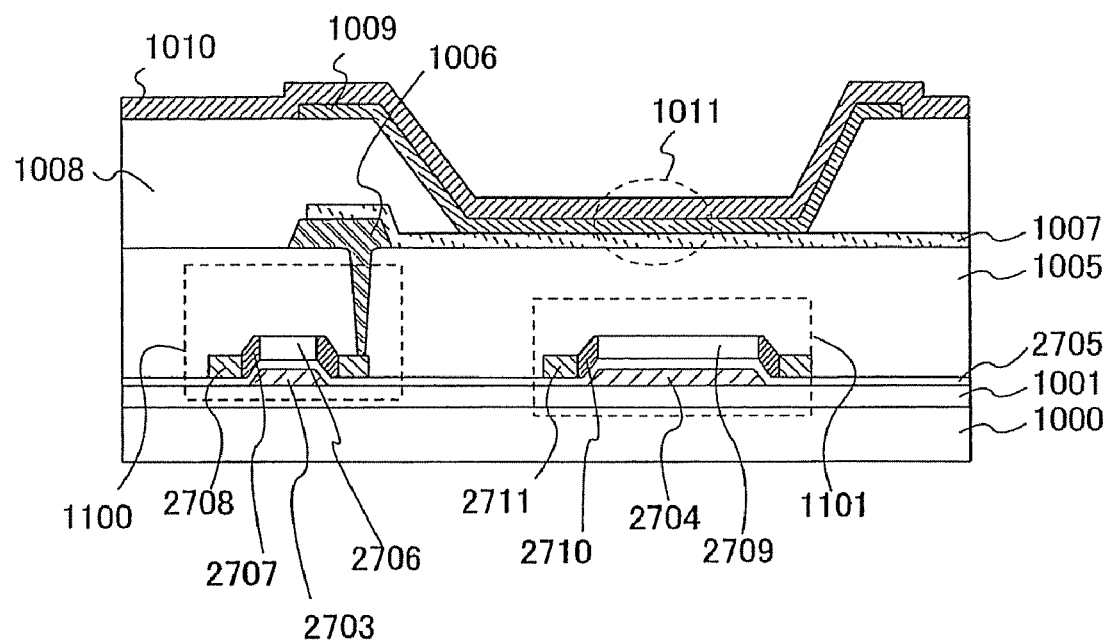
FIG. 37 is a diagram showing Embodiment 2.

An example of actually forming a pixel will be described in this embodiment. FIG. 37 is a cross sectional view of a pixel of a panel described in Embodiment Mode 11 and Embodiment Mode 12. An example of using a TFT as a switching element arranged in a pixel and a light emitting element as a display medium arranged in the pixel, will be shown. Note that the same portions as those of FIGS. 32A and 32B are denoted by the same reference numerals, and will not be further described.

In the pixel shown in FIG. 37, structures of the TFT 1100 and the capacitor element 1101 are difference from those of FIG. 32A. An example of using a bottom-gate TFT as the TFT 1100 is shown. The TFT 1100 includes a gate electrode 2703; a semiconductor layer having a channel formation region 2706, an LDD region 2707, and an impurity region 2708; and a first insulating film 2705 interposed between the gate electrode 2703 and the semiconductor layer. The first insulating film 2705 serves as a gate insulating film of the TFT 1100. The impurity region 2708 becomes a source region and a drain region of the TFT 1100.

The capacitor element 1101 uses the first insulating film 2705 as a dielectric body and includes the semiconductor layer and the electrode 2704, which face each other while sandwiching the first insulating film 2705 therebetween, as a pair of electrodes. The semiconductor layer includes a channel formation region 2709, an LDD region 2710, and an impurity region 2711. Further, FIG. 37 shows an example in which the semiconductor layer formed at the same time as a semiconductor layer, which will be an active layer of the TFT 110, is used as one of the pair of electrodes of the capacitor element of the pixel, and the electrode 2704, which is formed at the same time as the gate electrode 2703 of the TFT 1100, is used as the other of the pair of electrodes; however, the present invention is not limited to this structure The semiconductor layer having the channel formation region 2706, the LDD region 2707, and the impurity region 2708; and the semiconductor layer having the channel formation region 2709, the LDD region 2710, and the impurity region 2711 can be formed using the same materials as those of the semiconductor layer 1002 and the semiconductor layer 1102 of FIGS. 32A and 32B. The first insulating film 2705 can be formed by using the same material as the first insulating film 1003 shown in each of FIGS. 32A and 32B. The gate electrode 2703 and the electrode 2704 can be formed using the same material as that of the gate electrode 1004 of FIGS. 32A and 32B.

An impurity element imparting one conductivity type may be added to the channel formation regions 2706 and 2709.

This embodiment can be implemented by being freely combined with the embodiment modes and Embodiment 1 of the present invention.

Embodiment 3

Figure 38A:
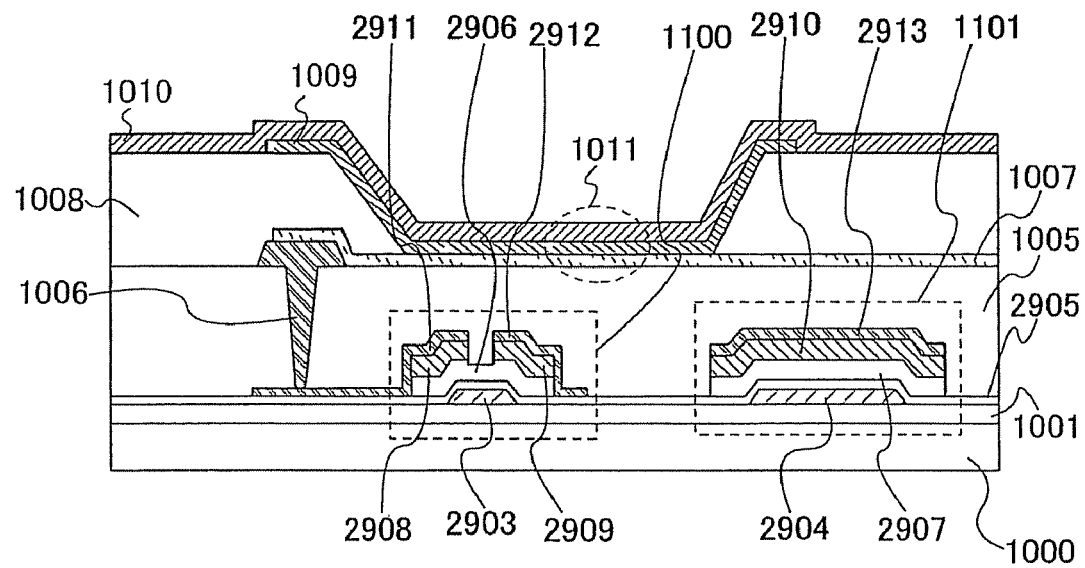
FIGS. 38A and 38B are diagrams showing Embodiment 3.
Figure 38B:
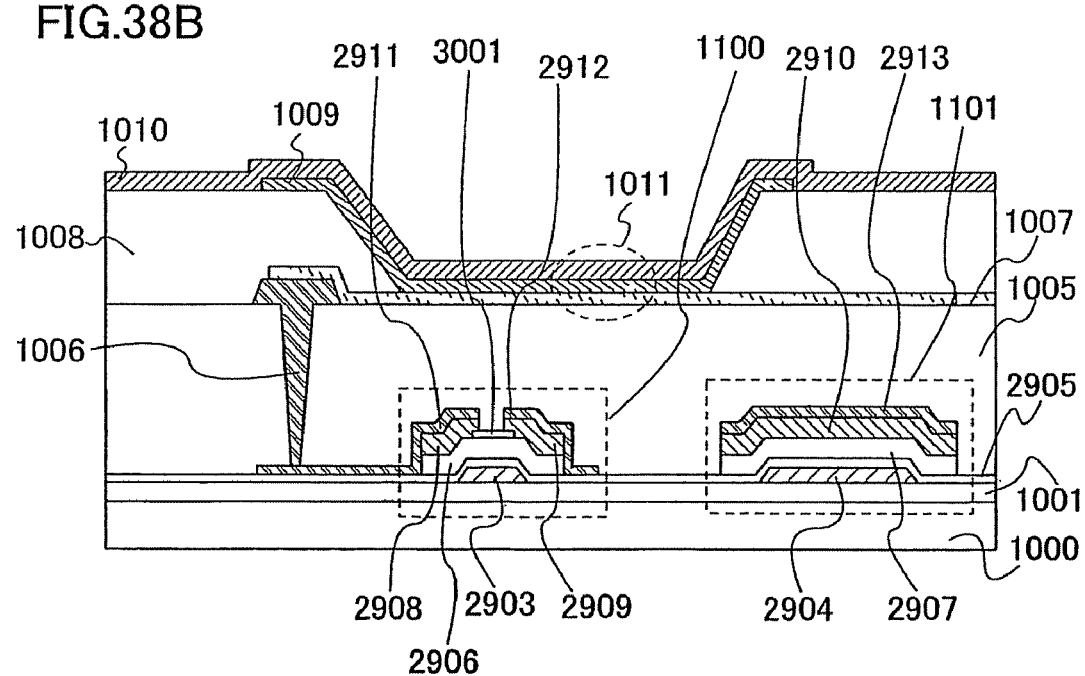

An example of actually forming a pixel will be described in this embodiment. FIGS. 38A and 38B are cross sectional views of pixels of panels described in Embodiment Mode 11 and Embodiment Mode 12. An example of using a TFT as a switching element arranged in a pixel and a light emitting element as a display medium arranged in the pixel, will be shown. Note that the same portions as those of FIGS. 32A and 32B are denoted by the same reference numerals, and will not be further described.

In the pixels shown in FIGS. 38A and 38B, structures of the TFT 1100 and the capacitor element 1101 are difference from those shown in FIG. 32A in Embodiment 1. An example of using a bottom-gate TFT having a channel etched structure as the TFT 1100, is shown in FIG. 38A. An example of using a bottom-gate TFT having a channel protection structure as the TFT 1100, is shown in FIG. 38B. Differing from the TFT 1100 having the channel etched structure shown in FIG. 38A, in the TFT 1100 having the channel protection structure shown in FIG. 38B, an insulator 3001, which will be an etching mask, is provided over a region where a channel of a semiconductor layer 2906 is provided.

In each of FIGS. 38A and 38B, the TFT 1100 includes a gate electrode 2903; a first insulating film 2905 provided over the gate electrode 2903; a semiconductor layer 2906 provided over the first insulating film 2905; and an N-type semiconductor layer 2908 and an N-type semiconductor layer 2909 provided over the semiconductor layer 2906. The first insulating film 2905 serves as a gate insulating film of the TFT 1100. The N-type semiconductor layer 2908 and the N-type semiconductor layer 2909 become a source and a drain of the TFT 1100. An electrode 2911 and an electrode 2912 are respectively formed over the N-type semiconductor layer 2908 and the N-type semiconductor layer 2909. An edge portion of the electrode 2911 extends to a region where the semiconductor layer 2906 does not exist, and the electrode 1006 is formed to be in contact with an upper portion of the electrode 2911 in the region where the semiconductor layer 2906 does not exist.

The capacitor element 1101 uses the first insulating film 2905 as a dielectric body and includes an electrode 2904 as one electrode; and a semiconductor layer 2907, which faces the electrode 2904 while sandwiching the first insulating film 2905 therebetween, an N-type semiconductor layer 2910 provided over the semiconductor layer 2907, and an electrode 2913 as the other electrode. The electrode 2904 can be formed at the same time as the gate electrode 2903. The semiconductor layer 2907 can be formed at the same time as the semiconductor layer 2906. The N-type semiconductor layer 2910 can be formed at the same time as the N-type semiconductor layers 2908 and 2909. The electrode 2913 can be formed at the same time as the electrodes 2911 and 2912.

The gate electrode 2903 and the electrode 2904 can be formed by using the same material as the gate electrode 1004 shown in FIGS. 32A and 32B. The semiconductor layers 2906 and 2907 can be formed by using an amorphous semiconductor film. The first insulating film 2905 can be formed by using the same material as the first insulating film 1003 shown in FIGS. 32A and 32B. The electrodes 2911, 2912, and 2913 can be formed by using the same material as the electrode 1006. The N-type semiconductor layers 2908, 2909, and 2910 can be formed by using a semiconductor film containing an N-type impurity element.

This embodiment can be implemented by being freely combined with embodiment modes, Embodiment 1, and Embodiment 2 of the present invention.

Embodiment 4

Figure 39A:
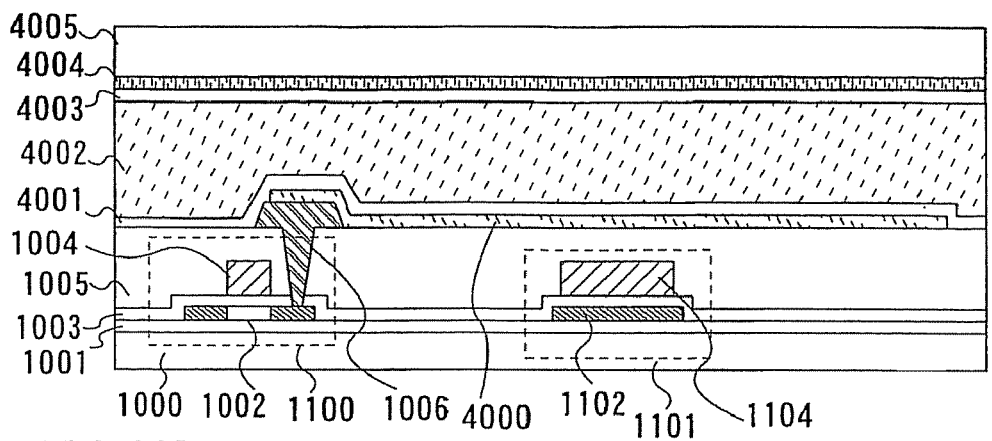
FIGS. 39A to 39C are diagrams showing Embodiment 4.
Figure 39B:
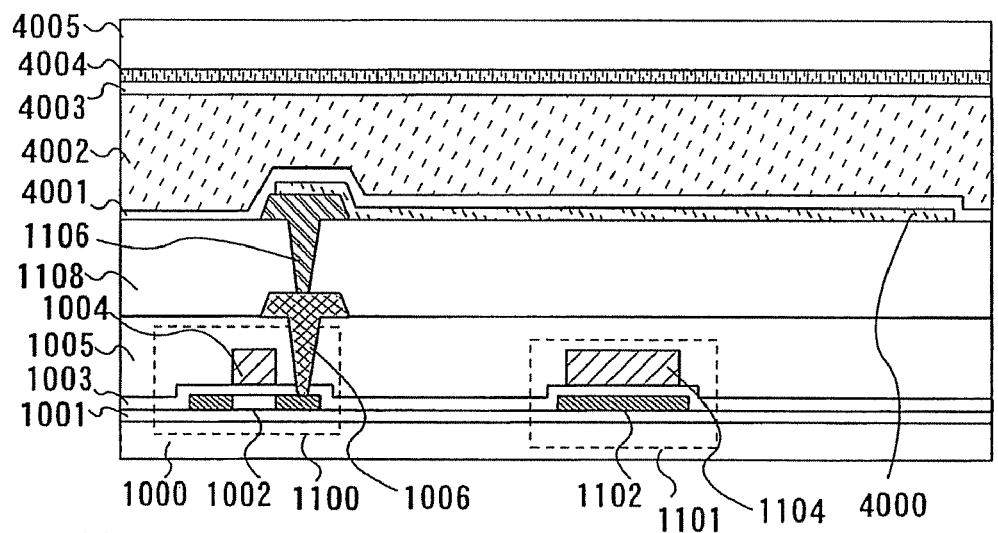
Figure 39C:
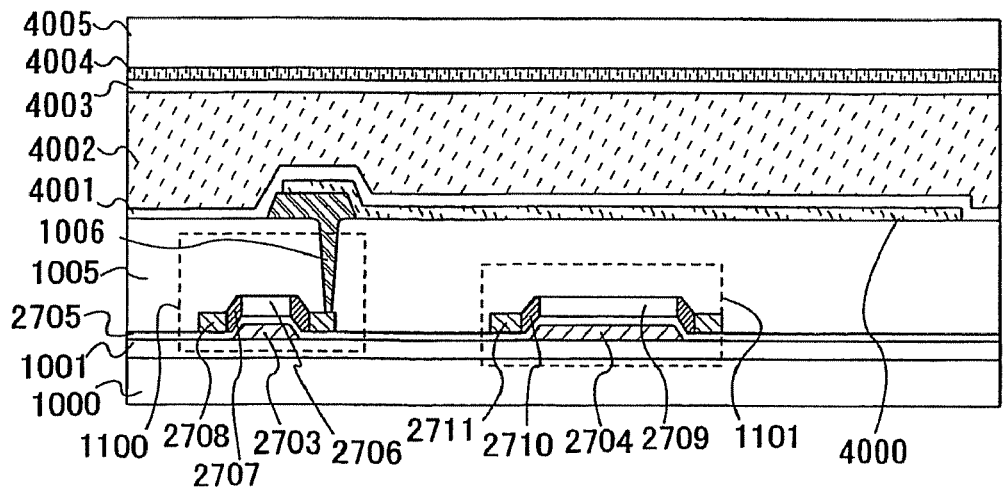

An example of actually forming a pixel will be described in this embodiment. FIGS. 39A to 39C are cross sectional views of pixels of panels described in Embodiment Mode 13. An example of using a TFT as a switching element arranged in a pixel and a liquid crystal element as a display medium arranged in the pixel, will be shown.

Each of the pixels shown in FIGS. 39A to 39C shows an example in which a liquid crystal element is provided as substitute for the light emitting element 1011 in the structures shown in FIGS. 32A and 32B of Embodiment 1 and the structure shown in FIG. 37 of Embodiment 2. The same portions as those of FIGS. 32A and 32B and FIG. 37 are denoted by the same reference numerals, and will not be further described.

A liquid crystal element includes a first electrode 4000, an orientation film 4001 formed over the first electrode 4000, a liquid crystal 4002, an orientation film 4003, and a second electrode 4004. By applying voltage to the first electrode 4000 and the second electrode 4004, an orientation condition of the liquid crystal is changed so that transmittance of the liquid crystal element is changed. The second electrode 4004 and the orientation film 4003 are formed over a counter substrate 4005.

One or both of the first electrode 4000 and the second electrode 4004 can be formed to be a transparent electrode or transparent electrodes. As a transparent electrode, indium oxide containing tungsten oxide (IWO), indium zinc oxide containing tungsten oxide (IWZO), indium oxide containing titanium oxide (ITiO), indium tin oxide containing titanium oxide (ITTiO), and the like can be used. Of course, indium tin oxide (ITO), indium zinc oxide (IZO), indium tin oxide added with silicon oxide (ITSO), or the like can be used. Either the first electrode 4000 or the second electrode 4004 may be formed using a material having no light transmitting property. For example, alkali metal such as Li and Cs, alkali earth metal such as Mg, Ca, and Sr, an alloy containing there elements (e.g., Mg:Ag, Al:Li, Mg:In or the like), a compound of these elements (e.g., $CaF_2$, calcium nitride, or the like) can be used. In addition, rare earth metal such as Yb and Er can be used.

As the liquid crystal 4002, a known liquid crystal can be freely used. For example, a ferroelectric liquid crystal or an antiferroelectric liquid crystal may be used as the liquid crystal 4002. As a driving method of the liquid crystal, a TN (twisted nematic) mode, an MVA (multi-domain vertical alignment) mode, an ASM (axially symmetric aligned microcell) mode, an OCB (optical compensated bend) mode, and the like can be freely used.

An example of forming a pair of electrode (the first electrode 4000 and the second electrode 4004), by which the liquid crystal 4002 is applied with voltage, over the different substrates, is shown in this embodiment; however, the present invention is not limited thereto. The second electrode 4004 may be provided over the substrate 1000. As the driving method of the liquid crystal, an IPS (in-plane-switching) mode may be used. Further, depending on the liquid crystal 4002, one or both of the orientation film 4001 and the orientation film 4003 may not be provided.

This embodiment can be implemented by being freely combined with the embodiment modes and Embodiments 1 to 3 of the present invention.

Embodiment 5

Figure 40A:
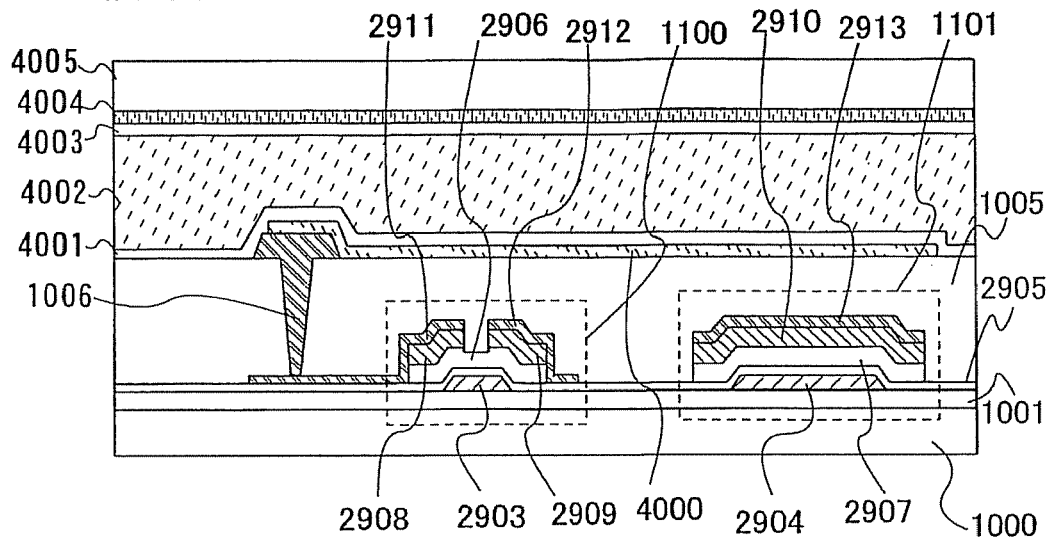
FIGS. 40A and 40B are diagrams showing Embodiment 5.
Figure 40B:
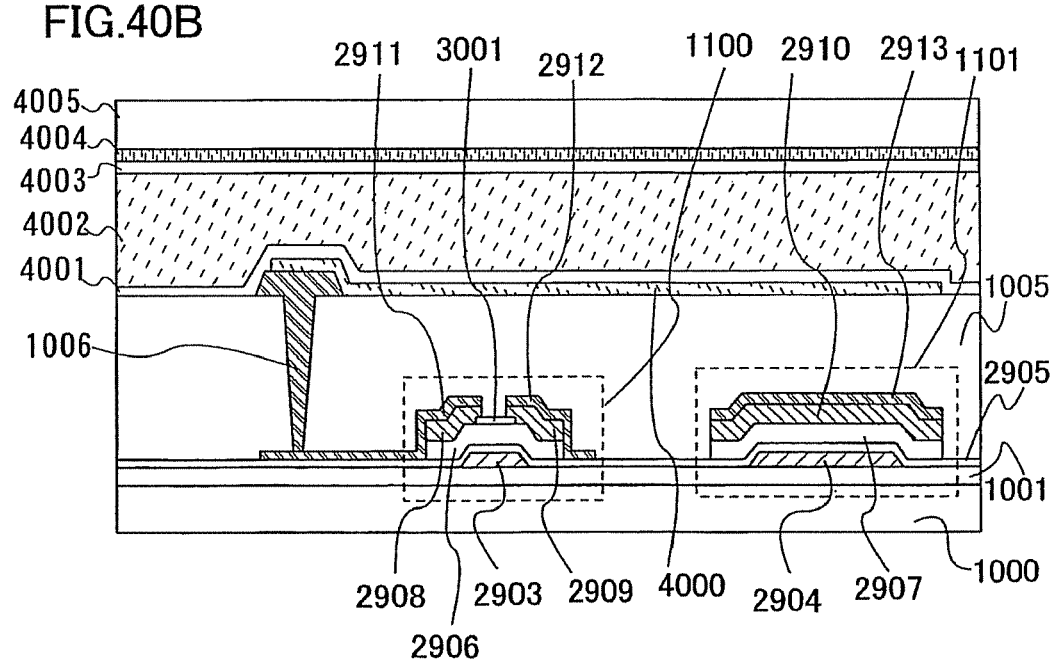

An example of actually forming a pixel will be described in this embodiment. FIGS. 40A and 40B are cross sectional views of pixels of panels described in Embodiment Mode 13. An example of using a TFT as a switching element arranged in a pixel and a liquid crystal element as a display medium arranged in the pixel, will be shown.

Each of the pixels shown in FIGS. 40A and 40B shows an example in which a liquid crystal element is provided as substitute for the light emitting element 1011 in the structures shown in FIGS. 38A and 38B of Embodiment 3. The same portions as those of FIGS. 38A and 38B are denoted by the same reference numerals, and will not be further described. Further, a structure of the liquid crystal element and the like are the same as that of the liquid crystal element shown in FIGS. 39A to 39C, and will not be further described.

This embodiment can be implemented by being freely combined with the embodiment modes and Embodiments 1 to 4 of the present invention.

Embodiment 6

Figure 33A:
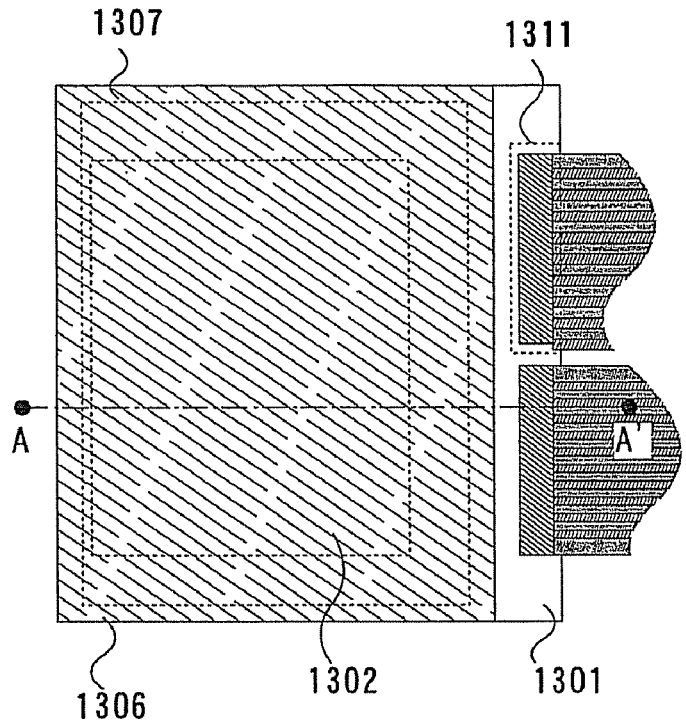
FIGS. 33A to 33C are diagrams showing Embodiment 6.
Figure 33B:
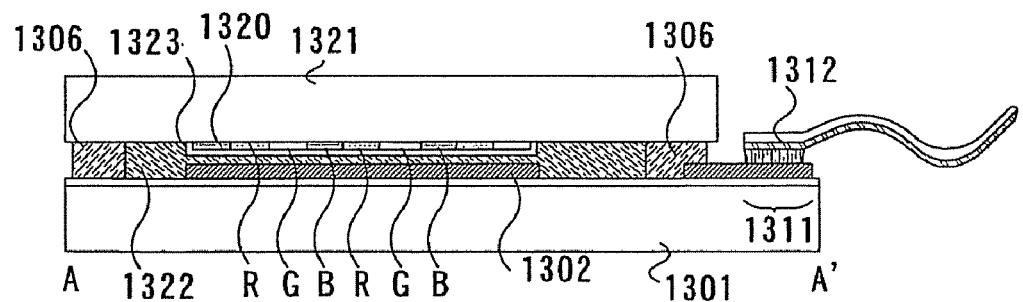
Figure 33C:
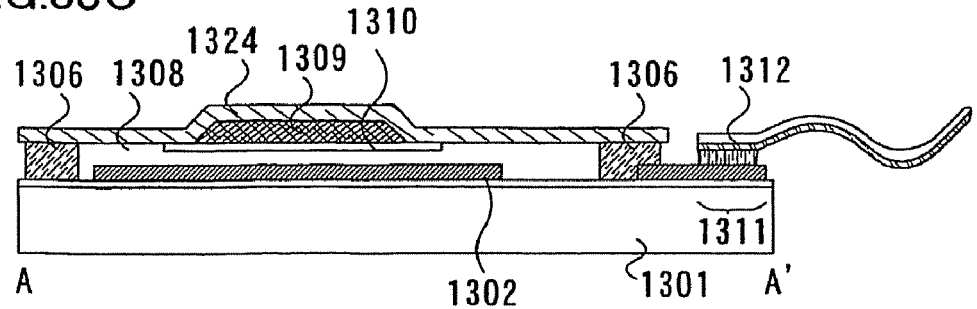

A structure of sealing a substrate over which a pixel is formed will be described in this embodiment with reference to FIGS. 33A to 33C. FIG. 33A shows a top view of a panel formed by sealing a substrate over which a pixel is formed. FIGS. 33B and 33C are cross sectional views along a line A-A' of FIG. 33A. FIGS. 33B and 33C show examples in which substrates over which pixels are formed are sealed by different methods.

In each of FIGS. 33A to 33C, over a substrate 1301, a pixel portion 1302 having a plurality of pixels is provided, a sealing agent 1306 is provided to surround the pixel portion 1302, and a sealing material 1307 is attached thereto. As a structure of the pixels, the structures shown in the embodiment modes, and Embodiments 1 to 3 can be used.

In the display panel of FIG. 33B, the sealing material 1307 of FIG. 33A corresponds to a counter substrate 1321. A transparent counter substrate 1321 is attached by using a sealing agent 1306 as an adhesive layer. A hermetically-sealed space 1322 is provided by the substrate 1301, the counter substrate 1321, and the sealing agent 1306. A color filter 1320 and a protection film 1323 protecting the color filter are provided over the counter substrate 1321. Light generated from the light emitting element placed in the pixel portion 1302 is emitted to an external portion through the color filter 1320. The hermetically-sealed space 1322 is filled with an inactive resin or liquid. Note that a resin having a light transmitting property, in which a hygroscopic material is dispersed, may be used as a resin to be filled in the hermetically-sealed space 1322. Further, attaching of the counter substrate 1321 and sealing of the pixel portion 1302 may be simultaneously performed by using the same material as the sealing agent 1306 and a material to be filled in the hermetically-sealed space 1322.

In the display panel shown in FIG. 33C, the sealing material 1307 of FIG. 33A corresponds to a sealing material 1324. A sealing material 1324 is attached by using the sealing agent 1306 as an adhesive layer, and a hermetically-sealed space 1308 is formed by the substrate 1301, the sealing agent 1306, and the sealing material 1324. A hygroscopic material 1309 is provided in a depression portion of the sealing material 1324 in advance. In an interior portion of the hermetically-sealed space 1308, the hygroscopic material 1309 absorbs moisture, oxygen, and the like, and keeps clean atmosphere so as to prevent deterioration of the light emitting element. This depression portion is covered with a fine-mesh cover material 1310. Air or moisture passes through the cover material 1310; however, air or moisture does not pass through the hygroscopic material 1309. Further, the hermetically-sealed space 1308 may be filled with a rare gas such as nitrogen and argon, and may be filled with an inactive resin or liquid.

Over a substrate 1301, an input terminal portion 1311 for transmitting signals to the pixel portion and the like is provided. Signals such as image signals are transmitted to the input terminal portion 1311 through an FPC (flexible printed circuit) 1312. In the input terminal portion 1311, a wiring formed over the substrate 1301 and a wiring formed over the FPC (flexible printed circuit) 1312 are electrically connected to each other by using a resin in which a conductor is dispersed (an anisotropic conductive resin: ACF).

A driver circuit for inputting signals to the pixel portion 1302 may also be formed over the substrate 1301 over which the pixel portion 1302 is formed. A driver circuit for inputting signals to the pixel portion 1302 may be formed using an IC chip and the IC chip may be connected to the substrate 1301 by the COG (chip on glass) technique or the IC chip may be provided over the substrate 1301 by using the TAB (tape automated bonding) technique or a printed substrate.

This embodiment can be implemented by being freely combined with the embodiment modes and Embodiments 1 to 5 of the present invention.

Embodiment 7

The present invention can be applied to a panel or a display module mounted with a circuit for inputting a signal to a panel.

Figure 34:
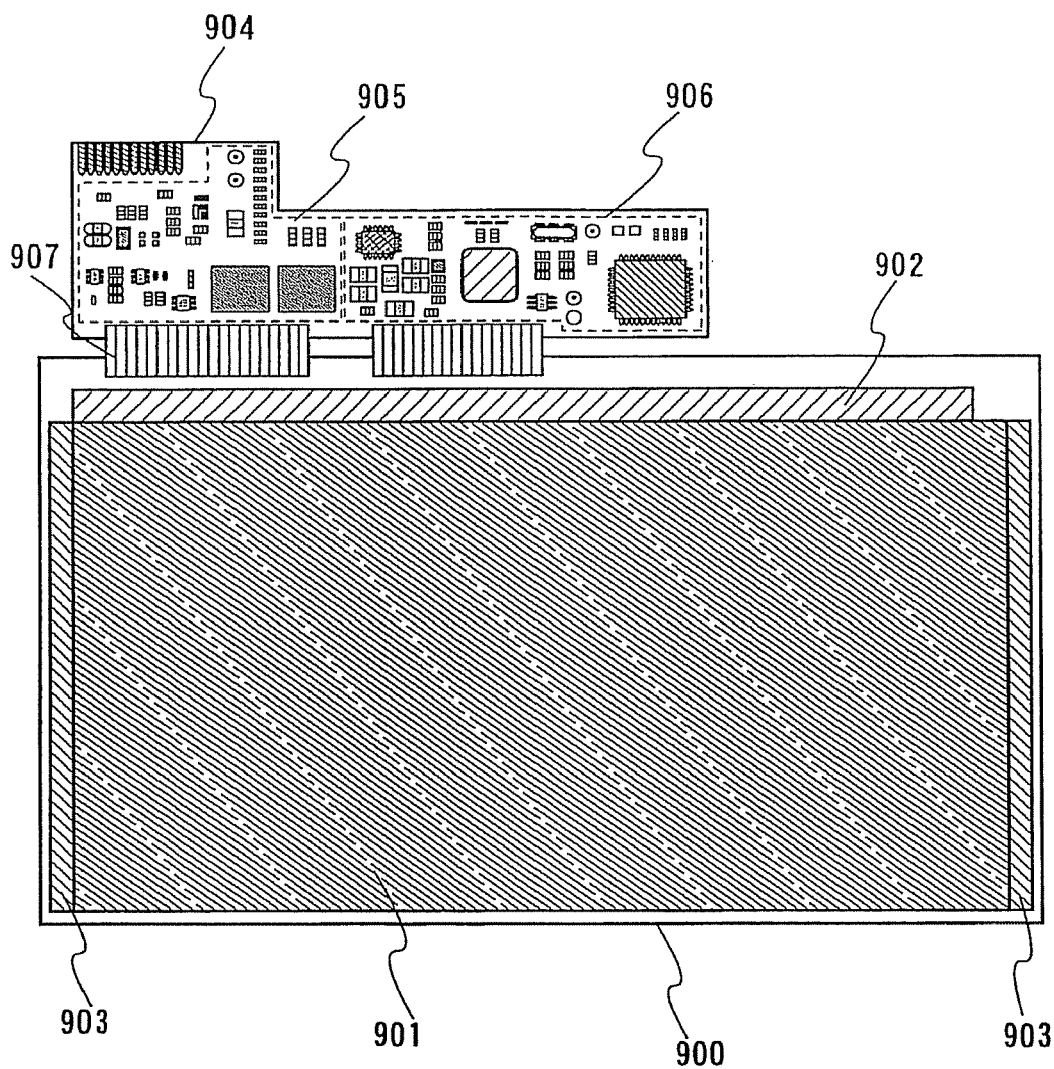
FIG. 34 is a diagram showing Embodiment 7.

FIG. 34 shows a display module in which a panel 900 and a circuit substrate 904 are combined. An example in which a controller 905, a signal division circuit 906, and the like are formed over the circuit substrate 904 is shown in FIG. 34. A circuit formed over the circuit substrate 904 is not limited thereto. Any circuit may be formed so long as it is a circuit generating signals for controlling the panel.

Signals output from the circuit formed over the circuit substrate 904 are input to the panel 900 through a connection wiring 907.

The panel 900 includes a pixel portion 901, a source driver 902, and a gate driver 903. The structure of the panel 900 may be the same as the structures shown in Embodiments 1 to 6. An example in which the source driver 902 and the gate driver 903 are formed over the same substrate as the pixel portion 901, is shown in FIG. 34. However, a display module of the present invention is not limited thereto. Only the gate driver 903 may be formed over the same substrate as the pixel portion 901, and the source driver 902 may be formed over a circuit substrate. Further, both of the source driver and the gate driver may be formed over a circuit substrate.

Display portions of various electronic appliances can be formed by incorporating these display modules.

This embodiment can be implemented by being freely combined with the embodiment modes and Embodiments 1 to 6 of the present invention.

Embodiment 8

The present invention can be applied to various electronic appliances. As electronic appliances, a camera (e.g., a video camera, a digital camera, and the like); a projector; a head mounted display (e.g., a goggle type display); a navigation system; a car audio component; a personal computer; a game machine; a portable information terminal (e.g., a mobile computer, a mobile phone, an electronic book, and the like); an image reproducing device equipped with a recording medium; and the like can be given. As the image reproducing device equipped with a recording medium, concretely, a device having a display portion that can reproduce a recording medium such as a digital versatile disc (DVD) and can display an image thereof, and the like can be given. Specific examples of these electronic appliances are shown in FIGS. 35A to 35D.

Figure 35A:
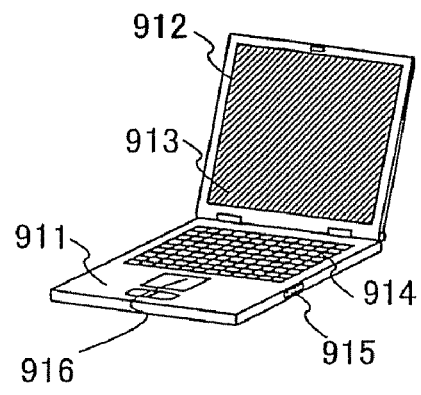
FIGS. 35A to 35D are diagrams showing Embodiment 8.

FIG. 35A shows a laptop personal computer, including a main body 911, a housing 912, a display portion 913, a keyboard 914, an external connection port 915, a pointing mouse 916, and the like. The present invention can be applied to the display portion 913. By using the present invention, power consumption of the display portion can be reduced.

Figure 35B:
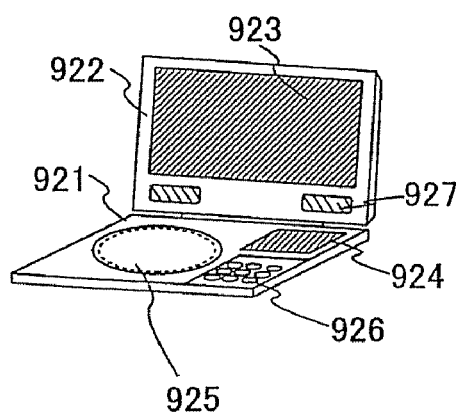

FIG. 35B shows an image reproducing device equipped with a recording medium (concretely, a DVD reproducing device), including a main body 921, a housing 922, a first display portion 923, a second display portion 924, a recording medium (DVD or the like) reading portion 925, operation keys 926, speaker portions 927, and the like. The first display portion 923 mainly displays image information whereas the second display portion 924 mainly displays character information. The present invention is applied to the first display portion 923 and the second display portion 924. By using the present invention, power consumption of the display portions can be reduced.

Figure 35C:
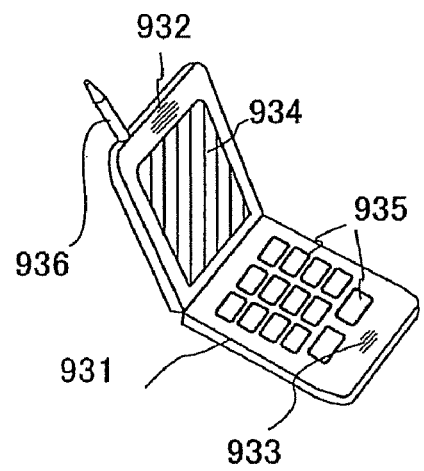

FIG. 35C shows a mobile phone including a main body 931, an audio output portion 932, an audio input portion 933, a display portion 934, operation switches 935, an antenna 936, and the like. The present invention is applied to the display portion 934. By using the present invention, power consumption of the display portions can be reduced.

Figure 35D:
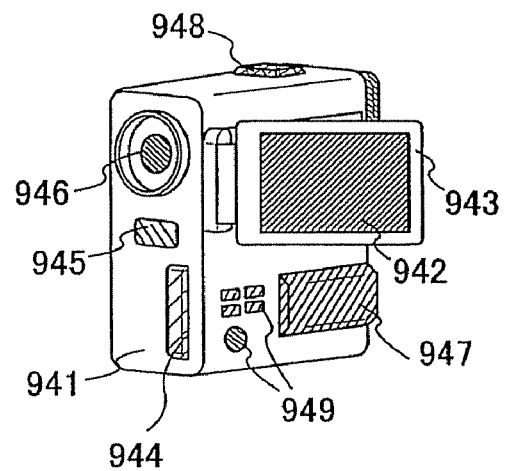

FIG. 35D shows a camera including a main body 941, a display portion 942, a housing 943, an external connection port 944, a remote-controlled receiving portion 945, an image receiving portion 946, a buttery 947, an audio input portion 948, operation keys 949, and the like. By using the present invention, power consumption of the display portion can be reduced.

This embodiment can be implemented by being freely combined with the embodiment modes and Embodiments 1 to 7 of the present invention.

This application is based on Japanese Patent Application Serial No. 2005-127390 filed in Japan Patent Office on Apr. 26, 2005, the entire contents of which are hereby incorporated by reference.

EXPLANATION OF REFERENCE

101: panel, 100: shift register, 110: shift register, 120: shift register, 130: shift register, 140: shift register, 150: shift register, 200: source driver, 210: source driver, 220: source driver, 500: pixel, 501: pixel portion, 503: source driver, 504: gate driver, 600: pixel, 601: first transistor, 602: second transistor, 603: capacitor element, 604: light emitting element, 605: terminal, 606: terminal, 607: terminal, 700: pixel, 701: third transistor, 702: terminal, 771: diode, 900: panel, 901: pixel portion, 902: source driver, 903: gate driver, 904: circuit substrate, 905: controller, 906: signal division circuit, 907: connection wiring, 911: main body, 912: housing, 913: display portion, 914: keyboard, 915: external connection port, 916: pointing mouse, 921: main body, 922: housing, 923: first display portion, 924: second display portion, 925: recording medium (such as DVD) reading portion, 926: operation key, 927: speaker portion, 931: main body, 932: audio output portion, 933: audio input portion, 934: display portion, 935: operation switch, 936: antenna, 941: main body, 942: display portion, 943: housing, 944: external connection port, 945: remote-controlled receiving portion, 946: image receiving portion, 947: buttery, 948: audio input portion, 949: operation key, 1000: substrate, 1001: base film, 1002: semiconductor layer, 1003: first insulating film, 1004: gate electrode, 1005: second insulating film, 1006: electrode, 1007: first electrode, 1008: third insulating film, 1009: light emitting layer, 1010: second electrode, 1011: light emitting element, 1100: TFT, 1101: capacitor element, 1102: semiconductor layer, 1104: electrode, 1106: electrode, 1108: insulating film, 1301: substrate, 1302: pixel portion, 1306: sealing agent, 1307: sealing material, 1308: hermetically-sealed space, 1309: hygroscopic material, 1310: covering material, 1311: input terminal portion, 1312: FPC (flexible printed circuit), 1320: color filter, 1321: counter substrate, 1322: hermetically-sealed space, 1323: protection film, 1324: sealing material, 1900: source driver control circuit, 1901: control circuit, 1902: memory, 1903: determination circuit, 1904: pulse output circuit, 1905: inversion circuit, 1906: control circuit, 1907: determination circuit, 1910: source driver, 1911: source driver control circuit, 1912: source driver control circuit, 2001: wiring, 2002: wiring, 2003: power source terminal, 2202*a*: wiring, 2202*b*: wiring, 2301*a*: wiring, 2301*b*: wiring, 2402: wiring, 2403: wiring, 2502*a*: wiring, 2502*b*: wiring, 2601*a*: wiring, 2601*b*: wiring, 2700: switching circuit, 2701: wiring, 2702: wiring, 2703: gate electrode, 2704: electrode, 2705: first insulating film, 2706: channel formation region, 2707: LDD region, 2708: impurity region, 2709: channel formation region, 2710: LDD region, 2711: impurity region, 2800: switching circuit, 2802*a*: wiring, 2802*b*: wiring, 2900: switching circuit, 2901*a*: wiring, 2901*b*: wiring, 2903: gate electrode, 2904: electrode, 2905: first insulating film, 2906: semiconductor layer, 2907: semiconductor layer, 2908: N-type semiconductor layer, 2909: N-type semiconductor layer, 2910: N-type semiconductor layer, 2911: electrode, 2912: electrode, 2913: electrode, 3001: insulator, 4000: first electrode, 4001: orientation film, 4002: liquid crystal, 4003: orientation film, 4004: second electrode, 4005: counter substrate, 4101: transistor, 4102: transistor, 4103: transistor, 4104: transistor, 4105: transistor, 4106: transistor, 4107: input terminal, 4108: wiring, 4109: wiring, 4110: wiring, 4111: wiring, 4112: wiring, 4113: output terminal, 4114: semiconductor layer, 4115: wiring, 4116: wiring, 4117: contact, 4601: transistor, 4602: liquid crystal element, 4603: capacitor element, 4604: terminal, 5001: inverter, 5002: inverter, 5002*a*: inverter, 5002*b*: inverter, 5003: inverter, 5003*a*: inverter, 5003*b*: inverter

The invention claimed is:

1. A method for driving a display device including a plurality of pixels arranged in a matrix form, a plurality of source signal lines inputting a video signal to the plurality of pixels, and a source driver outputting signals to each of the plurality of source signal lines, wherein the source driver includes a shift register and an image signal input line to which a video signal is input, the method comprising:
- determining whether or not video signals corresponding to all of pixels in one row of the plurality of pixels are equal to one another;
- in a case where video signals corresponding to at least two pixels of the video signals corresponding to the pixels in one row of the plurality of pixels are different from each other, sequentially outputting video signals input to the image signal input line to the plurality of source signal lines in synchronization with a sampling pulse output from the shift register; and
- in a case where the video signals corresponding to all of the pixels in one row of the plurality of pixels are equal to one another, stopping input of a start pulse to the shift register and simultaneously outputting the video signals input to the image signal input line to all of the plurality of source signal lines.

2. The method according to claim 1, wherein an input of a clock pulse is also stopped together with the start pulse in a case where the video signals corresponding to all of the pixels in one row of the plurality of pixels are equal to one another.

3. The method according to claim 1, wherein the display device is a liquid crystal display.

4. The method according to claim 1, wherein the display device is an EL display.

5. A method for driving a display device including a plurality of pixels arranged in a matrix form, a plurality of source signal lines inputting a video signal to the plurality of pixels, and a source driver outputting a signal to each of the plurality of source signal lines, wherein the source driver includes a shift register, a plurality of image signal input lines to which a digital video signal is input, a plurality of first latch circuits, a plurality of second latch circuits to which a signal output from each of the plurality of first latch circuits is input, and a plurality of D/A converter circuits to which a signal output from each of the plurality of the second latch circuits is input, the method comprising:
- determining whether or not digital video signals corresponding to all of pixels in one row of the plurality of pixels are equal to one another;
- in a case where digital video signals corresponding to at least two pixels of the digital video signals corresponding to the pixels in one row of the plurality of pixels are different from each other, sequentially outputting digital video signals input to the plurality of image signal input lines to the plurality of first latch circuits in synchronization with a sampling pulse output from the shift register; and
- in a case where the digital video signals corresponding to all of the pixels in one row of the plurality of pixels are equal to one another, stopping input of a start pulse to the shift register and simultaneously outputting digital video signals input to the plurality of image signal input lines to all of the plurality of first latch circuits.

6. The method according to claim 5, wherein the display device is a liquid crystal display.

7. The method according to claim 5, wherein the display device is an EL display.

8. A method for driving a display device including a plurality of pixels arranged in a matrix form, a plurality of source signal lines inputting a video signal to the plurality of pixels, and a source driver outputting a signal to each of the plurality of source signal lines, wherein the source driver includes a shift register, a plurality of image signal input lines to which a digital video signal is input, a plurality of first latch circuits, a plurality of second latch circuits to which a signal output from each of the plurality of first latch circuits is input, and a plurality of D/A converter circuits to which a signal output from each of the plurality of the second latch circuits is input, the method comprising:
- determining whether or not digital video signals corresponding to all of pixels in one row of the plurality of pixels are equal to one another;
- in a case where digital video signals corresponding to at least two pixels of the digital video signals corresponding to the pixels in one row of the plurality of pixels are different from each other, sequentially outputting digital video signals input to the plurality of image signal input lines to the plurality of first latch circuits in synchronization with a sampling pulse output from the shift register; and
- in a case where the digital video signals corresponding to all of the pixels in one row of the plurality of pixels are equal to one another, stopping input of a start pulse and a clock pulse to the shift register and simultaneously outputting digital video signals input to the plurality of image signal input lines to all of the plurality of first latch circuits.

9. The method according to claim 8, wherein the display device is a liquid crystal display.

10. The method according to claim 8, wherein the display device is an EL display.

11. A display device comprising:
- a plurality of pixels;
- a plurality of source signal lines inputting a video signal to the plurality of pixels;
- a source driver outputting a signal to each of the plurality of source signal lines; and
- a means for controlling whether or not a start pulse is input to the source driver,
- wherein the source driver includes a shift register, an image signal input line to which a video signal is input, a plurality of first switches, a second switch, a plurality of third switches, and a power source terminal kept at predetermined potential,
- wherein each of the plurality of third switches includes a control terminal and is turned on or off in accordance with a signal input to the control terminal,
- wherein the control terminal of each of the plurality of third switches is connected to an output terminal of the shift register through a single first switch of the plurality of first switches and is also connected to the power source terminal through the second switch,
- wherein the image signal input line is connected to a single source signal line of the plurality of source signal lines through a single third switch of the plurality of third switches,
- wherein the plurality of first switches and the second switch are selectively turned on or off in accordance with a control signal input to the source driver, when the plurality of first switches is turned on, the second switch is turned off, and when the plurality of first switches is turned off, the second switch is turned on, and
- wherein the plurality of pixels are arranged in a matrix form and the means for controlling comprises a control circuit outputting a control signal, the control circuit comprising a determination circuit for determining whether or not video signals corresponding to all of pixels in one row of the plurality of pixels are equal to one another, and in a case where all of signals corresponding to all of the pixels in one row of the plurality of pixels are equal to one another, input of a start pulse to the shift register is stopped and the control signal is output to turn on the second switch.

12. The display device according to claim 11, wherein the display device is a liquid crystal display.

13. The display device according to claim 11, wherein the display device is an EL display.

14. A display device comprising:
a plurality of pixels;
a plurality of source signal lines inputting video signals to the plurality of pixels;
a source driver outputting a signal to each of the plurality of source signal lines; and
a means for controlling whether or not a start pulse and a clock pulse are input to the source driver,
wherein the source driver includes a shift register, an image signal input line to which a video signal is input, a plurality of first switches, a second switch, a plurality of third switches, and a power source terminal kept at predetermined potential,
wherein each of the plurality of third switches includes a control terminal and is turned on or off in accordance with a signal input to the control terminal,
wherein the control terminal of each of the plurality of third switches is connected to an output terminal of the shift register through a single first switch of the plurality of first switches and is also connected to the power source terminal through the second switch,
wherein the image signal input line is connected to a single source signal line of the plurality of source signal lines through a single third switch of the plurality of third switches,
wherein the plurality of first switches and the second switch are selectively turned on or off in accordance with a control signal input to the source driver, when the plurality of first switches is turned on, the second switch is turned off, and when the plurality of first switches is turned off, the second switch is turned on, and
wherein the plurality of pixels are arranged in a matrix form and the means for controlling comprises a control circuit outputting a control signal, the control circuit comprising a determination circuit for determining whether or not video signals corresponding to all of pixels in one row of the plurality of pixels are equal to one another, and in a case where all of signals corresponding to all of the pixels in one row of the plurality of pixels are equal to one another, input of a start pulse to the shift register is stopped and the control signal is output to turn on the second switch.

15. A display device according to any one of claim 11 or 14, wherein each of the plurality of first switches and the second switch are digital switches, and
wherein each of the plurality of third switches is an analog switch.

16. A display device according to any one of claim 11 or 14, wherein each of the plurality of first switches and the second switch are digital switches, and
wherein each of the plurality of third switches is an analog switch.

17. The display device according to claim 14, wherein the display device is a liquid crystal display.

18. The display device according to claim 14, wherein the display device is an EL display.

19. A display device comprising:
a plurality of pixels arranged in a matrix form;
a plurality of source signal lines inputting a video signal to the plurality of pixels;
a source driver outputting a signal to each of the plurality of source signal lines; and
a control circuit determining whether or not a start pulse is input to the source driver,
wherein the source driver includes a shift register, a plurality of image signal input lines to which a digital video signal is input, a plurality of first switches, a second switch, a power source terminal kept at predetermined potential, a plurality of first latch circuits, a plurality of second latch circuits, and a plurality of D/A converter circuits,
wherein each of the plurality of first latch circuits includes a control terminal and an input terminal of each of the plurality of first latch circuits is selectively connected to the plurality of image signal input lines in accordance with a signal input to the control terminal,
wherein the control terminal of each of the plurality of first latch circuits is connected to an output terminal of the shift register through a single first switch of the plurality of first switches, and is also connected to the power source terminal through the second switch,
wherein when a latch pulse is input to an output terminal of a single first latch circuit of the plurality of first latch circuits, the output terminal of the single first latch circuit of the plurality of first latch circuits is connected to an input terminal of a single second latch circuit of the plurality of second latch circuits,
wherein an output terminal of a single second latch circuit of the plurality of second latch circuits is connected to an input terminal of a single D/A converter circuit of the plurality of D/A converter circuits,
wherein an output terminal of a single D/A converter circuit of the plurality of D/A converter circuits is connected to a single source signal line of the plurality of source signal lines,
wherein the plurality of first switches and the second switch are selectively turned on or off in accordance with a control signal input to the source driver, when the plurality of first switches is turned on, the second switch is turned off, and when the plurality of first switches is turned off, the second switch is turned on, and
wherein the control circuit includes a determination circuit for determining whether or not digital video signals corresponding to all of pixels in one row of the plurality of pixels are equal to one another, and in a case where the digital video signals corresponding to all of the pixels in one row of the plurality of pixels are equal to one another, input of a start pulse to the shift register is stopped and the control signal is output to turn on the second switch.

20. The display device according to claim 19, wherein the display device is a liquid crystal display.

21. The display device according to claim 19, wherein the display device is an EL display.

22. A display device comprising:
a plurality of pixels arranged in a matrix form;
a plurality of source signal lines inputting a video signal to the plurality of pixels;
a source driver outputting a signal to each of the plurality of source signal lines; and
a control circuit determining whether or not a start pulse and a clock pulse are input to the source driver,
wherein the source driver includes a shift register, a plurality of image signal input lines to which a digital video signal is input, a plurality of first switches, a second switch, a power source terminal kept at predetermined potential, a plurality of first latch circuits, a plurality of second latch circuits, and a plurality of D/A converter circuits, wherein each of the plurality of first latch circuits includes a control terminal and an input terminal of each of the plurality of first latch circuits is selectively connected to the plurality of image signal input lines in accordance with a signal input to the control terminal, wherein the control terminal of each of the plurality of first latch circuits is connected to an output terminal of the shift register through a single first switch of the plurality of different first switches, and is also connected to the power source terminal through the second switch, wherein when a latch pulse is input to an output terminal of a single first latch circuit of the plurality of first latch circuits, the output terminal of the single first latch circuit of the plurality of first latch circuits is connected to an input terminal of a single second latch circuit of the plurality of second latch circuits, wherein an output terminal of a single second latch circuit of the plurality of second latch circuits is connected to an input terminal of a single D/A converter circuit of the plurality of D/A converter circuits, wherein an output terminal of a single D/A converter circuit of the plurality of D/A converter circuits is connected to a single source signal line of the plurality of source signal lines, wherein the plurality of first switches and the second switch are selectively turned on or off in accordance with a control signal input to the source driver, when the plurality of first switches is turned on, the second switch is turned off, and when the plurality of first switches is turned off, the second switch is turned on, and wherein the control circuit includes a determination circuit for determining whether or not digital video signals corresponding to all of pixels in one row of the plurality of pixels are equal to one another, and in a case where the digital video signals corresponding to all of pixels in one row of the plurality of pixels are equal to one another, input of a start pulse and a clock pulse to the shift register is stopped and the control signal is output to turn on the second switch.

23. The display device according to claim 22, wherein the display device is a liquid crystal display.

24. The display device according to claim 22, wherein the display device is an EL display.

* * * * *